US012787182B2

(12) United States Patent
Hayashi et al.

(10) Patent No.: US 12,787,182 B2
(45) Date of Patent: Nov. 3, 2026

(54) MULTILAYER WIRING BOARD

(71) Applicant: TOPPAN INC., Tokyo (JP)

(72) Inventors: Akihiro Hayashi, Tokyo (JP); Masahito Tanabe, Tokyo (JP); Tetsuyuki Tsuchida, Tokyo (JP)

(73) Assignee: TOPPAN INC., Tokyo (JP)

( * ) Notice: Subject to any disclaimer, the term of this patent is extended or adjusted under 35 U.S.C. 154(b) by 58 days.

(21) Appl. No.: 18/244,182

(22) Filed: Sep. 8, 2023

(65) Prior Publication Data

US 2023/0422412 A1 Dec. 28, 2023

Related U.S. Application Data

(63) Continuation of application No. PCT/JP2022/009981, filed on Mar. 8, 2022.

(30) Foreign Application Priority Data

Mar. 10, 2021 (JP) ................................ 2021-038369
Apr. 28, 2021 (JP) ................................ 2021-076047
(Continued)

(51) Int. Cl.
*H05K 3/46* (2006.01)
*H05K 1/11* (2006.01)
(Continued)

(52) U.S. Cl.
CPC ........... *H05K 3/4655* (2013.01); *H05K 1/116* (2013.01); *H05K 3/429* (2013.01); *H10W 70/05* (2026.01);
(Continued)

(58) Field of Classification Search
CPC ........ H01L 23/49822; H01L 23/49833; H05K 1/116; H05K 2201/09536; H05K 2201/096
(Continued)

(56) References Cited

U.S. PATENT DOCUMENTS

2009/0188806 A1* 7/2009 Yamasaki .............. H05K 3/108 205/122
2011/0147339 A1* 6/2011 Chiang .................. H05K 3/107 216/13
(Continued)

FOREIGN PATENT DOCUMENTS

JP 2005-277258 A 10/2005
JP 2007-048856 A 2/2007
(Continued)

OTHER PUBLICATIONS

Office Action issued in corresponding Japanese Patent Application No. 2021-076070 dated Jan. 14, 2025.
(Continued)

*Primary Examiner* — Timothy J Thompson
*Assistant Examiner* — Sidi M Maiga
(74) *Attorney, Agent, or Firm* — Foley & Lardner LLP

(57) ABSTRACT

A multilayer wiring board includes two or more layers laminated together, each layer includes an insulating resin layer having a first surface and a second surface, and a conductor layer. The insulating resin layer includes a first recess that is open to the first surface, a groove section that is open to the first surface, and a second recess that is open to the second surface and communicates with one or more of the first recesses. Each insulating resin layer is integrally formed in a thickness direction thereof. The conductor layer includes a land portion and a wiring portion filling the first recess and the groove section, and a via portion protruding from the first surface at a position of the land portion. The via portion protruding from the first surface of the insulating resin layer fills a recess of another insulating resin layer adjacent to the first surface.

21 Claims, 48 Drawing Sheets

(30) Foreign Application Priority Data

| | | | |
|---|---|---|---|
| Apr. 28, 2021 | (JP) | ................................ | 2021-076056 |
| Apr. 28, 2021 | (JP) | ................................ | 2021-076062 |
| Apr. 28, 2021 | (JP) | ................................ | 2021-076070 |
| Apr. 28, 2021 | (JP) | ................................ | 2021-076071 |
| Apr. 28, 2021 | (JP) | ................................ | 2021-076081 |

(51) Int. Cl.

| | |
|---|---|
| ***H05K 3/42*** | (2006.01) |
| ***H10W 70/05*** | (2026.01) |
| ***H10W 70/65*** | (2026.01) |
| ***H10W 70/685*** | (2026.01) |
| ***H10W 90/00*** | (2026.01) |
| *H10W 70/655* | (2026.01) |
| *H10W 74/15* | (2026.01) |

(52) U.S. Cl.
CPC ......... *H10W 70/095* (2026.01); *H10W 70/65* (2026.01); *H10W 70/685* (2026.01); *H10W 90/401* (2026.01); *H10W 90/701* (2026.01); *H05K 2201/09536* (2013.01); *H05K 2201/096* (2013.01); *H05K 2201/09636* (2013.01); *H10W 70/655* (2026.01); *H10W 74/15* (2026.01); *H10W 90/724* (2026.01); *H10W 90/734* (2026.01)

(58) Field of Classification Search
USPC .......................................................... 174/250
See application file for complete search history.

(56) References Cited

U.S. PATENT DOCUMENTS

| | | | | |
|---|---|---|---|---|
| 2019/0036247 | A1* | 1/2019 | Hirasawa ............ | H01R 43/205 |
| 2019/0287895 | A1* | 9/2019 | Tajima .............. | H01L 23/53257 |
| 2021/0153350 | A1* | 5/2021 | Yamasaki ............ | H05K 3/4038 |
| 2022/0028772 | A1* | 1/2022 | Maekawa ......... | H01L 23/49838 |

FOREIGN PATENT DOCUMENTS

| | | | |
|---|---|---|---|
| JP | 2011-035358 | A | 2/2011 |
| JP | 2012-231159 | A | 11/2012 |
| JP | 2014-225671 | A | 12/2014 |
| JP | 2016-042536 | A | 3/2016 |
| JP | 6028432 | B2 | 11/2016 |
| WO | WO-2018/026002 | A1 | 2/2018 |
| WO | WO-2018/047861 | A1 | 3/2018 |

OTHER PUBLICATIONS

International Searching Authority, “International Search Report,” issued in connection with International Patent Application No. PCT/JP2022/009981, dated May 10, 2022.
International Searching Authority, “Written Opinion,” issued in connection with International Patent Application No. PCT/JP2022/009981, dated May 10, 2022.
Office Action issued in corresponding Japanese Patent Application No. 2021-038369 dated Apr. 30, 2025.

* cited by examiner

MULTILAYER WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/009981, filed on Mar. 8, 2022, which is based upon and claims the benefit of priority to Japanese Patent Application Nos. 2021-038369, filed on Mar. 10, 2021, and 2021-076047, 2021-076056, 2021-076062, 2021-076070, 2021-076071, and 2021-076081, all filed on Apr. 28, 2021. The disclosures of which are incorporated herein by reference in their entirety.

TECHNICAL FIELD

The present invention relates to multilayer wiring boards.

BACKGROUND

In recent years, as semiconductor devices are becoming faster and more highly integrated, wiring boards for flip chip-ball grid arrays on which semiconductor chips are mounted, that is, FC-BGA substrates, are also required to have a narrower pitch of bonding terminals used for bonding to semiconductor chips and have finer wiring in the substrate. Meanwhile, the FC-BGA substrates are required to be bonded to a motherboard with bonding terminals arranged at substantially the same pitch as that of the related art. In view of these demands, a technique of disposing a multilayer wiring board including fine wiring, which is also called an interposer, between the FC-BGA substrate and the semiconductor chip is being adopted.

The above includes a silicon interposer technology. In the silicon interposer technology, an interposer is manufactured by forming a multilayer wiring structure, in which respective layers include fine wiring, on a silicon wafer using a semiconductor circuit manufacturing technology.

A technique has also been developed in which the above-mentioned multilayer wiring structure is formed not on a silicon wafer, but directly on an FC-BGA substrate. According to this technique, the above-mentioned multilayer wiring structure is formed by chemical mechanical polishing (CMP) or the like in manufacture of an FC-BGA substrate whose core layer is formed of a glass epoxy substrate, for example. This is disclosed in PTL 1.

Further, there is also a method (hereinafter, "transfer method") in which the above-mentioned multilayer wiring structure is formed on an FC-BGA substrate by forming an interposer on a support such as a glass substrate, bonding the interposer to an FC-BGA substrate, and then removing the support from the interposer. This is disclosed in PTL 2.

CITATION LIST

[Patent Literature] PTL 1: JP 2014-225671 A; PTL 2: WO 2018/047861 A.

SUMMARY OF THE INVENTION

An object of the present invention is to provide a multilayer wiring board having excellent insulation reliability.

According to an aspect of the present invention, there is provided a multilayer wiring board including: two or more layers laminated together, each of the two or more layers including: an insulating resin layer having a first surface and a second surface which is a rear surface thereof, the insulating resin layer including a first recess that is open to the first surface, a groove section that is open to the first surface, and a second recess that is open to the second surface and communicates with one or more of the first recesses, the insulating resin layer being integrally formed in a thickness direction thereof, and a conductor layer including a land portion and a wiring portion filling the first recess and the groove section of the insulating resin layer, respectively, and a via portion protruding from the first surface at a position of the land portion, the via portion filling a recess of another insulating resin layer adjacent to the first surface.

Here, the insulating resin layer being "integrally formed in the thickness direction" means that the insulating resin layer does not have any internal interfaces intersecting the thickness direction, that is, it has a single-layer structure. When a plurality of insulating layers laminated together are made of the same material, the interfaces between these layers can be identified by observing a cross-section of the insulating layers with an electron microscope such as a scanning electron microscope.

According to another aspect of the present invention, a multilayer wiring board according to the above aspect is provided in which each of the two or more layers further includes an inorganic insulating layer including a portion covering the first surface. According to still another aspect of the present invention, a multilayer wiring board according to the above aspect is provided in which the inorganic insulating layer further includes a portion closing an aperture of the groove section, and a portion covering a peripheral portion of a surface on the first surface side of the land portion. Alternatively, according to still another aspect of the present invention, a multilayer wiring board according to the above aspect is provided in which the inorganic insulating layer is composed of the portion covering the first surface.

Alternatively, according to still another aspect of the present invention, a multilayer wiring board according to the above aspect is provided in which each of the two or more layers further includes an inorganic insulating layer including a portion covering a bottom of the groove section and a portion covering a bottom of the first recess. According to still another aspect of the present invention, a multilayer wiring board according to the above aspect is provided in which the inorganic insulating layer further includes a portion covering a side wall of the first recess and a portion covering a side wall of the groove section. According to still another aspect of the present invention, a multilayer wiring board according to the above aspect is provided in which the inorganic insulating layer further includes a portion covering the first surface.

Alternatively, according to another aspect of the present invention, a multilayer wiring board according to the above aspect is provided in which each of the two or more layers includes: a first inorganic insulating layer including a first portion covering the first surface, a second portion closing an aperture of the groove section, and a third portion covering a peripheral portion of a surface on the first surface side of the land portion; and a second inorganic insulating layer including a portion covering a bottom of the groove section, and a portion covering a bottom of the first recess. According to still another aspect of the present invention, a multilayer wiring board according to the above aspect is provided in which the second inorganic insulating layer includes a portion covering a side wall of the first recess, a portion covering a side wall of the groove section, and a portion interposed between the first surface and the first portion covering the first surface.

Alternatively, according to another aspect of the present invention, a multilayer wiring board according to the above aspect is provided in which each of the two or more layers further includes an inorganic insulating layer including a first portion covering the first surface, a second portion covering a bottom of the groove section, and a third portion covering a bottom of the first recess. According to still another aspect of the present invention, a multilayer wiring board according to the above aspect is provided in which the first portion is thicker than each of the second portion and the third portion. According to still another aspect of the present invention, a multilayer wiring board according to any of the above aspects is provided in which the inorganic insulating layer further includes a fourth portion covering a side wall of the first recess, and a fifth portion covering a side wall of the groove section, and the first portion is thicker than each of the fourth portion and the fifth portion. According to still another aspect of the present invention, a multilayer wiring board according to any of the above aspects is provided in which the first portion has a two-layer structure, and a portion of the inorganic insulating layer other than the first portion has a single-layer structure. According to still another aspect of the present invention, a multilayer wiring board according to any of the above aspects is provided in which the inorganic insulating layer includes a first inorganic insulating layer and a second inorganic insulating layer, the first inorganic insulating layer covering the first surface with the second inorganic insulating layer interposed therebetween, the first inorganic insulating layer having a through hole and a slit at a position of the first recess and a position of the groove section, respectively, and the second inorganic insulating layer extending across the entire inorganic insulating layer.

According to still another aspect of the present invention, a multilayer wiring board according to any of the above aspects is provided in which a material of the inorganic insulating layer includes one or more insulators selected from the group consisting of silicon oxide, silicon nitride, silicon oxynitride, fluorine-doped silicon oxide and carbon-doped silicon oxide.

According to still another aspect of the present invention, a multilayer wiring board according to any of the above aspects is provided in which the insulating resin layer is made of a non-photosensitive resin.

According to still another aspect of the present invention, a multilayer wiring board according to any of the above aspects is provided in which the first recess and the groove section have a cross-section in an inverted tapered shape, and the second recess has a cross-section in a forward tapered shape.

According to still another aspect of the present invention, a multilayer wiring board according to any of the above aspects is provided in which each of the two or more layers further includes a first metal-containing layer covering side surfaces of the land portion, the via portion and the wiring portion, a surface on an aperture side of the groove section of the wiring portion, and a peripheral portion of a surface on the first surface side of the land portion. According to still another aspect of the present invention, a multilayer wiring board according to any of the above aspects is provided in which each of the two or more layers further includes a second metal-containing layer interposed between the first metal-containing layer and the conductor layer, the second metal-containing layer being made of the same material as the conductor layer or a metal material having a lower ionization tendency than the material of the conductor layer. According to still another aspect of the present invention, a multilayer wiring board according to any of the above aspects is provided in which the first metal-containing layer contains titanium.

According to still another aspect of the present invention, there is provided a composite wiring board including: a first wiring board; and a second wiring board bonded to the first wiring board, wherein the first wiring board and the second wiring board are electrically connected to each other via bonding electrodes interposed therebetween, and the second wiring board is the multilayer wiring board according to any of the above aspects.

According to still another aspect of the present invention, a composite wiring board according to the above aspect is provided in which the first wiring board is a wiring board for a flip chip ball grid array, and the second wiring board is an interposer.

According to still another aspect of the present invention, there is provided a packaged device including: the composite wiring board according to any of the above aspects; and a functional device mounted on a surface of the second wiring board opposite to that facing the first wiring board.

The term "functional device" as used herein refers to a device that operates by being supplied with at least one of electric power and electrical signals, a device that outputs at least one of electric power and electrical signals in response to external stimuli, or a device that operates by being supplied with at least one of electric power and electrical signals and outputs at least one of electric power and electrical signals in response to external stimuli. The functional device is in the form of a chip, and may be, for example, a semiconductor chip or a chip in which circuits or elements are formed on a substrate made of a material other than a semiconductor, such as a glass substrate. The functional device may include, for example, one or more of a large-scale integrated circuit (LSI), a memory, an imaging element, a light emitting element, and micro electro mechanical systems (MEMS). The MEMS may be, for example, one or more of a pressure sensor, an acceleration sensor, a gyro sensor, a tilt sensor, a microphone, and an acoustic sensor. According to an example, the functional device is a semiconductor chip including an LSI.

According to still another aspect of the present invention, there is provided a method of producing a multilayer wiring board, the method including the steps of: forming two or more layers laminated together, the step of forming two or more layers including: forming a dummy layer on a foundation layer having a recess, the dummy layer having a groove and a through hole, the recess communicating with one or more of the through holes; forming a conductor layer on the dummy layer, the conductor layer filling the recess, the groove and the through hole; polishing the conductor layer to remove portions of the conductor layer located outside the recess, the groove and the through hole and obtain portions of the conductor layer filling the recess, the through hole and the groove as a via portion, a land portion and a wiring portion, respectively; removing the dummy layer following the step of polishing; and forming an insulating resin layer on the foundation layer and the conductor layer, the insulating resin layer covering the via portion, the land portion and the wiring portion while filling gaps therebetween, and the insulating resin layer having a recess at one or more positions of the land portion.

According to still another aspect of the present invention, there is provided a method of producing a multilayer wiring board, the method including the steps of: forming two or more layers laminated together, the step of forming two or more layers including: forming an inorganic insulating layer on an insulating resin layer, the inorganic insulating layer having a first through hole; removing a portion of the insulating resin layer exposed in the first through hole to form a recess in the insulating resin layer; forming a dummy layer on the inorganic insulating layer, the dummy layer having a groove and a second through hole, the recess communicating with one or more of the second through holes via the first through hole; forming a conductor layer on the dummy layer, the conductor layer filling the recess, the groove, the first through hole and the second through hole; polishing the conductor layer to remove portions of the conductor layer located outside the recess, the groove, the first through hole or the second through hole and obtain portions of the conductor layer filling the recess, the first and second through holes and the groove as a via portion, a land portion and a wiring portion, respectively; removing the dummy layer following the step of polishing; and forming an insulating resin layer covering the inorganic insulating layer and the conductor layer while filling a gap between the land portion and the wiring portion.

According to still another aspect of the present invention, there is provided a method of producing a multilayer wiring board, the method including the steps of: forming two or more layers laminated together, the step of forming two or more layers including: forming a recess in an insulating resin layer; forming an inorganic insulating layer covering an upper surface of the insulating resin layer and an inner surface of the recess; forming a dummy layer on the inorganic insulating layer, the dummy layer having a groove and a through hole, the recess communicating with one or more of the through holes; removing portions of the inorganic insulating layer exposed in the recess, the groove and the through hole; forming a conductor layer on the dummy layer, the conductor layer filling the recess, the groove and the through hole; polishing the conductor layer to remove portions of the conductor layer located outside the recess, the groove or the through hole and obtain portions of the conductor layer filling the recess, the through hole and the groove as a via portion, a land portion and a wiring portion, respectively; removing the dummy layer following the step of polishing; and providing an insulating resin layer covering the conductor layer while filling a gap between the land portion and the wiring portion.

According to still another aspect of the present invention, there is provided a method of producing a multilayer wiring board, the method including the steps of: forming two or more layers laminated together, the step of forming two or more layers including: forming a dummy layer on a foundation layer having a recess, the dummy layer having a groove and a through hole, the recess communicating with one or more of the through holes; forming a conductor layer on the dummy layer, the conductor layer filling the recess, the groove and the through hole; polishing the conductor layer to remove portions of the conductor layer located outside the recess, the groove and the through hole and obtain portions of the conductor layer filling the recess, the through hole and the groove as a via portion, a land portion and a wiring portion, respectively; removing the dummy layer following the step of polishing; forming an inorganic insulating layer covering at least an upper surface of the land portion and an upper surface of the wiring portion; forming an insulating resin layer covering the inorganic insulating layer while filling a gap between the land portion and the wiring portion, the insulating resin layer having a recess at one or more positions of the land portion; and removing portions of the inorganic insulating layer exposed at a position of the recess formed in the insulating resin layer.

According to still another aspect of the present invention, there is provided a method of producing a multilayer wiring board, the method including the steps of: forming two or more layers laminated together, the step of forming two or more layers including: forming a first inorganic insulating layer on an insulating layer including an insulating resin layer as an outermost layer, the first inorganic insulating layer having a first through hole; removing a portion of the insulating layer exposed in the first through hole to form a recess in the insulating layer; forming a dummy layer on the first inorganic insulating layer, the dummy layer having a groove and a second through hole, the recess communicating with one or more of the second through holes via the first through hole; forming a conductor layer on the dummy layer, the conductor layer filling the recess, the groove, the first through hole and the second through hole; polishing the conductor layer to remove portions of the conductor layer located outside the recess, the groove, the first through hole or the second through hole and obtain portions of the conductor layer filling the recess, the first and second through holes and the groove as a via portion, a land portion and a wiring portion, respectively; removing the dummy layer following the step of polishing; forming a second inorganic insulating layer covering at least an upper surface of the land portion and an upper surface of the wiring portion; and forming an insulating resin layer covering the second inorganic insulating layer while filling a gap between the land portion and the wiring portion.

According to still another aspect of the present invention, there is provided a method of producing a multilayer wiring board, the method including the steps of: forming two or more layers laminated together, the step of forming two or more layers including: forming a recess in an insulating resin layer; forming a first inorganic insulating layer covering an upper surface of the insulating resin layer and an inner surface of the recess; forming a dummy layer on the first inorganic insulating layer, the dummy layer having a groove and a through hole, the recess communicating with one or more of the through holes; removing portions of the inorganic insulating layer including the first inorganic insulating layer, the portions exposed in the recess, the groove and the through hole; forming a conductor layer on the dummy layer, the conductor layer filling the recess, the groove and the through hole; polishing the conductor layer to remove portions of the conductor layer located outside the recess, the groove or the through hole and obtain portions of the conductor layer filling the recess, the through hole and the groove as a via portion, a land portion and a wiring portion, respectively; removing the dummy layer following the step of polishing; forming a second inorganic insulating layer covering an upper surface of the first inorganic insulating layer, an upper surface of the land portion and an upper surface of the wiring portion; and providing an insulating resin layer covering the second inorganic insulating layer while filling a gap between the land portion and the wiring portion. According to still another aspect of the present invention, a method of producing a multilayer wiring board according to the above aspect is provided in which the second inorganic insulating layer is formed to further cover a side surface of the land portion and a side surface of the wiring portion.

According to still another aspect of the present invention, a method of producing a multilayer wiring board according to any of the above aspects is provided in which the inorganic insulating layer includes one or more insulators selected from the group consisting of silicon oxide, silicon nitride, silicon oxynitride, fluorine-doped silicon oxide and carbon-doped silicon oxide.

According to still another aspect of the present invention, a method of producing a multilayer wiring board according to any of the above aspects is provided in which the recess, the groove and the through hole have a cross-section in a forward tapered shape.

According to still another aspect of the present invention, a method of producing a multilayer wiring board according to any of the above aspects is provided in which the step of forming two or more layers further includes: prior to the step of forming the conductor layer, forming a first metal-containing layer covering an upper surface of the dummy layer, an inner surface of the recess of the foundation layer, and inner surfaces of the groove and the through hole of the dummy layer. Alternatively, according to still another aspect of the present invention, a method of producing a multilayer wiring board according to any of the above aspects is provided in which the step of forming two or more layers further includes: prior to the step of forming the conductor layer, forming a first metal-containing layer covering upper surfaces of the dummy layer and the inorganic insulating layer, and inner surfaces of the recess, the groove, the first through hole and the second through hole. According to still another aspect of the present invention, a method of producing a multilayer wiring board according to any of the above aspects is provided in which the step of forming two or more layers further includes: prior to the step of forming the conductor layer, forming a second metal-containing layer on the first metal-containing layer, the second metal-containing layer being made of the same material as the conductor layer or a metal material having a lower ionization tendency than the material of the conductor layer. According to still another aspect of the present invention, a method of producing a multilayer wiring board according to any of the above aspects is provided in which the first metal-containing layer contains titanium.

DETAILED DESCRIPTION

Figure 1:
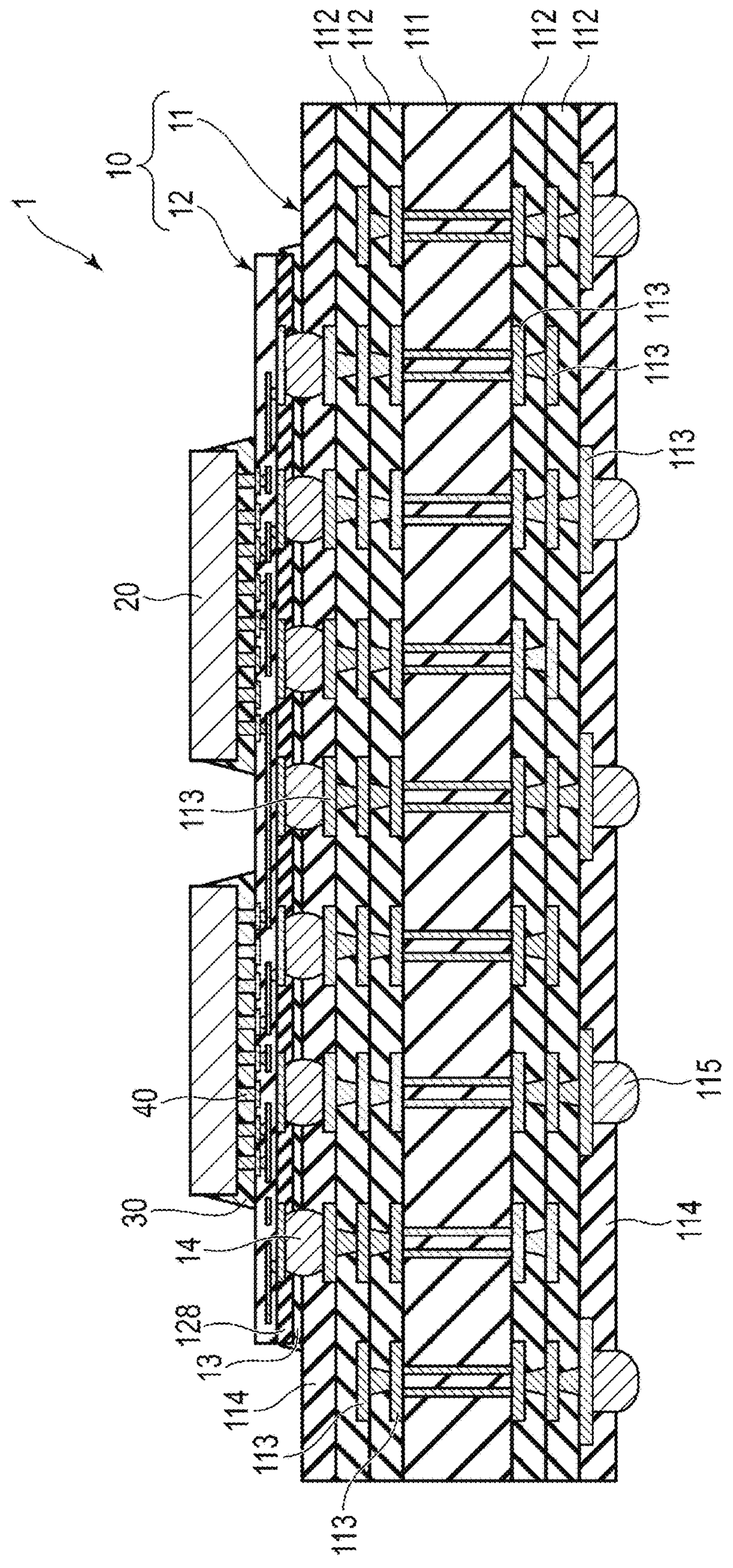
FIG. 1 is a cross-sectional view schematically illustrating a packaged device according to a first embodiment of the present invention.

With reference to the drawings, some embodiments of the present invention will be described. The embodiments described below are more specific examples of any of the aspects described above. The embodiments described below are merely examples for embodying the technical idea of the present invention, and should not limit the technical idea of the present invention to the materials, shapes, structures, arrangements, and the like of the components described below. The technical idea of the present invention can be modified in various manners within the technical scope defined by the claims.

In the drawings referred to in the following description, components having the same or similar functions are denoted by the same reference signs. It should be noted that the drawings are schematic, and the relationship between dimensions in the thickness direction and dimensions in a direction perpendicular to the thickness direction, that is, in an in-plane direction, and the relationship between dimensions of a plurality of layers in the thickness direction may not be to scale. Therefore, specific dimensions should be understood in view of the following description. It should also be noted that the dimensional relationships between two or more components may differ among the drawings. In addition, it should also be noted that some drawings show the same structure inverted from other drawings.

In the present disclosure, "upper surface" and "lower surface" refer to two major surfaces of a plate-shape member or a layer included therein, that is, a surface perpendicular to the thickness direction and having the largest surface area and a rear surface thereof, which are the surfaces illustrated on the upper side and the lower side of the drawings, respectively. Further, "side surface" refers to a surface perpendicular to or inclined relative to the major surfaces described above.

In the present disclosure, the description "AA is on BB" is used regardless of the direction of gravity. The situation specified by the description "AA is on BB" encompasses the situation in which AA is in contact with BB. The description "AA is on BB" does not exclude one or more components being interposed between AA and BB.

<1> First Embodiment

FIG. 1 is a cross-sectional view schematically illustrating a packaged device 1 according to a first embodiment of the present invention.

The packaged device 1 shown in FIG. 1 includes a composite wiring board 10, a functional device 20, a first underfill layer 30 and first bonding electrodes 40.

The functional device 20 may be, for example, a semiconductor chip or a chip in which circuits or elements are formed on a substrate made of a material other than a semiconductor, such as a glass substrate. As an example, the functional device 20 is assumed to be a semiconductor chip. That is, the packaged device 1 described herein is a semiconductor package.

The packaged device 1 may include, for example, a plurality of functional devices 20. The packaged device 1 may include a single functional device as the functional device 20.

The functional devices 20 are bonded to the composite wiring board 10 via the first bonding electrodes 40. In this example, the plurality of functional devices 20 are bonded to the composite wiring board 10 by, for example, flip chip bonding. One or more of the functional devices 20 may be bonded to the composite wiring board 10 by other bonding methods, such as wire bonding.

The first bonding electrodes 40 bond the plurality of functional devices 20 to the composite wiring board 10. A plurality of first bonding electrodes 40 are provided for each functional device 20. The plurality of first bonding electrodes 40 bonding a single functional device 20 to the composite wiring board 10 are arranged at a narrow pitch between the functional device 20 and the composite wiring board 10. The narrow pitch described herein refers to a pitch narrower than the pitch of a plurality of second bonding electrodes 14, which will be described later, of the composite wiring board 10.

The first bonding electrodes 40 may be formed of solder, for example. When the functional device 20 is bonded to the composite wiring board 10 by wire bonding, the functional device 20 may be electrically connected to the composite wiring board using gold wires, for example.

The first underfill layer 30 fixes the plurality of functional devices 20 to the composite wiring board 10. When the packaged device 1 includes a single functional device 20, the first underfill layer 30 fixes the single functional device 20 to the composite wiring board 10. In the example of the present embodiment, the first underfill layer 30 is provided between the respective functional devices 20 and the composite wiring board 10. The first underfill layer 30 includes a portion interposed between the functional device 20 and the composite wiring board 10, and a portion at least partially covering a side surface of the functional device 20.

The composite wiring board 10 includes a first wiring board and a second wiring board bonded thereto. The composite wiring board 10 described herein includes an FC-BGA substrate 11, a multilayer wiring board 12, a second underfill layer 13 and second bonding electrodes 14.

The FC-BGA substrate 11 is an example of a first wiring board. The FC-BGA substrate 11 may be bonded to, for example, a motherboard (not shown).

The FC-BGA substrate 11 includes a core layer 111, an insulating layer 112, a conductor layer 113, an insulating layer 114 and bonding conductors 115.

The core layer 111 is a resin layer. The core layer 111 may be, for example, a fiber-reinforced substrate obtained by impregnating a woven or nonwoven fabric with a thermosetting insulating resin. As the woven or nonwoven fabric, for example, glass fibers, carbon fibers or aramid fibers may be used. As the insulating resin, for example, an epoxy resin may be used.

The core layer 111 is provided with through holes. A part of the conductor layer 113 covers a side wall of the through holes. In this example, a part of the conductor layer 113 covers the side wall of the through holes disposed in the core layer 111 such that the through holes are formed to have a side wall made of the conductor. The through holes whose side wall is made of a conductor may be filled with an insulator.

The other parts of the conductor layer 113 and the insulating layer 112 form a multilayer wiring structure on both major surfaces of the core layer 111. The respective multilayer wiring structures include the conductor layers 113 and the insulating layers 112 alternately laminated.

The insulating layer 112 may be, for example, an insulating resin layer. The insulating layer 112 is provided with through holes.

The conductor layer 113 is made of a metal such as copper or an alloy thereof. The conductor layer 113 may have a single-layer structure or a multilayer structure.

The conductor layer 113 includes wiring portions and land portions. The conductor layer 113 facing the core layer 111 with the insulating layer 112 therebetween further includes via portions that cover the side wall of the through holes formed in the insulating layer 112.

The insulating layer 114 is disposed on the multilayer wiring structure described above. The insulating layer 114 may be, for example, an insulating resin layer such as a solder resist. The insulating layer 114 is provided with through holes communicating with the conductor layer 113 located on the outermost surface of the multilayer wiring structure.

The bonding conductors 115 are formed to electrically connect the packaged device 1 to components such as other substrates. The bonding conductors 115 may be, for example, metal bumps disposed on the portions of the conductor layer 113 exposed at the positions of the through holes of the insulating layer 114. The bonding conductors may also be referred to as bonding terminals. The bonding conductors 115 may be formed of solder, for example.

The multilayer wiring board 12 is an example of a second wiring board. The multilayer wiring board 12 is bonded to the functional device 20 via the first bonding electrodes 40. The multilayer wiring board 12 is bonded to the FC-BGA substrate 11 via the second bonding electrodes 14. That is, in the example of the present embodiment, the multilayer wiring board 12 is an interposer which serves to bond the functional device 20 and the FC-BGA substrate 11 to each other. The multilayer wiring board 12 may have a thickness in a range of, for example, 10 μm or more and 300 μm or less. The details of the multilayer wiring board 12 will be described later.

The second bonding electrodes 14 are arranged between the multilayer wiring board 12 and the functional device 20. The pitch of the second bonding electrodes 14 may be larger than the pitch of the first bonding electrodes 40 and smaller than the pitch of the bonding conductors 115 located on the lower surface of the FC-BGA substrate 11. The second bonding electrodes 14 may be formed of solder, for example.

The second underfill layer 13 includes a portion interposed between the FC-BGA substrate 11 and the multilayer wiring board 12. The underfill layer may also be referred to as a sealing resin layer. The second underfill layer 13 fixes the multilayer wiring board 12 to the FC-BGA substrate 11.

Figure 2:
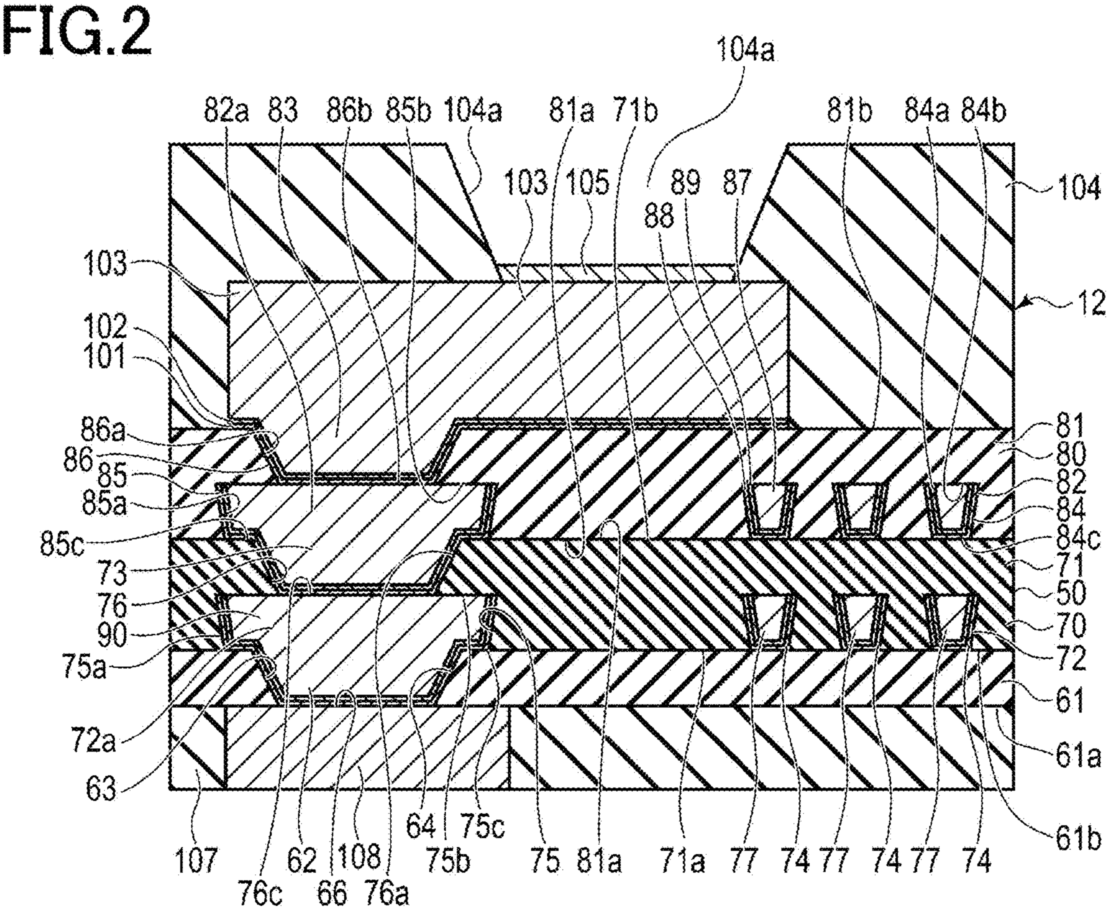
FIG. 2 is a cross-sectional view schematically illustrating a part of a multilayer wiring board used in the packaged device shown in FIG. 1.
Figure 3:
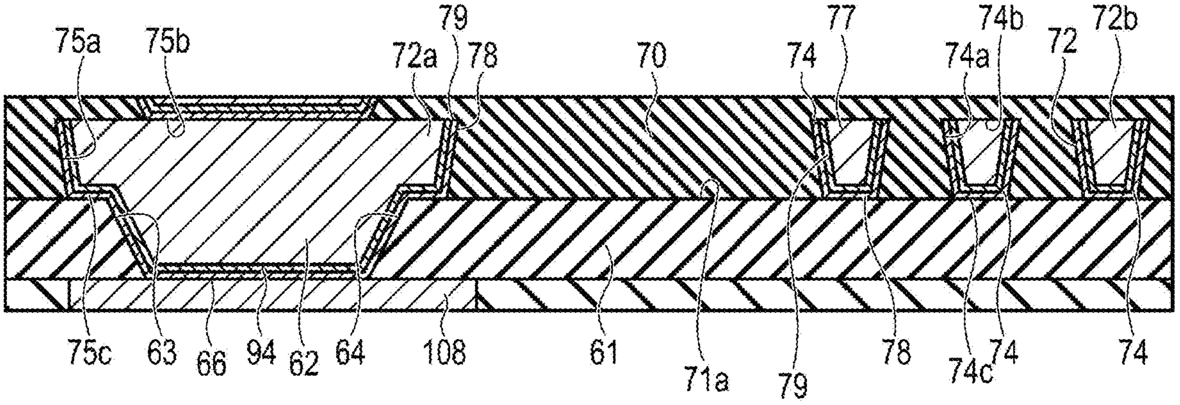
FIG. 3 is an enlarged cross-sectional view schematically illustrating a part of the multilayer wiring board shown in FIG. 2.

With reference to FIGS. 2 and 3, further details of the multilayer wiring board 12 will be described.

FIG. 2 is a cross-sectional view schematically illustrating a part of the multilayer wiring board 12. FIG. 3 is an enlarged cross-sectional view schematically illustrating a part of the multilayer wiring board 12 shown in FIG. 2. Specifically, FIG. 3 illustrates a part of a first layer 70 and the vicinity thereof.

As shown in FIGS. 2 and 3, the multilayer wiring board 12 includes two or more laminated layers 50, an insulating resin layer 61, a seed adhesion layer 101, a seed layer 102, a conductor layer 103, a solder resist layer 104, a surface treatment layer 105, an insulating resin layer 107 and a conductor layer 108. In the following description, the seed adhesion layer and the seed layer may also be referred to as a first metal-containing layer and a second metal-containing layer, respectively.

In this example, two layers 50 are provided. The number of layers 50 may be three or more. In the following description, the two layers 50 will be referred to as a first layer 70 and a second layer 80.

The first layer 70 is disposed on the insulating resin layer 61. The first layer 70 includes a first insulating resin layer 71 and a first wiring layer 72.

The first insulating resin layer 71 has insulating properties. The first insulating resin layer 71 is disposed on the insulating resin layer 61. The first insulating resin layer 71 has a first surface 71*a* and a second surface 71*b* which is a rear surface thereof. In the example of the present embodiment, the first surface 71*a* is a surface on the insulating resin layer 61 side. The second surface 71*b* is a surface on the second layer 80 side. Further, the first insulating resin layer 71 is provided with a groove section 74, a land recess 75 as a first recess, and a via recess 76 as a second recess.

The groove section 74 is formed on the first surface 71*a* of the first insulating resin layer 71. The groove section 74 is open to the first surface 71*a*. The groove section 74 is a groove for forming a wiring portion 72*b*, which will be described later, of the first wiring layer 72. A plurality of groove sections 74 are provided. The groove section 74 has a depth that does not reach the second surface 71*b* of the first insulating resin layer 71.

The groove section 74 has a shape in which the width gradually decreases toward the first surface 71*a*. The groove section 74 has a side surface 74*a* which is a side wall, and a bottom 74*b*. The side surface 74*a* is a continuous surface between the first surface 71*a* and the bottom 74*b*.

In the example of the present embodiment, as shown in FIG. 2, the groove section 74 is formed such that a cross-section taken along the cross-section perpendicular to the extending direction of the groove section 74, that is, a cross-section parallel to the width direction of the groove section 74, has a trapezoidal shape. Specifically, the above cross-section of the groove section 74 has an inverted tapered shape. The cross-section of the groove section 74 may have a rectangular shape. For example, the bottom 74*b* may be formed as a flat surface, specifically, as a flat surface perpendicular to the thickness direction of the first insulating resin layer 71.

The land recess 75 is formed on the first surface 71*a* of the first insulating resin layer 71. The land recess 75 is open to the first surface 71*a*. The land recess 75 is a recess for forming a land portion 72*a*, which will be described later, of the first wiring layer 72. A plurality of land recesses 75 are formed. Each of the plurality of land recesses 75 communicates with one of the groove sections 74.

The land recess 75 has a shape in which the dimension in a direction perpendicular to the thickness direction gradually decreases from the second surface 71*b* toward the first surface 71*a*. That is, the land recess 75 has an inverted tapered cross-section perpendicular to the thickness direction. For example, the land recess 75 may be formed in a frustoconical shape. The land recess 75 has a side surface 75*a*, which is a side wall, and a bottom 75*b*. The side surface 75*a* is a continuous surface between the first surface 71*a* and the bottom 75*b*. For example, the bottom 75*b* may be formed as a flat surface, specifically, as a flat surface perpendicular to the thickness direction of the first insulating resin layer 71.

The via recess 76 is formed on the second surface 71*b* of the first insulating resin layer 71. The via recess 76 is open to the second surface 71*b*. The via recess 76 is a recess for forming a via portion 73. A plurality of via recesses 76 are formed. Each of the via recesses 76 communicates with any of the land recesses 75. The width of the via recess 76 is smaller than the width of the land recess 75.

When viewed in the thickness direction of the first insulating resin layer 71, the center positions of the respective via recesses 76 coincide with the center positions of the land recesses 75 communicating with the respective via recesses 76. In the example of the present embodiment, the edge of the via recess 76 on the first surface 71*a* side is located inside the edge of the land recess 75 on the second surface 71*b* side.

The via recess 76 has a shape in which the width in a direction perpendicular to the thickness direction gradually decreases from the second surface 71*b* toward the first surface 71*a*. That is, the via recess 76 has an inverted tapered cross-section perpendicular to the thickness direction. For example, the via recess 76 may be formed in a frustoconical shape.

The first insulating resin layer 71 configured as described above is integrally formed in the thickness direction. Here, the insulating resin layer being "integrally formed in the thickness direction" means that the insulating resin layer does not have any internal interfaces intersecting the thickness direction, that is, it has a single-layer structure. When a plurality of insulating layers laminated together are made of the same material, the interfaces between these layers can be identified by observing a cross-section of the insulating layers with an electron microscope such as a scanning electron microscope.

The first wiring layer 72 fills the groove section 74, the land recess 75, and a recess of the resin layer adjacent to the first layer 70. In the example of the present embodiment, the recess of the resin layer adjacent to the first layer 70 refers to a via hole 63, which will be described later, formed in the insulating resin layer 61.

The first wiring layer 72 includes a seed adhesion layer 78, a seed layer 79 and a conductor layer 77.

The conductor layer 77 fills the groove section 74 and the land recess 75 of the first insulating resin layer 71, and the via hole 63 of the insulating resin layer 61. A portion of the conductor layer 77 that fills the groove section 74 constitutes the wiring portion 72*b*. A portion of the conductor layer 77 that fills the land recess 75 constitutes the land portion 72*a*. A portion of the conductor layer 77 that fills the via hole 63 of the insulating resin layer 61 constitutes a via portion 62. The via portion 62 protrudes from the first surface 71*a* at the position of the land portion 72*a*. The conductor layer 77 may be made of copper, for example.

The seed adhesion layer 78 is a first metal-containing layer. The seed adhesion layer 78 is a layer containing titanium. A first portion of the seed adhesion layer 78 is disposed on the side surface 74*a* of the groove section 74 and in an aperture 74*c*. The aperture 74*c* is an opening on the first surface 71*a*. The first portion of the seed adhesion layer 78 closes the aperture 74*c*. That is, the first portion of the seed adhesion layer 78 covers the side surface and the lower surface of each of the wiring portions 72*b*, the lower surface being a surface on the aperture 74*c* side.

A second portion of the seed adhesion layer 78 is disposed on the side surface 75*a* of the land recess 75, a part of the aperture 75*c* of the land recess 75, the side surface 64, which is the side wall of the via hole 63 of the insulating resin layer 61, described later, and the aperture 66 of the via hole 63. The aperture 75*c* is an opening on the first surface 71*a*. The part of the aperture 75*c* of the land recess 75 refers to a region between the edge of the aperture 75*c* and the edge of the via hole 63. The second portion of the seed adhesion layer 78 closes the aperture 66 of the via hole 63. The aperture 66 is an opening of the via hole 63 on a first surface 61*a*, which will be described later, of the insulating resin layer 61. That is, the second portion of the seed adhesion layer 78 covers the side surfaces of the land portion 72*a* and the via portion 62. Further, the seed adhesion layer 78 covers the lower surface of the land portion 72*a*. The seed adhesion layer 78 also covers the peripheral portion of the lower surface of the land portion 72*a*, which is a surface on the first surface 61*a* side.

The seed layer 79 is a second metal-containing layer. The seed layer 79 is a metal layer interposed between the seed adhesion layer 78 and the conductor layer 77. The seed layer 79 is made of the same material as the conductor layer 77 or a metal material having a lower ionization tendency than the material of the conductor layer 77. For example, the seed layer 79 may be made of copper, which is the same material as the metal material constituting the conductor layer 77.

As shown in FIG. 2, the second layer 80 is disposed on the first layer 70. The second layer 80 includes a second insulating resin layer 81 and a second wiring layer 82.

The second insulating resin layer 81 has insulating properties. The second insulating resin layer 81 is disposed on the first layer 70. The second insulating resin layer 81 has a first surface 81*a* and a second surface 81*b* which is a rear surface thereof. In the example of the present embodiment, the first surface 81*a* is a surface on the first layer 70 side. The second surface 81*b* is a surface on the seed adhesion layer 101 side. Further, the second insulating resin layer 81 is provided with a groove section 84, a land recess 85 as a first recess, and a via recess 86 as a second recess.

The groove section 84 is formed on the first surface 81*a* of the second insulating resin layer 81. The groove section 84 is open to the first surface 81*a*. The groove section 84 is a groove for forming a wiring portion 82*b*, which will be described later, of the second wiring layer 82. A plurality of groove sections 84 are provided. The groove section 84 has a depth that does not reach the second surface 81*b* of the second insulating resin layer 81.

The groove section 84 has a shape in which the width gradually decreases toward the first surface 81*a*. The groove section 84 has a side surface 84*a* which is a side wall, and a bottom 84*b*. The side surface 84*a* is a continuous surface between the first surface 81*a* and the bottom 84*b*.

In the example of the present embodiment, as shown in FIG. 2, the groove section 84 is formed such that a cross-section taken along the cross-section perpendicular to the extending direction of the groove section 84, that is, a cross-section parallel to the width direction of the groove section 84, has a trapezoidal shape. Specifically, the above cross-section of the groove section 84 has an inverted tapered shape. The cross-section of the groove section 84 may have a rectangular shape. For example, the bottom 84*b* may be formed as a flat surface, specifically, as a flat surface perpendicular to the thickness direction of the second insulating resin layer 81.

The land recess 85 is formed on the first surface 81*a* of the second insulating resin layer 81. The land recess 85 is open to the first surface 81*a*. The land recess 85 is a recess for forming a land portion 82*a*, which will be described later, of the second wiring layer 82. A plurality of land recesses 85 are formed. Each of the plurality of land recesses 85 communicates with one of the groove sections 84. The land recess 85 has a depth that does not reach the second surface 81*b*.

The land recess 85 has a shape in which the dimension in a direction perpendicular to the thickness direction gradually decreases from the second surface 81*b* toward the first surface 81*a*. That is, the land recess 85 has an inverted tapered cross-section perpendicular to the thickness direction. For example, the land recess 85 may be formed in a frustoconical shape. The land recess 85 has a side surface 85*a*, which is a side wall, and a bottom 85*b*. The side surface 85*a* is a continuous surface between the first surface 81*a* and the bottom 85*b*. For example, the bottom 85*b* may be formed as a flat surface, specifically, as a flat surface perpendicular to the thickness direction of the second insulating resin layer 81.

Each of the via recesses 76 communicates with any of the land recesses 85. When viewed in the thickness direction of the second insulating resin layer 81, the center positions of the respective land recesses 85 coincide with the center positions of the via recesses 76 communicating with the respective land recesses 85.

The via recess 86 is formed on the second surface 81*b* of the second insulating resin layer 81. The via recess 86 is open to the second surface 81*b*. The via recess 86 is a recess for forming a via portion 83, which will be described later, of the conductor layer 103. A plurality of via recesses 86 are formed. Each of the via recesses 86 communicates with any of the land recesses 85. The width of the via recess 86 is smaller than the width of the land recess 85.

When viewed in the thickness direction of the second insulating resin layer 81, the center positions of the respective via recesses 86 coincide with the center positions of the land recesses 85 communicating with the respective via recesses 86. In the example of the present embodiment, the edge of the via recess 86 on the first surface 81*a* side is located inside the edge of the land recess 85 on the second surface 81*b* side.

The via recess 86 has a shape in which the width in a direction perpendicular to the thickness direction gradually decreases from the second surface 81*b* toward the first surface 81*a*. That is, the via recess 86 has an inverted tapered cross-section perpendicular to the thickness direction. For example, the via recess 86 may be formed in a frustoconical shape.

The second insulating resin layer 81 configured as described above is integrally formed in the thickness direction.

The second wiring layer 82 fills the groove section 84, the land recess 85, and a recess of the resin layer adjacent to the second layer 80. In the example of the present embodiment, the recess of the resin layer adjacent to the second layer 80 refers to a via recess 76 of the first layer 70.

The second wiring layer 82 includes a seed adhesion layer 88, a seed layer 89 and a conductor layer 87.

The conductor layer 87 fills the groove section 84 and the land recess 85 of the second insulating resin layer 81, and the via recess 76 of the first insulating resin layer 71. A portion of the conductor layer 87 that fills the groove section 84 in the second wiring layer 82 constitutes the wiring portion 82*b*. A portion of the conductor layer 87 that fills the land recess 85 in the second wiring layer 82 constitutes the land portion 82*a*. A portion of the conductor layer 87 that fills the via recess 76 of the first layer 70 in the second wiring layer 82 constitutes the via portion 73. The conductor layer 87 may be made of copper, for example.

The seed adhesion layer 88 is made of titanium. A first portion of the seed adhesion layer 88 is disposed on the side surface 84*a* of the groove section 84 and in an aperture 84*c*. The aperture 84*c* is an opening on the first surface 81*a*. The first portion of the seed adhesion layer 88 closes the aperture 84*c*. That is, the first portion of the seed adhesion layer 88 covers the lower surface and the side surface of each of the wiring portions 82*b*.

A second portion of the seed adhesion layer 88 is disposed on the side surface 85*a* of the land recess 85, a part of the aperture 85*c* of the land recess 85, the side surface 76*a*, which is the side wall of the via recess 76 of the first layer 70, and the aperture 76*c* of the via recess 76. The aperture 85*c* is an opening on the first surface 81*a*. The part of the aperture 85*c* refers to a region between the edge of the aperture 85*c* and the edge of the via recess 76. The aperture 76*c* is an opening of the via recess 76 on the first surface 71*a* side. The second portion of the seed adhesion layer 88 closes the aperture 76*c* of the via recess 76. That is, the second portion of the seed adhesion layer 88 covers the lower surfaces and the side surfaces of the land portion 82*a* and the via portion 73.

The seed layer 89 is a metal layer interposed between the seed adhesion layer 88 and the conductor layer 87. The seed layer 89 is made of the same material as the conductor layer 87 or a metal material having a lower ionization tendency than the material of the conductor layer 87. For example, the seed layer 89 may be made of copper, which is the same material as the metal material constituting the conductor layer 87.

The insulating resin layer 61 is disposed on the first surface 71*a* of the first layer 70. The insulating resin layer 61 has a first surface 61*a* and a second surface 61*b*. The first surface 61*a* is a surface on a side opposite to that facing the first layer 70. The second surface 61*b* is a surface on the first layer 70 side.

The insulating resin layer 61 is provided with the via hole 63. The via hole 63 is a hole penetrating the insulating resin layer 61 in the thickness direction. That is, the via hole 63 is open to the first surface 61*a* and the second surface 61*b*. The via hole 63 has a shape in which the dimension in a direction perpendicular to the thickness direction gradually decreases from the second surface 61*b* toward the first surface 61*a*. For example, the via hole 63 may be formed in a frustoconical shape. The via hole 63 has a side surface 64 which is a side wall.

As described above, the via hole 63 is filled with a part of the first wiring layer 72 of the first layer 70.

The seed adhesion layer 101 may be, for example, a first metal-containing layer. The seed adhesion layer 101 may be, for example, a layer containing titanium. The seed adhesion layer 101 includes a portion covering a part of the second surface 81*b* of the second insulating resin layer 81, and a portion covering the inner surface of the via recess 86 of the second insulating resin layer 81. The seed adhesion layer 101 closes the aperture of the via recess 86. The aperture described above is an opening of the via recess 86 on the first surface 81*a* side, and the aperture communicates with the land recess 85.

The seed layer 102 may be, for example, a second metal-containing layer. The seed layer 102 is a metal layer disposed on the seed adhesion layer 101. The seed layer 102 is made of the same material as the conductor layer 103 or a metal material having a lower ionization tendency than the material of the conductor layer 103. The seed layer 102 may be made of copper, for example.

The conductor layer 103 is disposed on the seed adhesion layer 101. The conductor layer 103 fills the via recess 86. A portion of the conductor layer 103 filling the via recess 86 is the via portion 83. The conductor layer 103 is electrically connected to an interlayer connection conductor layer 90, which is composed of the conductor layer 77 and the conductor layer 87, via the seed adhesion layer 101 and the seed layer 102. The conductor layer 103 may be made of copper, for example.

The solder resist layer 104 is disposed on the second layer 80 and the conductor layer 103. The solder resist layer 104 has a through hole 104*a* through which a part of the conductor layer 103 is exposed. The through hole 104*a* enables electrical connection between the multilayer wiring board 12 and the FC-BGA substrate 11 via the second bonding electrode 14.

The surface treatment layer 105 is disposed on a portion of the conductor layer 103 exposed through the through hole 104*a* of the solder resist layer 104. The surface treatment layer 105 prevents oxidation of the surface of the conductor layer 103 and improves wettability with solder.

The insulating resin layer 107 is disposed on the first surface 61*a* of the insulating resin layer 61 and a part of the first wiring layer 72. The insulating resin layer 107 has a through hole at a position of the via portion 62.

The conductor layer 108 is formed in the through hole of the insulating resin layer 107. The conductor layer 108 may be made of copper, for example. The conductor layer 108 is connected to the first bonding electrode 40 shown in FIG. 1.

Next, an example method of producing the multilayer wiring board 12 will be described. FIGS. 4 to 24 are cross-sectional views schematically illustrating an example method of producing the multilayer wiring board 12.

Figure 5:
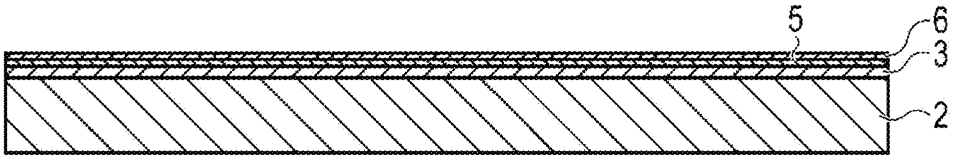
FIG. 5 is a cross-sectional view schematically illustrating another step in the method of producing a multilayer wiring board according to the first embodiment of the present invention.

In this example of production method, first, a structure shown in FIG. 5 is obtained. In the following description, the steps for obtaining a structure shown in FIG. 5 will be sequentially described.

Figure 4:
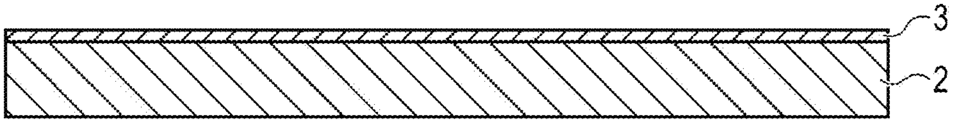
FIG. 4 is a cross-sectional view schematically illustrating one step in the method of producing a multilayer wiring board according to the first embodiment of the present invention.

First, as shown in FIG. 4, a release layer 3 is formed on one surface of a support 2.

The support 2 is preferably translucent since the release layer 3 may be irradiated with light through the support 2. For example, a glass plate may be used as the support 2. Since the glass plate has excellent flatness and high rigidity, it is suitable for forming a fine pattern of the multilayer wiring board 12 on the support 2. In addition, since the glass plate has only a small coefficient of thermal expansion (CTE) and is less likely to be distorted, it is excellent in ensuring pattern arrangement accuracy and flatness.

When a glass plate is used as the support 2, the glass plate is preferably thick from the viewpoint of suppressing the occurrence of warpage in the production process, and the thickness may be, for example, 0.5 mm or more, and preferably 1.2 mm or more. The CTE of the glass plate is preferably in a range of 3 ppm or more and 16 ppm or less, and more preferably approximately 10 ppm from the viewpoint of the CTEs of the FC-BGA substrate 11 and the functional device 20.

Examples of the glass as a material for forming the support 2 include quartz glass, borosilicate glass, alkali-free glass, soda glass, sapphire glass, and the like. On the other hand, when the support 2 is not required to be translucent in removal of the support 2, such as when a thermally foamable resin is used for the release layer 3, the support 2 can be made of a material which is less likely to be distorted, such as metal or ceramics. In the example of the present embodiment, glass is used for the support 2.

For example, the release layer 3 may be a resin that becomes releasable by generating heat or being deformed when absorbing light such as UV light, or may be a resin that can be thermally foamed and becomes releasable. When using a resin that becomes releasable by irradiation of light such as UV light, for example, laser light, the support 2 may be irradiated with light via a surface on a side opposite to that facing the release layer 3 so that the support 2 can be removed from a laminate on the support 2, the laminate being composed of the multilayer wiring board 12 and the FC-BGA substrate 11.

The release layer 3 can be selected from organic resins such as an epoxy resin, a polyimide resin, a polyurethane resin, a silicone resin, a polyester resin, an oxetane resin, a maleimide resin and an acrylic resin, and inorganic layers such as amorphous silicon, gallium nitride and a metal oxide layer. The release layer 3 may further contain additives such as a photodegradation accelerator, a light absorber, a sensitizer and a filler.

Further, the release layer 3 may have a single-layer structure or a multilayer structure. For example, a protective layer may be further provided on the release layer 3 for protection of the multilayer wiring board 12 formed on the support 2, or a layer may be further provided between the support 2 and the release layer 3 to improve adhesion between the support 2 and the release layer 3. In addition, a laser light reflecting layer or a metal layer may be provided between the release layer 3 and the multilayer wiring board 12. The configuration of the release layer 3 is not limited to the present embodiment. In the example of the present embodiment, a resin that becomes releasable by absorbing UV light is used for the release layer 3.

Next, as shown in FIG. 5, a seed adhesion layer 5 and a seed layer 6 are provided on the release layer 3, for example, in a vacuum. The seed adhesion layer 5 is a layer that improves adhesion of the seed layer 6 to the release layer 3, preventing the seed layer 6 from being delaminated. Further, the seed layer 6 serves as a power supply layer of electrolytic plating in wiring formation.

The seed adhesion layer 5 and the seed layer 6 can be formed by, for example, sputtering or vapor deposition. As the material of the seed adhesion layer 5 and the seed layer 6, for example, Cu, Ni, Al, Ti, Cr, Mo, W, Ta, Au, Ir, Ru, Pd, Pt, AlSi, AlSiCu, AlCu, NiFe, ITO (indium tin oxide), IZO (indium zinc oxide), AZO (aluminum-doped zinc oxide), ZnO, PZT (lead zirconate titanate), TiN, $Cu_3N_4$, Cu alloy, or a combination of thereof can be used. In the example of the present embodiment, a titanium layer as the seed adhesion layer 5 and then a copper layer as the seed layer 6 are sequentially formed by sputtering, in consideration of the viewpoint of electrical properties, ease of manufacturing and cost.

The total thickness of the seed adhesion layer 5 and the seed layer 6 is preferably 1 μm or less. As an example, a 50 nm thick titanium layer is formed as the seed adhesion layer 5 and a 300 nm thick copper layer is formed as the seed layer 6.

Figure 6:
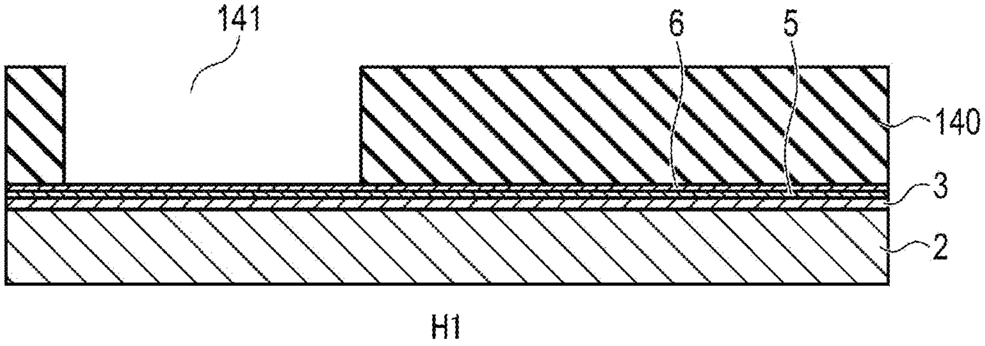
FIG. 6 is a cross-sectional view schematically illustrating still another step in the method of producing a multilayer wiring board according to the first embodiment of the present invention.

Next, as shown in FIG. 6, a resist layer 140 is provided on the seed layer 6. When a liquid resist is used as the material of the resist layer 140, the resist layer 140 can be formed by slit coating, curtain coating, die coating, spray coating, electrostatic coating, ink jet coating, gravure coating, screen printing, gravure offset printing, spin coating or doctor coating. When a film resist is used for the resist layer 140, the resist layer 140 can be provided on the seed layer 6 by lamination, vacuum lamination or vacuum pressing.

Next, a through hole 141 is formed in the resist layer 140 by, for example, photolithography. The through hole 141 may be subjected to plasma treatment for removing residues at the time of development. The thickness of the resist layer 140 is set according to the thickness of the conductor layer 108 to be formed in the through hole 141. In the example of the present embodiment, the thickness of the resist layer 140 may be, for example, 8 μm.

The shape of the through hole 141 in plan view is set according to the pitch of the bonding electrodes of the functional device 20 and the shape of the bonding electrodes. In the example of the present embodiment, the through hole 141 has a φ25 μm circular opening with a pitch of 55 μm. The plan view refers is a shape viewed in a direction in the thickness direction of the resist layer 140, in other words, a shape viewed in the depth direction of the through hole 141.

Figure 7:
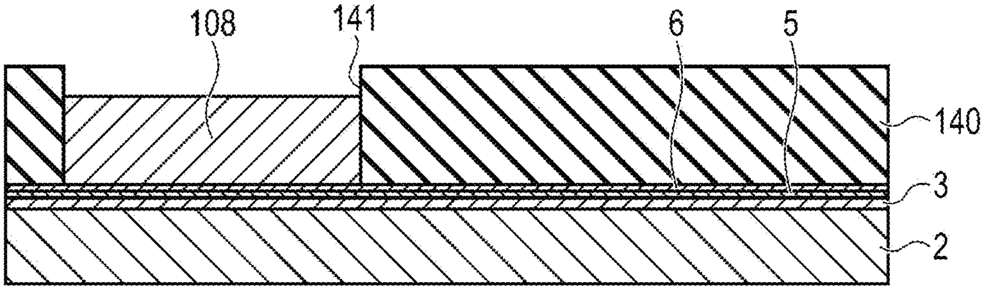
FIG. 7 is a cross-sectional view schematically illustrating still another step in the method of producing a multilayer wiring board according to the first embodiment of the present invention.

Next, as shown in FIG. 7, a conductor layer 108 is formed on the seed layer 6 by electroplating. The conductor layer 108 constitutes electrodes for bonding to the functional device 20. Examples of the electroplating constituting the conductor layer 108 include electrolytic nickel plating, electrolytic copper plating, electrolytic chromium plating, electrolytic Pd plating, electrolytic gold plating, electrolytic rhodium plating and electrolytic iridium plating. Particularly, electrolytic copper plating is desirable since it is simple and inexpensive and can provide the conductor layer 108 with good electrical conductivity.

Since the conductor layer 108 constitutes electrodes for bonding to the functional device 20, the thickness of the conductor layer 108 is desirably 1 μm or more from the viewpoint of solder bonding and 30 μm or less from the viewpoint of productivity.

Figure 8:
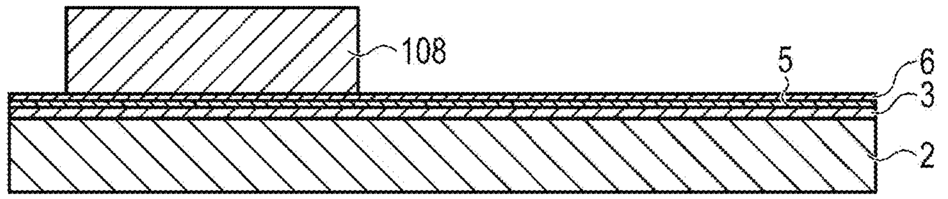
FIG. 8 is a cross-sectional view schematically illustrating still another step in the method of producing a multilayer wiring board according to the first embodiment of the present invention.

Next, as shown in FIG. 8, the resist layer 140 is removed. The resist layer 140 can be dissolved or removed by dry etching or by immersion in an alkaline solution or solvent.

Figure 9:
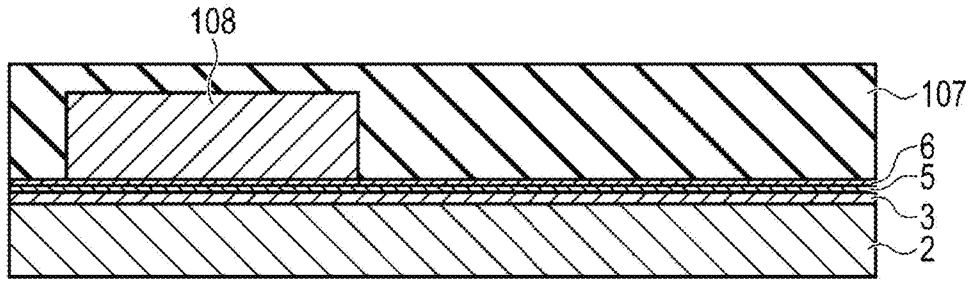
FIG. 9 is a cross-sectional view schematically illustrating still another step in the method of producing a multilayer wiring board according to the first embodiment of the present invention.

Next, as shown in FIG. 9, an insulating resin layer 107 is provided so that the conductor layer 108 is embedded therein. The insulating resin layer 107 may be photosensitive or non-photosensitive, and may not be necessarily made of the same material as the insulating resin layers 61, 71 and 81, which will be described later.

Figure 10:
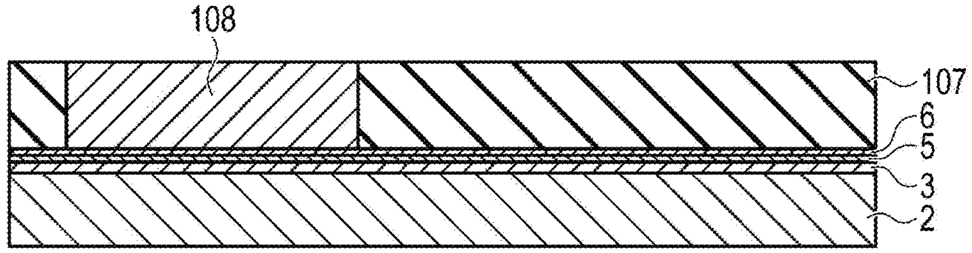
FIG. 10 is a cross-sectional view schematically illustrating still another step in the method of producing a multilayer wiring board according to the first embodiment of the present invention.

Next, as shown in FIG. 10, the upper surface of the conductor layer 108 is exposed by physical polishing or by physical polishing and surface polishing such as CMP processing. The conductor layer 108 may be produced by a semi-additive method.

Figure 11:
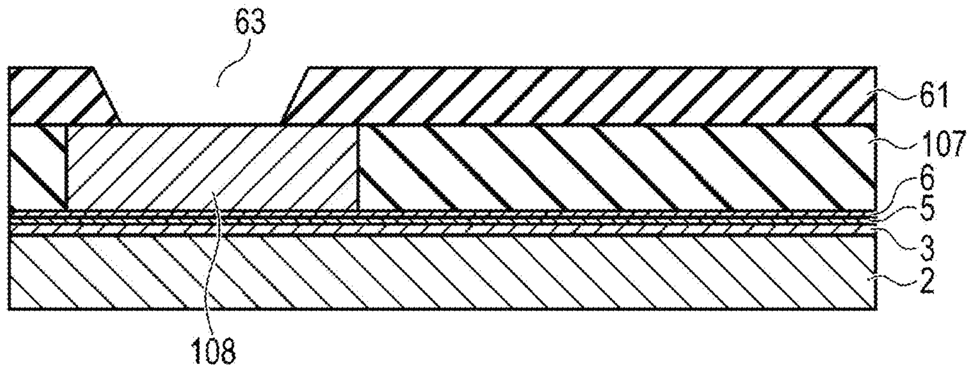
FIG. 11 is a cross-sectional view schematically illustrating still another step in the method of producing a multilayer wiring board according to the first embodiment of the present invention.

Next, as shown in FIG. 11, an insulating resin layer 61 is provided on the conductor layer 108 and the insulating resin layer 107. The insulating resin layer 61 may be formed of, for example, a photosensitive resin material.

Examples of the photosensitive resin material include a photosensitive polyimide resin, a photosensitive benzocyclobutene resin, a photosensitive epoxy resin, and modified products thereof. As an example, a photosensitive epoxy-based resin is used as the photosensitive resin.

The photosensitive resin may be in a liquid form or a film-like form.

When a liquid photosensitive resin is used, the insulating resin layer 61 can be formed by a method selected from, for example, slit coating, curtain coating, die coating, spray coating, electrostatic coating, ink jet coating, gravure coating, screen printing, gravure offset printing, spin coating and doctor coating. For example, the insulating resin layer 61 may be formed by spin coating using a photosensitive epoxy resin. Since the photosensitive epoxy resin can be cured at a relatively low temperature and has little shrinkage due to curing after formation, it is advantageous for subsequent fine pattern formation.

When a film-like photosensitive resin is provided as the insulating resin layer 61, lamination, vacuum lamination, vacuum pressing, or the like can be applied.

The insulating resin layer 61 may be formed to have a thickness of, for example, 2 μm on the conductor layer 108.

Next, a via hole 63 is formed in the insulating resin layer 61 by photolithography, for example, at a position of the conductor layer 108. Thus, a foundation layer having a surface composed of the exposed surface of the insulating resin layer 61 and the exposed surface of the conductor layer 108 is obtained.

The insulating resin layer 61 may be formed of a non-photosensitive resin. Examples of the non-photosensitive resin include a polyimide resin, a benzocyclobutene resin, an epoxy resin, and modified products thereof. The non-photosensitive resin such as polyimide is excellent in insulating properties and mechanical properties, and can achieve high heat resistance. Furthermore, inorganic particles such as silica, alumina or zirconia may be added as a filler to the non-photosensitive resin.

The non-photosensitive resin may be in a liquid form or a film-like form.

When a non-liquid photosensitive resin is used, the insulating resin layer 61 can be formed by a method selected from, for example, slit coating, curtain coating, die coating, spray coating, electrostatic coating, ink jet coating, gravure coating, screen printing, gravure offset printing, spin coating and doctor coating.

When a film-like non-photosensitive resin is provided as the insulating resin layer 61, lamination, vacuum lamination, vacuum pressing, or the like can be applied.

When a non-photosensitive resin is used, the via hole 63 can be formed by, for example, laser light irradiation.

In addition, after the insulating resin layer 61 is formed, the surface can be flattened by physical polishing or by physical polishing and polishing such as CMP.

Figure 12:
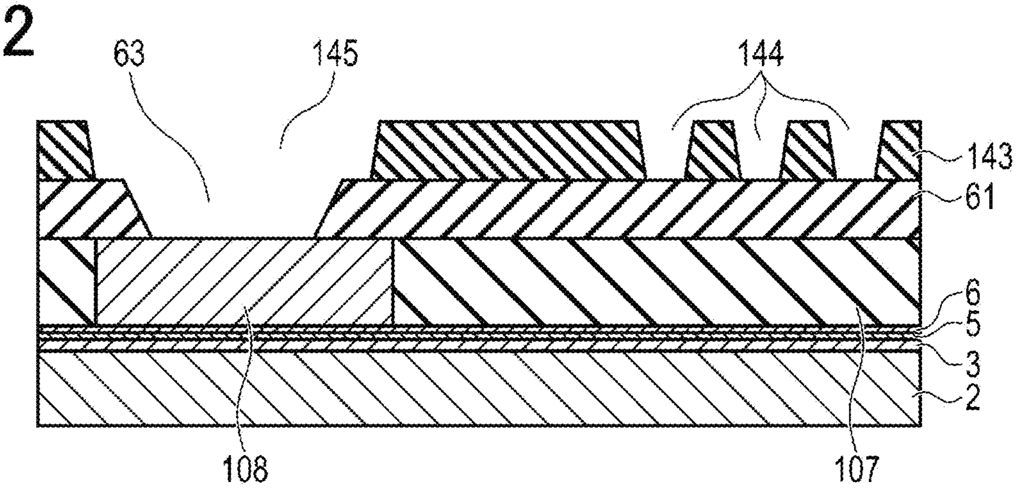
FIG. 12 is a cross-sectional view schematically illustrating still another step in the method of producing a multilayer wiring board according to the first embodiment of the present invention.

Next, as shown in FIG. 12, a resist layer 143 is formed on the foundation layer composed of the insulating resin layer 61 and the conductor layer 108. The resist layer 143 can be formed by applying a photosensitive resin to the foundation layer. As the photosensitive resin, for example, those exemplified for the insulating resin layer 61 can be used. As with the insulating resin layer 61, the resist layer 143 can be formed by, for example, any of slit coating, curtain coating, die coating, spray coating, electrostatic coating, ink jet coating, gravure coating, screen printing, gravure offset printing, spin coating and doctor coating. Here, as an example, the resist layer 143 is formed by spin coating using a photosensitive epoxy resin.

Next, a groove 144 corresponding to the groove section 74 and a through hole 145 corresponding to the land recess 75 are formed in the resist layer 143 by photolithography. As an example, the groove 144 is formed to have a forward tapered cross-section perpendicular to the length direction. The through hole 145 is also formed in a forward tapered shape. Alternatively, the groove 144 and the through hole 145 may be formed to have a rectangular cross-section. By forming in a forward tapered shape, a seed adhesion layer 78 can be easily formed without producing discontinuous portions in the groove 144 and the through hole 145.

The resist layer 143 in which the groove 144 and the through hole 145 are formed as described above is an example of a dummy layer. One or more of the through holes 145 communicate with the via hole 63. The aperture of the through hole 145 on the via hole 63 side is larger than the aperture of the via hole 63 on the through hole 145 side. The aperture of the via hole 63 on the through hole 145 side is located inside the aperture of the through hole 145.

Figure 13:
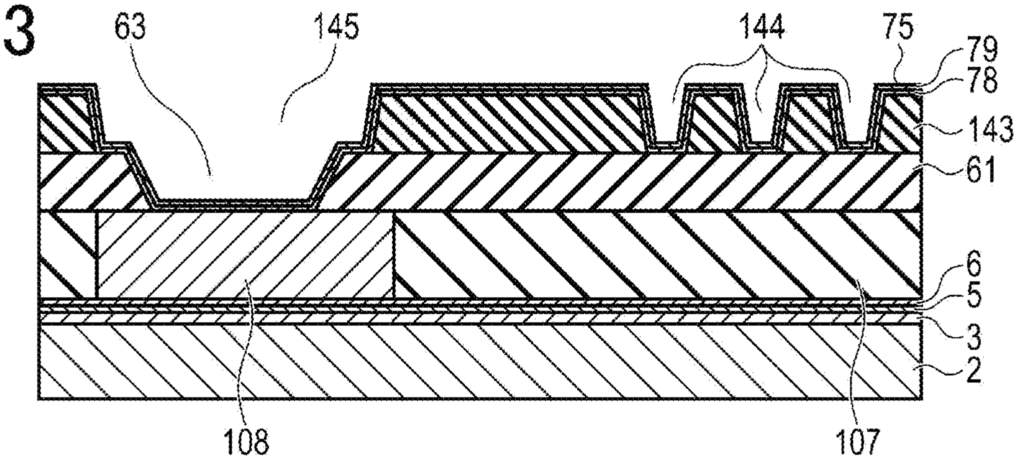
FIG. 13 is a cross-sectional view schematically illustrating still another step in the method of producing a multilayer wiring board according to the first embodiment of the present invention.

Next, as shown in FIG. 13, a seed adhesion layer 78 is formed on the resist layer 143, the insulating resin layer 61 and the conductor layer 108, for example, in a vacuum. Subsequently, a seed layer 79 is formed on the seed adhesion layer 78, for example, in a vacuum.

In the example of the present embodiment, the seed adhesion layer 78 is formed of titanium from the viewpoint of electrical properties, ease of manufacturing and cost, and in order to function as a copper diffusion prevention layer. Further, the seed layer 79 is formed of copper in consideration of electrical properties, ease of manufacturing and cost. The seed adhesion layer 78 and the seed layer 79 are sequentially formed by sputtering. By using a vapor deposition method for film formation, the seed adhesion layer 78 and the seed layer 79 are formed on the entire exposed surfaces of the resist layer 143, the insulating resin layer 61 and the conductor layer 108 as shown in FIG. 13.

The total thickness of the seed adhesion layer 78 and the seed layer 79 is preferably 1 μm or less. The seed adhesion layer 78 can be made of a material other than titanium as long as it has a copper diffusion prevention function. The seed layer 79 may be made of the same material as the conductor layer 77 or a metal material having a lower ionization tendency than the material of the conductor layer 77.

In the example of the present embodiment, the thickness of the seed adhesion layer 78 is 50 nm, and the thickness of the seed layer 79 is 300 nm.

In addition, one or more other layers made of a metal material may be provided between the seed adhesion layer 78 and the seed layer 79. The layer provided between the seed adhesion layer 78 and the seed layer 79 is made of the same material as the conductor layer 77 or a metal material having a lower ionization tendency than the material of the conductor layer 77.

Figure 14:
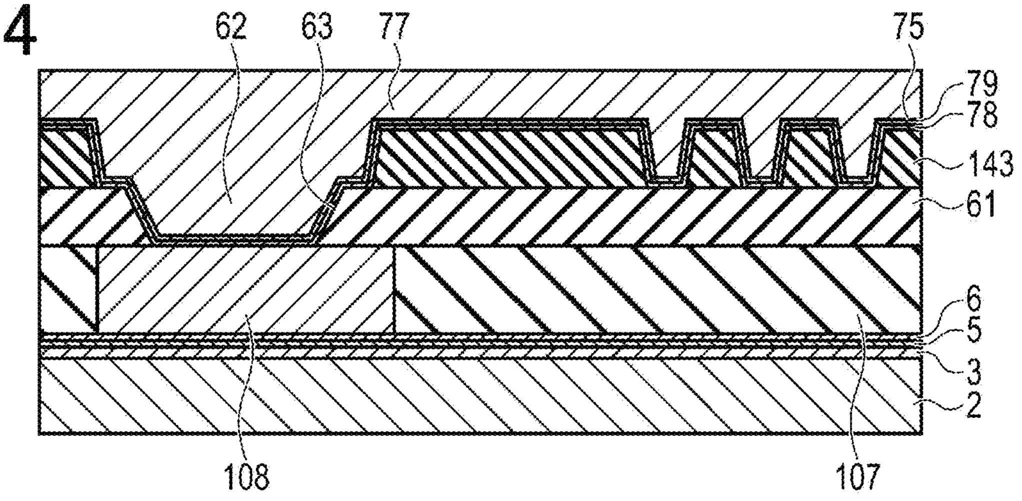
FIG. 14 is a cross-sectional view schematically illustrating still another step in the method of producing a multilayer wiring board according to the first embodiment of the present invention.

Next, as shown in FIG. 14, a conductor layer 77 is formed on the seed layer 79 by electroplating, for example. The electroplating for forming the conductor layer 77 may be, for example, electrolytic copper plating. As shown in FIG. 14, the electroplating is performed so that the via hole 63, the through hole 145 and the groove 144 are completely filled with the conductor layer 77.

Figure 15:
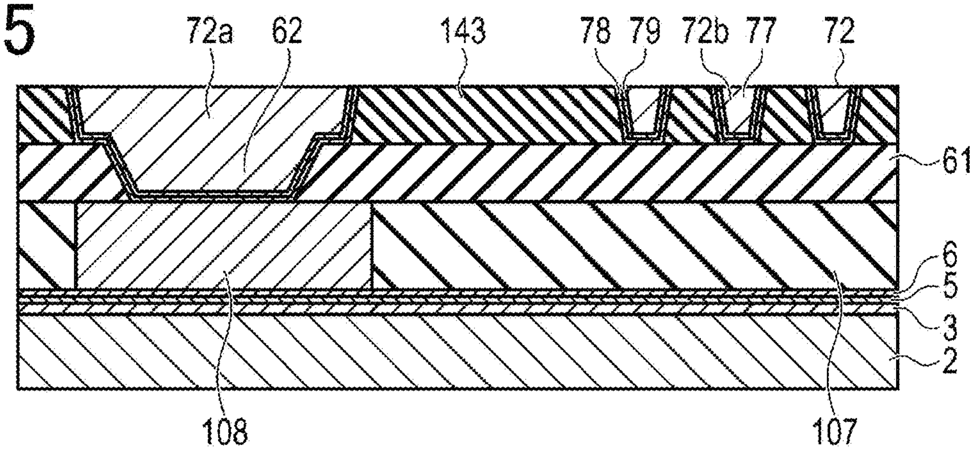
FIG. 15 is a cross-sectional view schematically illustrating still another step in the method of producing a multilayer wiring board according to the first embodiment of the present invention.

Next, as shown in FIG. 15, the conductor layer 77 and the seed layer 79 are subjected to polishing such as physical polishing and chemical mechanical polishing (CMP) to remove portions of the conductor layer 77 and the seed layer 79 located outside the via hole 63, the through hole 145 and the groove 144. Further, the seed adhesion layer 78 is also subjected to similar polishing to remove portions of the seed adhesion layer 78 located outside the via hole 63, the through hole 145 and the groove 144. During this polishing, a portion in the vicinity of the upper surface of the resist layer 143 can also be removed.

By filling the via hole 63, the through hole 145 and the groove 144 as described above, a via portion 62, a land portion 72*a* and a wiring portion 72*b* are obtained. Since this method does not include an etching step, a smooth conductor surface can be obtained compared with a conventional semi-additive method.

Figure 16:
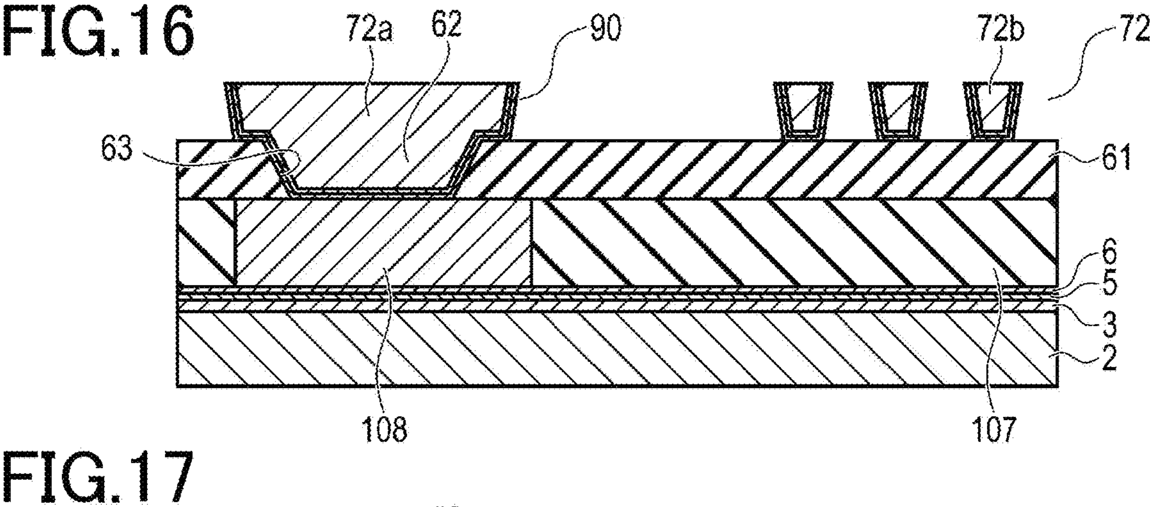
FIG. 16 is a cross-sectional view schematically illustrating still another step in the method of producing a multilayer wiring board according to the first embodiment of the present invention.

Next, as shown in FIG. 16, the resist layer 143 is removed. The resist layer 143 can be removed by dry etching or by immersion in an alkaline solution or solvent.

Figure 17:
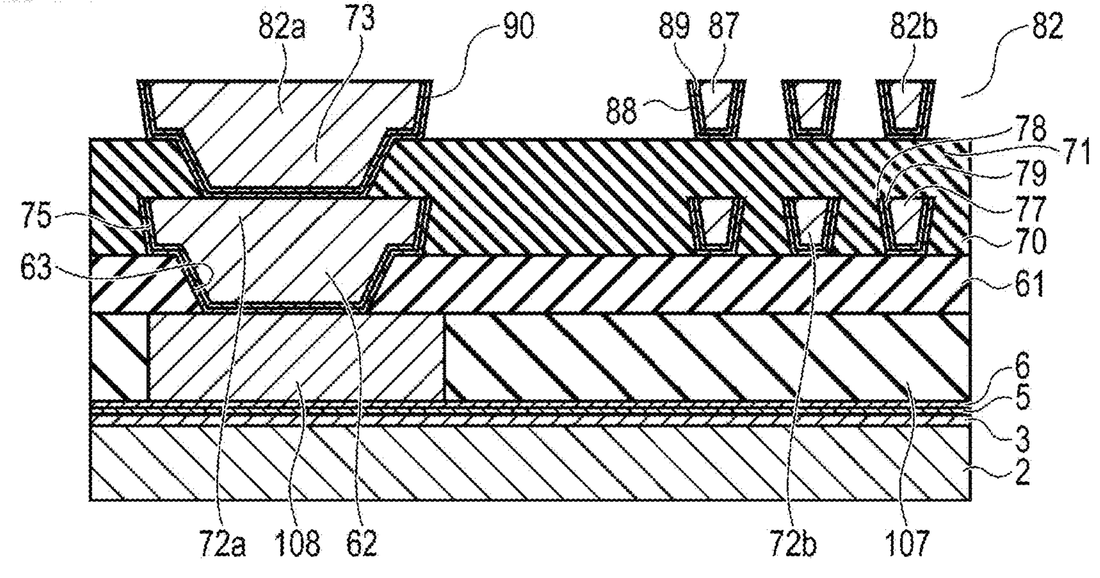
FIG. 17 is a cross-sectional view schematically illustrating still another step in the method of producing a multilayer wiring board according to the first embodiment of the present invention.

Next, as shown in FIG. 17, a first insulating resin layer 71 having a via recess 76 is formed on the insulating resin layer 61, the wiring portion 72*b* and the land portion 72*a* by, for example, the same method as that described above for the insulating resin layer 61.

For example, the insulating resin layer 61, the wiring portion 72*b* and the land portion 72*a* can be spin-coated with a photosensitive epoxy resin material and then subjected to photolithography to obtain the first insulating resin layer 71 having the via recess 76 at one or more positions of the land portion 72*a*. Since the photosensitive resin can be cured at a relatively low temperature, it has little shrinkage due to curing after formation. Therefore, it is advantageous for subsequent fine pattern formation.

The first insulating resin layer 71 can also be formed of a non-photosensitive resin such as a non-photosensitive polyimide-based insulating resin. For example, the insulating resin layer 61, the wiring portion 72*b* and the land portion 72*a* can be spin-coated with a non-photosensitive resin, and then the resin layer can be irradiated with laser light to obtain a first insulating resin layer 71 having the via recess 76 at one or more positions of the land portion 72*a*. The non-photosensitive resin such as polyimide is excellent in insulating properties and mechanical properties, and can achieve high heat resistance.

Thus, the first layer 70 including the first insulating resin layer 71, the conductor layer 77, and the seed adhesion layer 78 and the seed layer 79 is obtained.

Figure 18:
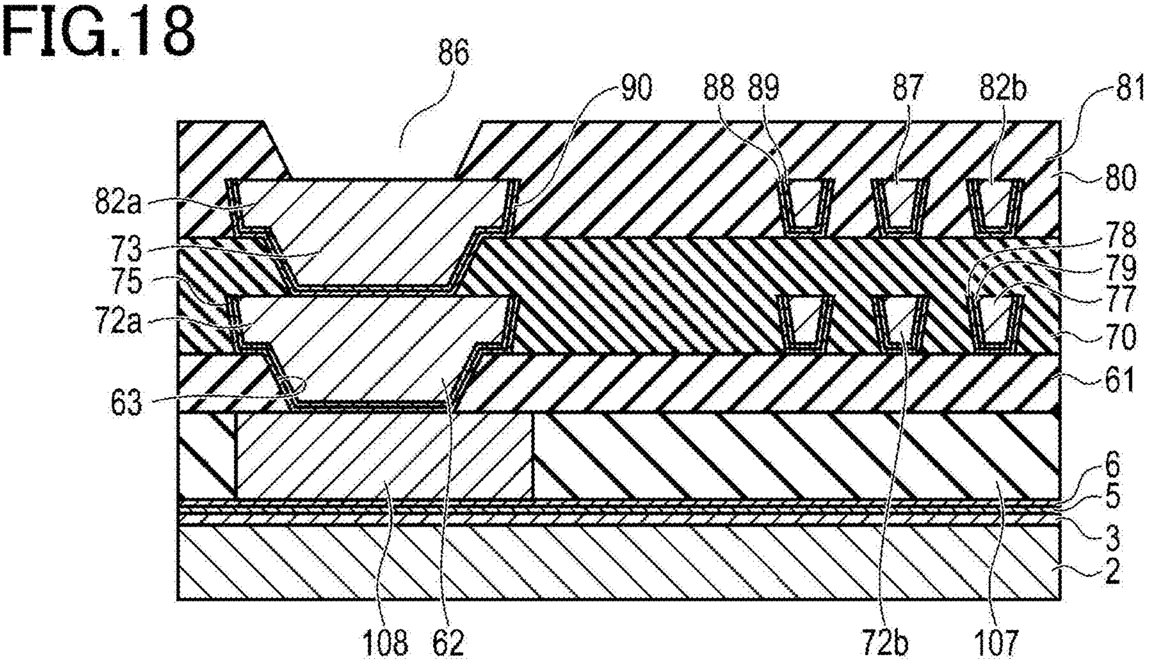
FIG. 18 is a cross-sectional view schematically illustrating still another step in the method of producing a multilayer wiring board according to the first embodiment of the present invention.

Next, as shown in FIG. 18, a seed adhesion layer 88, a seed layer 89, a conductor layer 87 including a land portion 82*a*, a wiring portion 82*b* and a via portion 73, and a second insulating resin layer 81 are formed by sequentially performing the same steps as those described above with reference to FIGS. 11 to 17. The second insulating resin layer 81 is formed of a photosensitive resin material. The second insulating resin layer 81 may be formed of, for example, the same material as the insulating resin layer 61 and the first insulating resin layer 71.

Thus, the second layer 80 including the second insulating resin layer 81, the conductor layer 87, and the seed adhesion layer 88 and the seed layer 89 is obtained.

In addition, during the period from the completion of the structure shown in FIG. 16 to the formation of the first insulating resin layer 71, the surface of the insulating resin layer 61 may be etched by plasma treatment, dry etching, or the like. Further, during the period from the completion of the structure shown in FIG. 17 to the formation of the second insulating resin layer 81, the surface of the first insulating resin layer 71 may be subjected to the same treatment as that described above. This can increase the contact area between the insulating resin layer 61 and the first insulating resin layer 71 and the contact area between the first insulating resin layer 71 and the second insulating resin layer 81, improving the adhesion at the resin/resin interface.

Figure 19:
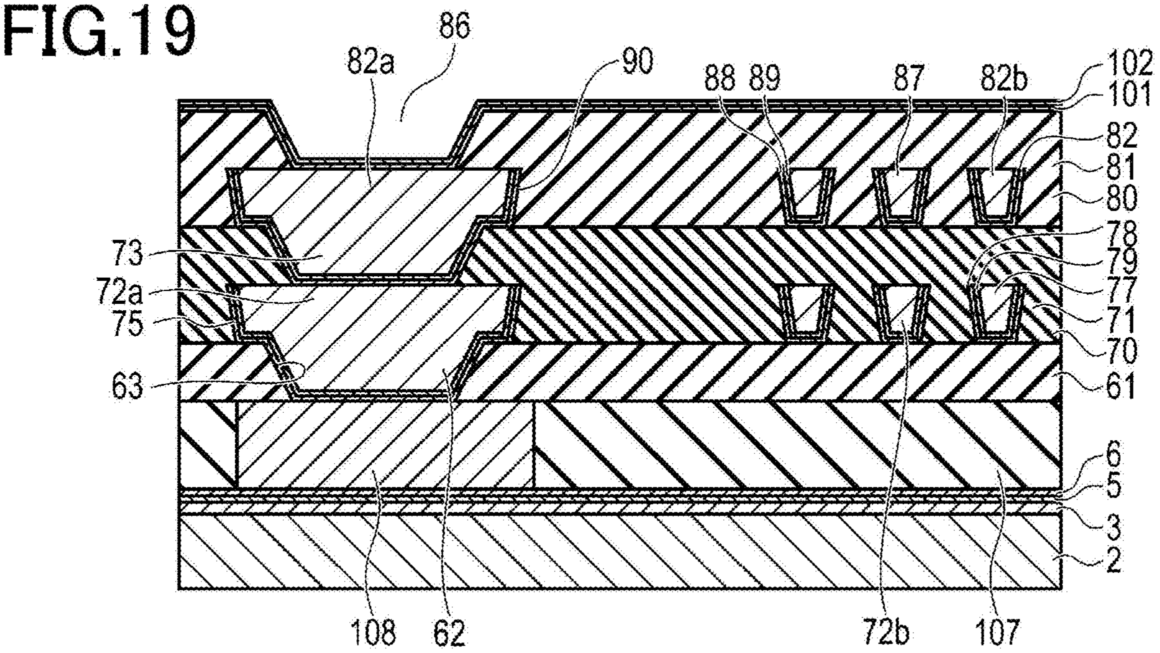
FIG. 19 is a cross-sectional view schematically illustrating still another step in the method of producing a multilayer wiring board according to the first embodiment of the present invention.

Next, as shown in FIG. 19, a seed adhesion layer 101 and a seed layer 102 are sequentially formed on the second insulating resin layer 81 and the land portion 82*a* by, for example, the same method as that described above for the seed adhesion layer 78 and the seed layer 79.

Figure 20:
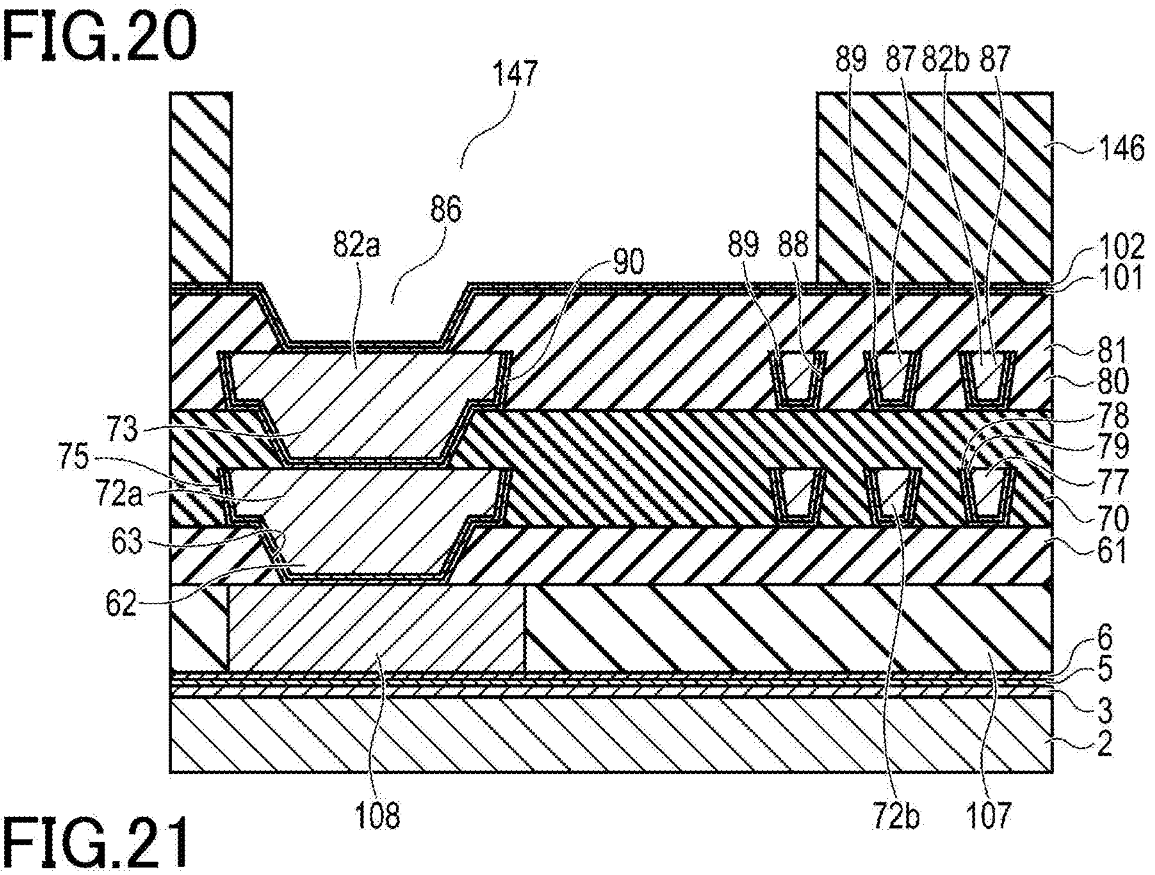
FIG. 20 is a cross-sectional view schematically illustrating still another step in the method of producing a multilayer wiring board according to the first embodiment of the present invention.

Next, as shown in FIG. 20, a resist layer 146 having a through hole 147 is formed on the seed layer 102 by, for example, the same method as that described above for the insulating resin layer 107.

Figure 21:
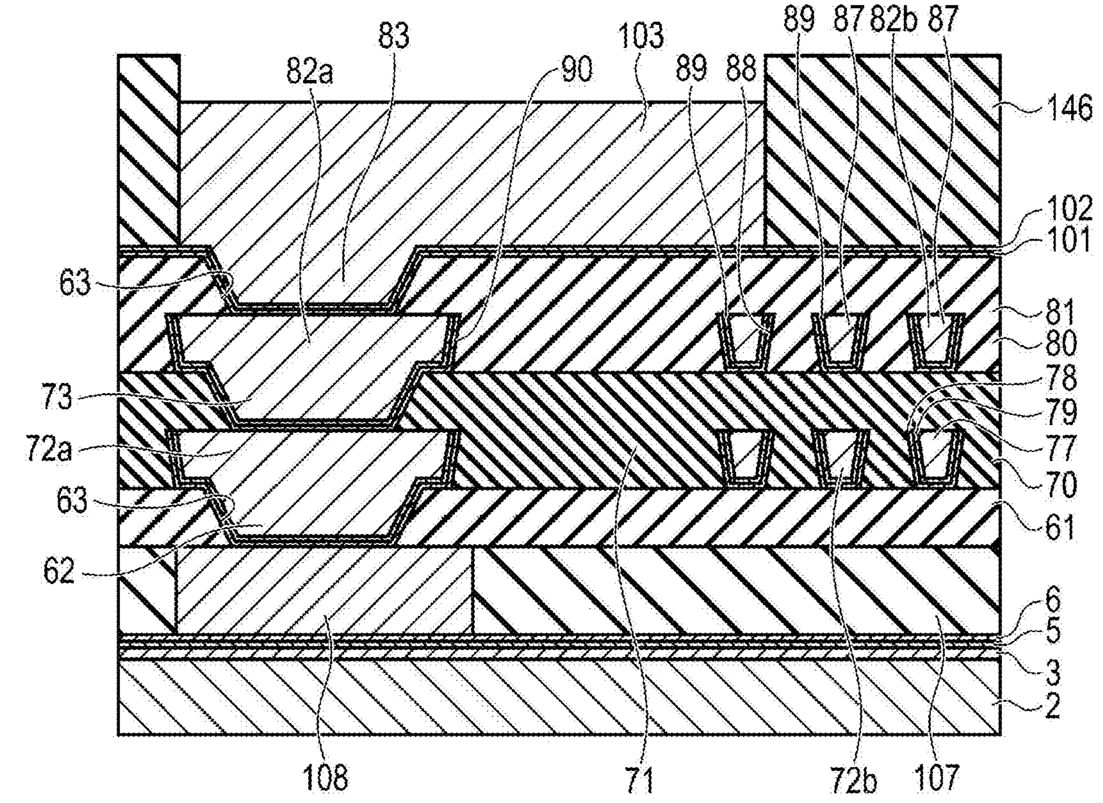
FIG. 21 is a cross-sectional view schematically illustrating still another step in the method of producing a multilayer wiring board according to the first embodiment of the present invention.

Next, as shown in FIG. 21, a conductor layer 103 is formed on the seed layer 102. The conductor layer 103 is desirably formed by electrolytic copper plating.

Figure 22:
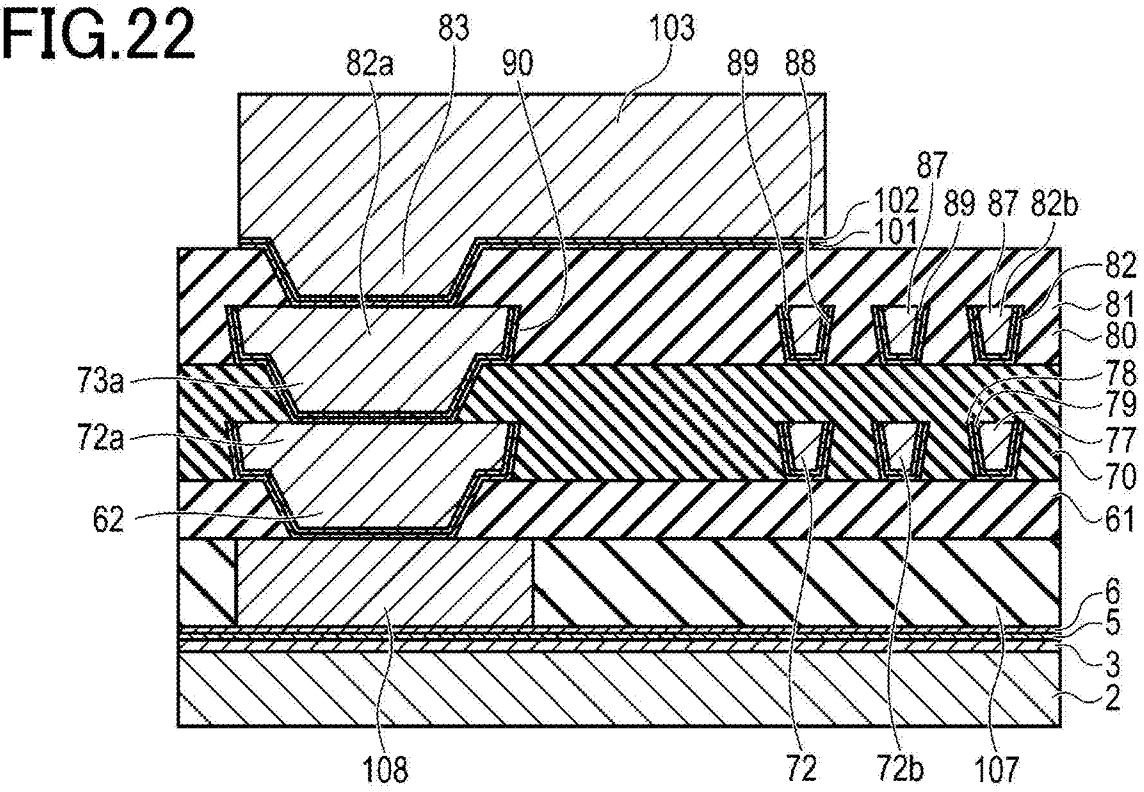
FIG. 22 is a cross-sectional view schematically illustrating still another step in the method of producing a multilayer wiring board according to the first embodiment of the present invention.

Next, as shown in FIG. 22, the resist layer 146 is removed. Next, the exposed portion of the seed adhesion layer 101 is removed, and then the exposed portion of the seed layer 102 is removed. The resist layer 146 may be removed by, for example, a solution or a solvent. The seed adhesion layer 101 and the seed layer 102 can be removed by, for example, immersion in a chemical solution. The chemical solution for removing the seed adhesion layer 101 may be, for example, an alkaline etchant. The chemical solution for removing the seed layer 102 may be, for example, an acid etchant.

Figure 23:
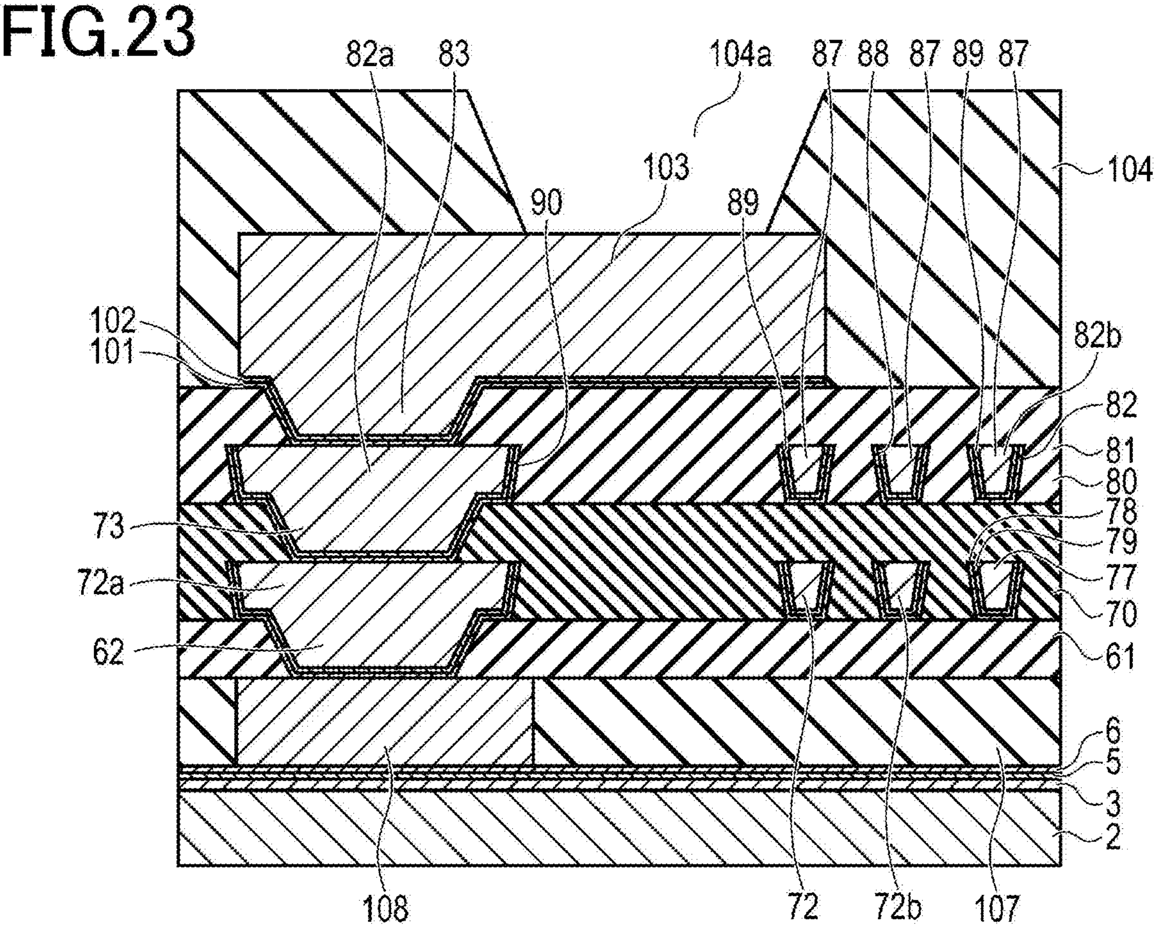
FIG. 23 is a cross-sectional view schematically illustrating still another step in the method of producing a multilayer wiring board according to the first embodiment of the present invention.

Next, as shown in FIG. 23, a solder resist layer 104 is provided on the second insulating resin layer 81 and the conductor layer 103. Next, a through hole 104*a* is formed in the solder resist layer 104. As the material of the solder resist layer 104, for example, an insulating resin such as an epoxy resin or an acrylic resin can be used. In the embodiment of the present invention, a filler-containing photosensitive epoxy resin is used as the solder resist layer 104.

Figure 24:
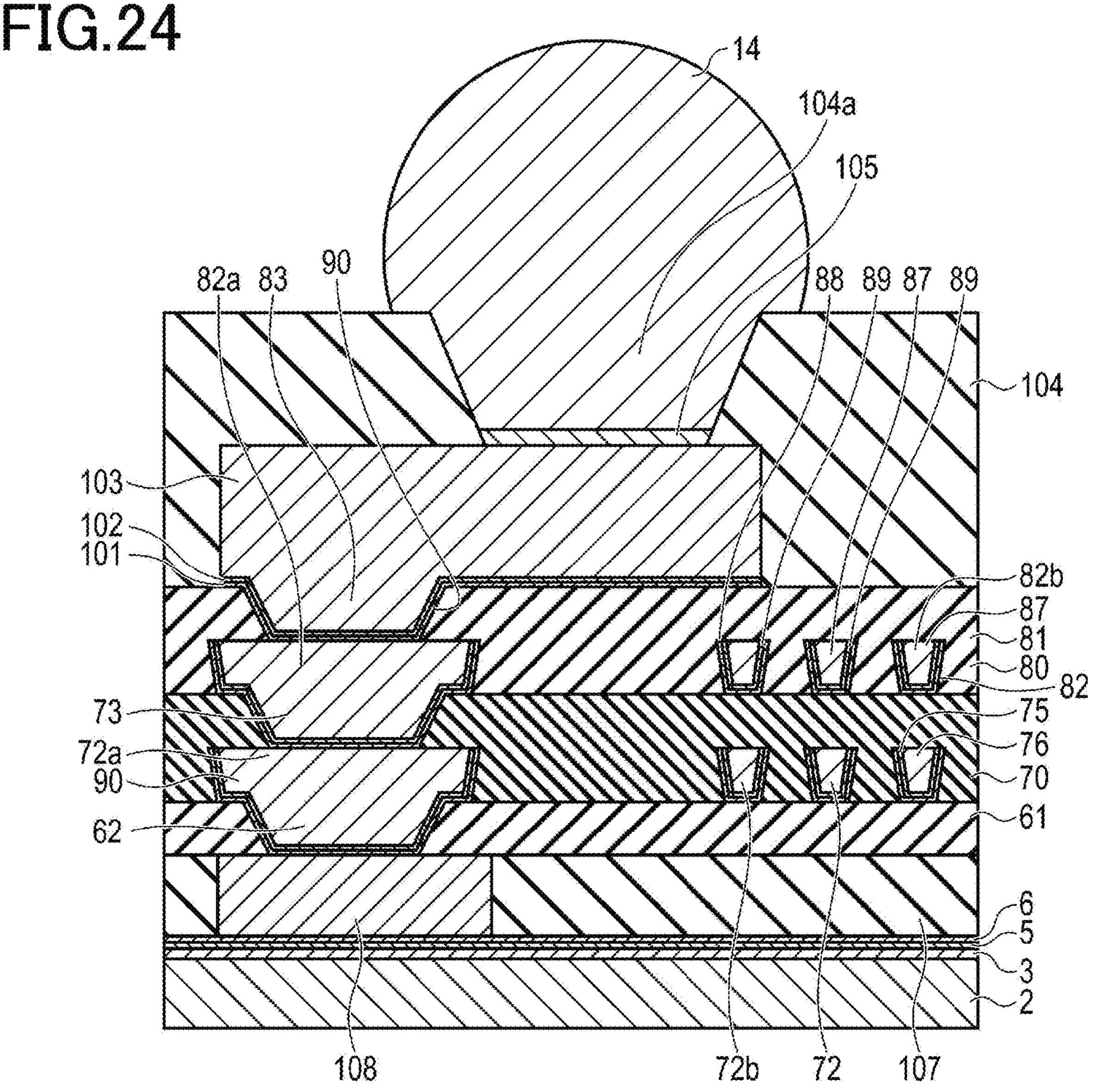
FIG. 24 is a cross-sectional view schematically illustrating still another step in the method of producing a multilayer wiring board according to the first embodiment of the present invention.

Next, as shown in FIG. 24, a surface treatment layer 105 is formed on a portion of the conductor layer 103 exposed through the through hole 104*a* of the solder resist layer 104. In the example of the present embodiment, the surface treatment layer 105 is formed by electroless Ni/Pd/Au plating. As the surface treatment layer 105, an organic solderability preservative (OSP) film, that is, a surface treatment layer using water-soluble pre-flux may be formed. Alternatively, an electroless tin plating or electroless Ni/Au plating layer may also be formed as the surface treatment layer 105. Thus, a multilayer wiring board 12 supported by the support 2, that is, a multilayer wiring board with a support, is completed.

Next, after a solder material is mounted on the surface treatment layer 105, the solder material is melted and cooled for fixation to thereby obtain a second bonding electrode 14.

Figure 25:
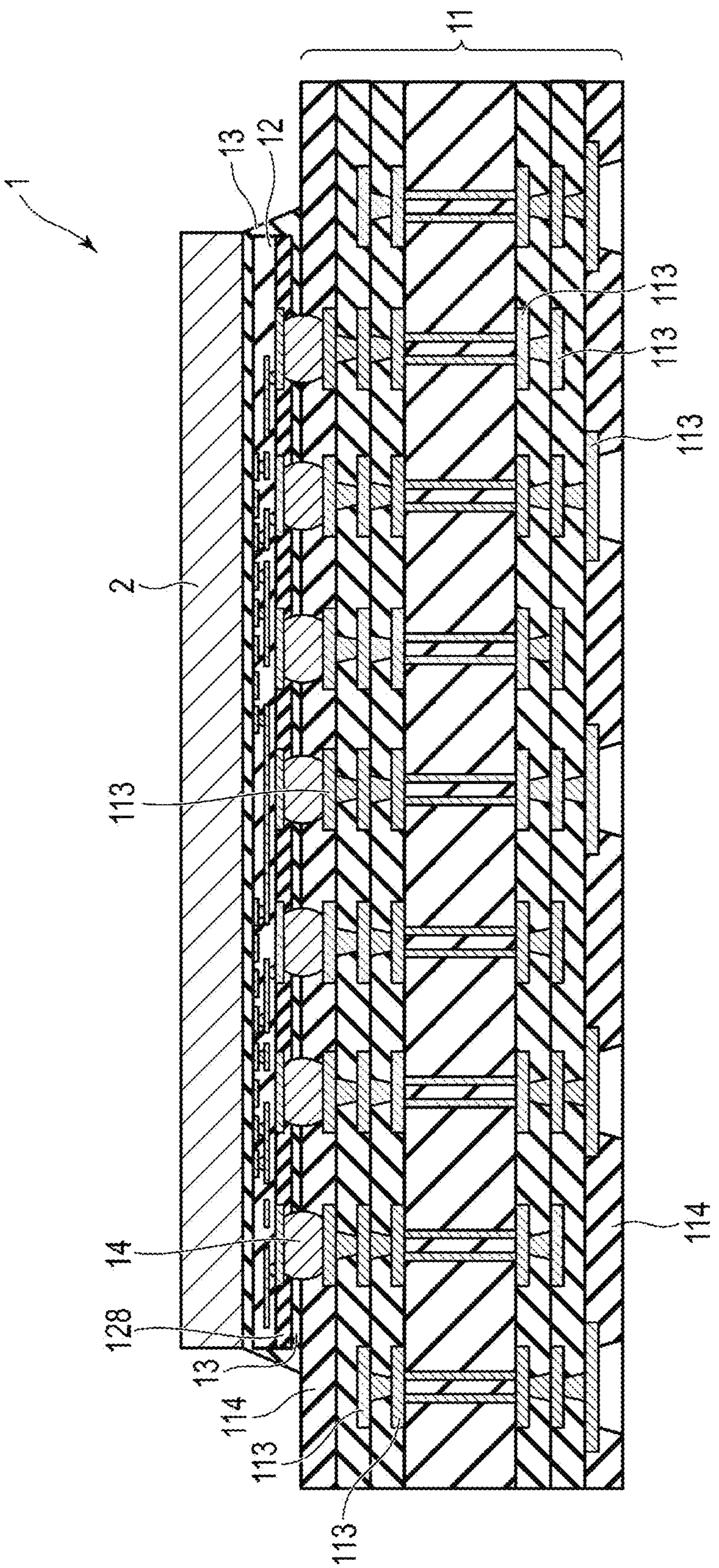
FIG. 25 is a cross-sectional view schematically illustrating one step in the method of producing a packaged device according to the first embodiment of the present invention.

Next, as shown in FIG. 25, after the multilayer wiring board 12 on the support 2 is bonded to an FC-BGA substrate 11, a second underfill layer 13 is formed therebetween. Examples of the material of the second underfill layer 13 include one of an epoxy resin, urethane resin, silicone resin, polyester resin, oxetane resin and maleimide resin, or a mixture of two or more thereof with a filler such as silica, titanium, aluminum oxide, magnesium oxide, zinc oxide, or the like added thereto. The second underfill layer 13 is formed by filling a liquid resin.

Figure 26:
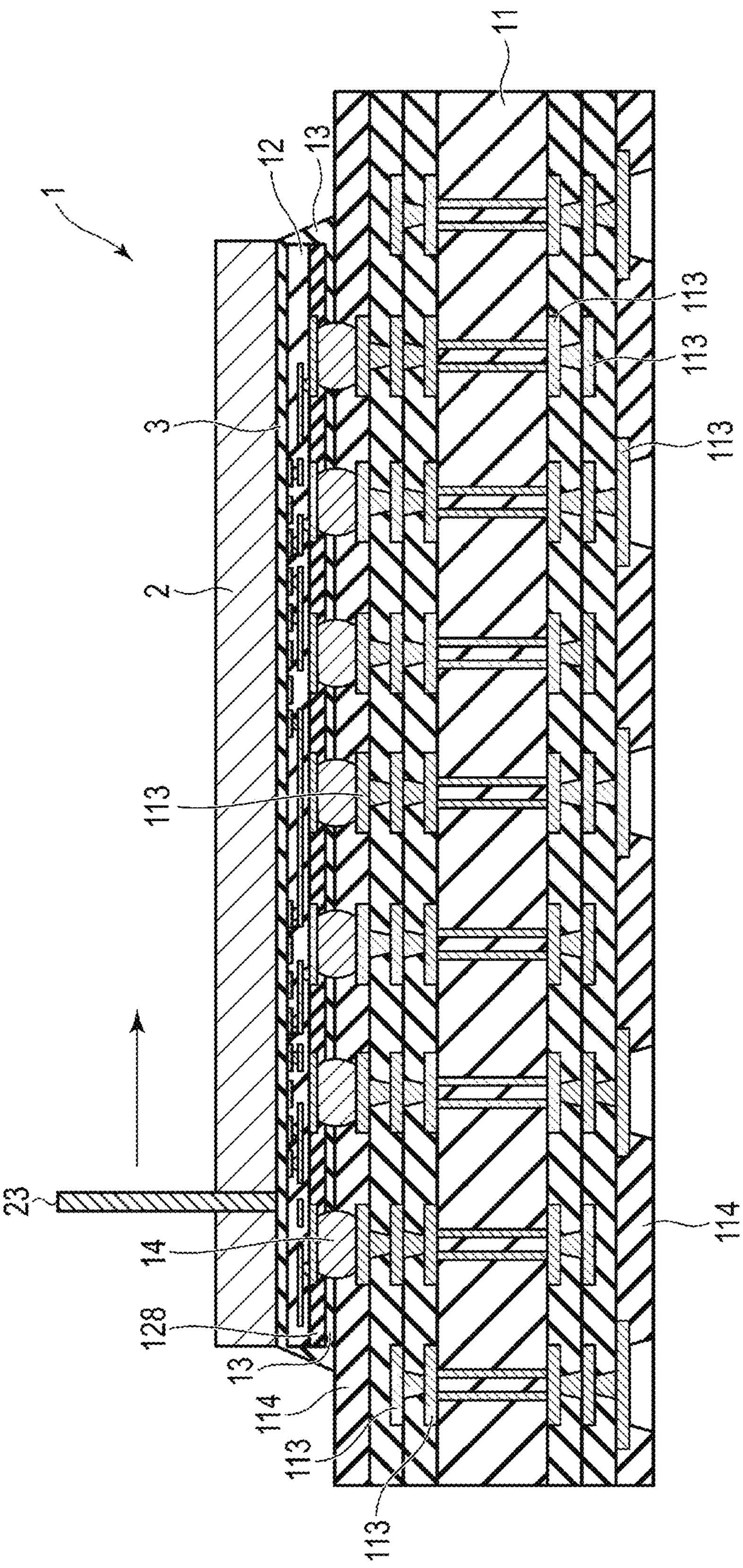
FIG. 26 is a cross-sectional view schematically illustrating another step in the method of producing a packaged device according to the first embodiment of the present invention.
Figure 27:
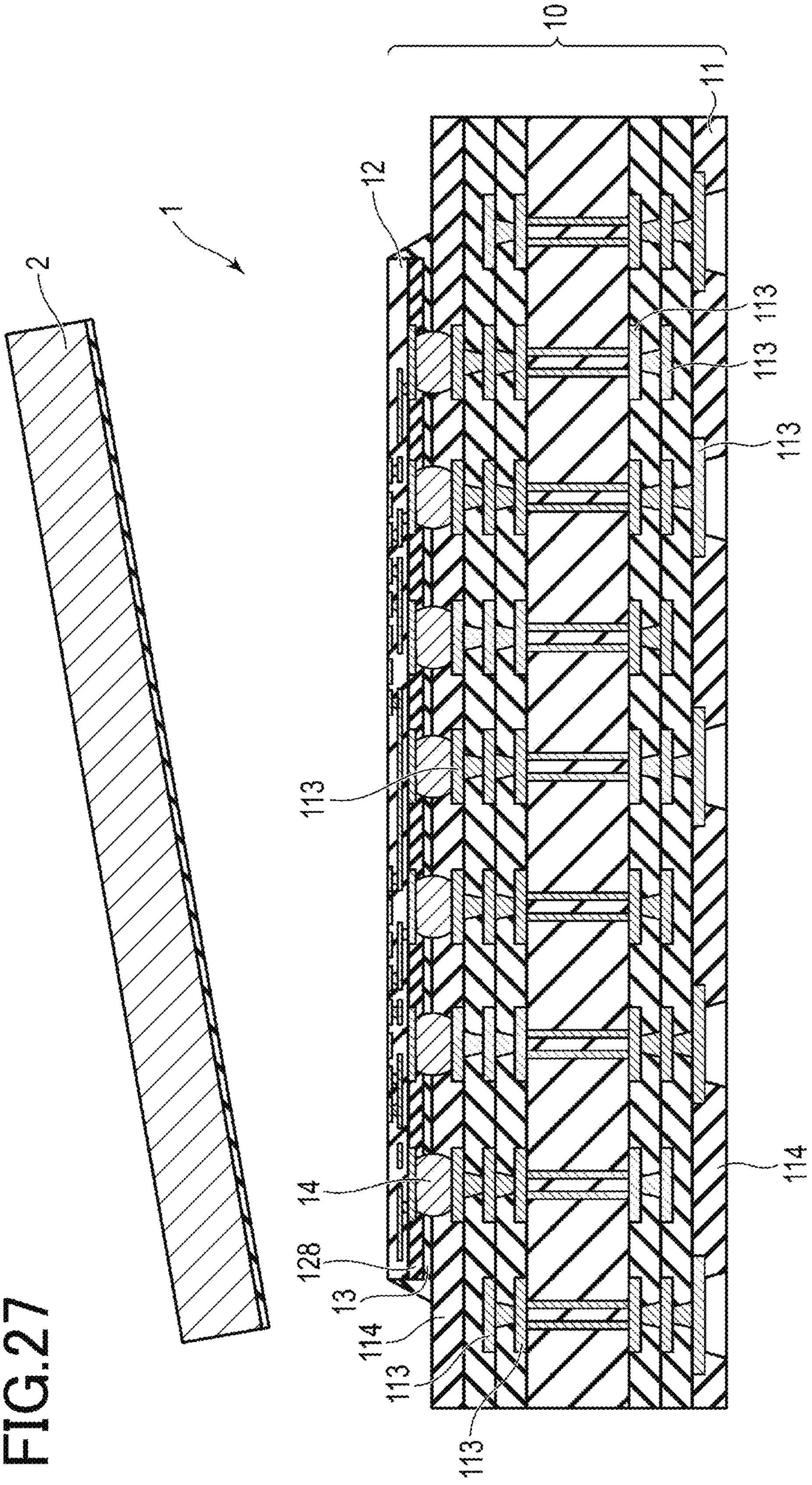
FIG. 27 is a cross-sectional view schematically illustrating still another step in the method of producing a packaged device according to the first embodiment of the present invention.

Next, as shown in FIGS. 26 and 27, the support 2 is removed. An example of the removal is peeling. For example, as shown in FIG. 26, the release layer 3 formed at the interface with the support 2 is irradiated with a laser beam 23 through a rear surface of the support 2, that is, a surface of the support 2 on a side opposite to that facing the FC-BGA substrate 11. By being irradiated with the laser beam 23, the support 2 can be removed from the multilayer wiring board 12 as shown in FIG. 27.

Next, the release layer 3, the seed adhesion layer 5 and the seed layer 6 are sequentially removed to obtain the multilayer wiring board 12.

Next, a functional device 20 is mounted to complete the packaged device 1 as shown in FIG. 1. Prior to mounting of the functional device 20, the conductor layer exposed on the surface may be subjected to a surface treatment such as electroless Ni/Pd/Au plating, OSP, electroless tin plating, electroless Ni/Au plating, or the like in order to prevent oxidation and improve wettability of solder bumps.

Next, these bonding portions are sealed with a first underfill layer 30.

As a material of the first underfill layer 30, for example, the materials exemplified as the materials of the second underfill layer 13 can be used. The first underfill layer 30 can be formed by, for example, the same method as that described above for the second underfill layer 13.

Thus, the packaged device 1 shown in FIG. 1 is completed.

In the method described above, the functional device 20 is bonded to the multilayer wiring board 12 after the multilayer wiring board 12 is bonded to the FC-BGA substrate 11. Alternatively, the multilayer wiring board 12 may be bonded to the FC-BGA substrate 11 after the functional device 20 is bonded to the multilayer wiring board 12.

In the method of producing the packaged device 1 configured as described above, the resist layer 143 is used as a mold for forming the land portion 72*a* and the wiring portion 72*b* when forming the first layer 70. The resist layer 143 is a dummy layer to be removed after the conductor layer 77 is formed and polished. Further, in this method, a similar resist layer is formed when forming the second layer and used as a mold for forming the land portion 82*a* and the wiring portion 82*b*. This resist layer is also a dummy layer to be removed after the conductor layer 87 is formed and polished. In this method, instead of using these dummy layers as components of the multilayer wiring board 12, the first insulating resin layer 71 and the second insulating resin layer 81 are provided. There is a risk that metal may diffuse into the dummy layers in the steps of forming and polishing the conductor layers 77, 87, and the like. However, since the above-mentioned multilayer wiring board 12 does not include, as components, the dummy layers into which metal may have diffused, it is advantageous in achieving high insulation reliability.

Thus, the multilayer wiring board 12, in which the first insulating resin layer 71 and the second insulating resin layer 81 are integrally formed in the thickness direction, achieves high insulation reliability. Accordingly, the composite wiring board 10 and the packaged device 1 including the multilayer wiring board 12 also achieve high insulation reliability.

Further, each of the first insulating resin layer 71 and the second insulating resin layer 81 is integrally formed in the thickness direction, and does not have any internal interfaces. When the first insulating resin layer 71 and the second insulating resin layer 81 are formed of a plurality of insulating layers laminated together, delamination may occur between the plurality of insulating layers. In the above-mentioned multilayer wiring board 12, each of the first insulating resin layer 71 and the second insulating resin layer 81 is integrally formed in the thickness direction and does not have any internal interfaces, so interlayer delamination is less likely to occur.

Further, in the first layer 70 of the multilayer wiring board 12, the side surfaces and upper surfaces of the land portion 72*a*, the wiring portion 72*b* and the via portion 73 are covered with the seed adhesion layer 78 made of titanium. The seed adhesion layer 78 serves as a barrier layer that prevents diffusion of metal from the conductor layer 77 to the first insulating resin layer 71. The same applied to the second layer 80, and the seed adhesion layer 88 serves as a barrier layer that prevents diffusion of metal from the conductor layer 87 to the second insulating resin layer 81. Accordingly, the composite wiring board 10 and the packaged device 1 including the multilayer wiring board 12 also achieve high insulation reliability.

Further, in the first layer 70, a seed layer 79 which is a metal layer is interposed between the seed adhesion layer 78 and the conductor layer 77. When the seed layer 79 is made of a metal material having a lower ionization tendency than the material of the conductor layer 77, it serves as a barrier layer that prevents diffusion of metal from the conductor layer 77 to the first insulating resin layer 71. The same applies to the second layer 80, and when the seed layer 89 is made of a metal material having a lower ionization tendency than the material of the conductor layer 87, it serves as a barrier layer that prevents diffusion of metal from the conductor layer 87 to the second insulating resin layer 81. Accordingly, the composite wiring board 10 and the packaged device 1 including the multilayer wiring board 12 also achieve high insulation reliability.

Next, effects of the above-mentioned multilayer wiring board 12 and the method of producing the multilayer wiring board 12 will be described with reference to FIG. 28 which shows a comparative example.

In the example of the present embodiment, as shown in FIG. 2, a gap between the land portion 72*a* and the wiring portion 72*b* in the first wiring layer 72 is filled with the first insulating resin layer 71, and the side surface of the conductor layer 77 of the first wiring layer 72 is in contact with the first insulating resin layer 71 via the seed adhesion layer 78. As described above, by using titanium as the material of the seed adhesion layer 78, it is possible to prevent diffusion of copper from the conductor layer 77 to the first insulating resin layer 71, improving the insulation reliability between the wiring portions 72*b*.

Although the above description has been given of the effects of the first layer 70, the same effects can be obtained in the second layer 80.

Further, the side surfaces of the land portions 72*a* and 82*a* of the interlayer connection conductor layer 90 are in contact with the insulating resin layers 71 and 81 via the seed adhesion layers 78 and 88, respectively. By using titanium, which has good adhesion to the first insulating resin layer 71, for the seed adhesion layers 78 and 88, it is possible to prevent delamination of the interlayer connection conductor layer 90 from the insulating resin layers 71 and 81 due to a difference in coefficient of linear thermal expansion between copper and resin during a temperature cycle test.

Figure 28:
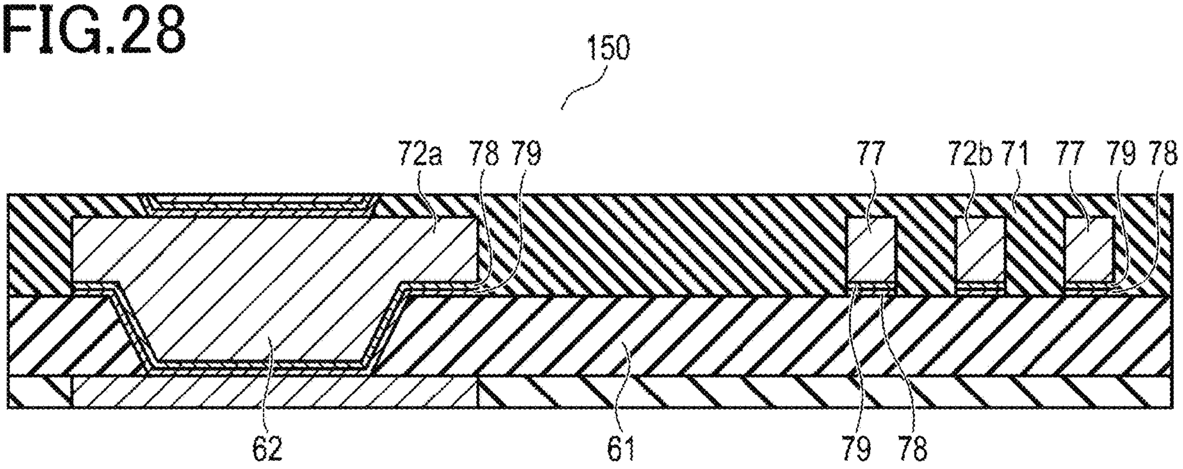
FIG. 28 is a cross-sectional view schematically illustrating a multilayer wiring board according to a comparative example.

As shown in FIG. 28, a comparative example is a multilayer wiring board 150 in which an inner conductor layer and an interlayer connection conductor layer are produced by a semi-additive method which is a known technique. The multilayer wiring board 150 has the same configuration as that of the multilayer wiring board 12 of the present embodiment, but is different in the following points. FIG. 28 is a cross-sectional view illustrating the first layer 70 of the multilayer wiring board 150 and the vicinity thereof.

As shown in FIG. 28, the multilayer wiring board 150 of the comparative example is different from the multilayer wiring board 12 of the present embodiment in that the seed adhesion layer 78 and the seed layer 79 of the first wiring layer 72 do not cover the side surface of the conductor layer 77. Although not shown in the figure, the multilayer wiring board 150 of the comparative example is different from the multilayer wiring board 12 in that the seed adhesion layer 88 and the seed layer 89 of the second wiring layer 82 do not cover the side surface of the conductor layer 87. Other configurations are the same as those of the multilayer wiring board 12.

As a description of the multilayer wiring board 150 of the comparative example, the first layer 70 will be described. As shown in FIG. 28, in the multilayer wiring board 150 of the comparative example, the side surface of the conductor layer 77 of the first wiring layer 72 is in contact with the first insulating resin layer 71. That is, the contact area of the first insulating resin layer 71 to the conductor layer 77 is larger than that in the multilayer wiring board 12 of the present embodiment. Therefore, the copper of the conductor layer 77 is likely to diffuse into the first insulating resin layer 71. As a result, the insulation reliability of the first insulating resin layer 71 is likely to decrease. The second layer 80 in the multilayer wiring board 150 of the comparative example is the same as the first layer 70, that is, the insulation reliability of the second insulating resin layer 81 of the second layer 80 is likely to decrease.

Further, the side surfaces of the land portions 72*a* and 82*a* of the interlayer connection conductor layer 90 are in contact with the insulating resin layers 71 and 81, respectively. Therefore, delamination is likely to occur at the interfaces between the land portions 72*a* and 82*a* and the insulating resin layers 71 and 81 due to a difference in coefficient of linear thermal expansion between copper and resin during a temperature cycle test.

In order to verify the effects of the present embodiment, the multilayer wiring board 12 prepared in the example of the present embodiment and the multilayer wiring board 150 prepared in the comparative example were mounted on the FC-BGA substrate 11, and the following evaluation was performed.

<Evaluation Methods>

<Evaluation 1> Evaluation of Insulation Reliability

Bias: Applied for 192 hours under the environment of 3.3V, 130° C./85% RH. The wiring rule was L/S=2/2 μm. During the test, a resistance value of $10^6\Omega$ or more was judged as a pass.

<Evaluation 2> Evaluation of Adhesion between Interlayer Connection Conductor Layer and Resin Layer An environmental test was performed under the conditions of 1,000 cycles from −55° C. to 125° C. After the environmental test, the presence or absence of delamination at the interface between the interlayer connection conductor layer and the resin was checked by cross-sectional observation.

<Evaluation Results>

<Evaluation 1> Evaluation of Insulation Reliability

In the multilayer wiring board 150 prepared in the comparative example, insulation failure was found after 96 hours. On the other hand, in the multilayer wiring board 12 prepared in the example, a resistance value was $10^6\Omega$ or more even after 192 hours, exhibiting good insulation reliability.

<Evaluation 2> Evaluation of Adhesion between Interlayer Connection Conductor Layer and Resin Layer In the wiring board prepared in the comparative example, delamination was found at the interface between the interlayer connection conductor layer and the resin after 1,000 cycles. On the other hand, in the multilayer wiring board 12 prepared in the example, no delamination was found at the interface between the interlayer connection conductor layer and the resin.

The above embodiment is merely an example, and specific details of the structure can be modified as appropriate.

The present invention can be applied to semiconductor devices having a wiring substrate including an interposer or the like interposed between a main substrate and an IC chip.

In the above example, an example of the configuration of the multilayer wiring board 12 has been described in which the wiring layers 72 and 82 of the layers 70 and 80 include the seed adhesion layers 78 and 88 and the seed layers 79 and 89 as layers that cover the side surfaces of the conductor layers 77 and 87, but the configuration is not limited thereto.

In other examples, the layers 70 and 80 may have a configuration including no seed adhesion layers 78 and 88 and no seed layers 79 and 89, or the layers 70 and 80 may have a configuration including the seed adhesion layers 78 and 88 but no seed layers 79 and 89.

In the above example, the multilayer wiring board 12 includes the first layer 70 and the second layer 80, but the multilayer wiring board 12 may further include one or more layers which are similar to the first layer 70 and the second layer 80.

<2> Second Embodiment

A packaged device, a composite wiring board and a multilayer wiring board according to a second embodiment are the same as the packaged device, the composite wiring board and the multilayer wiring board according to the first embodiment, respectively, except that the multilayer wiring board has the following configuration.

Figure 29:
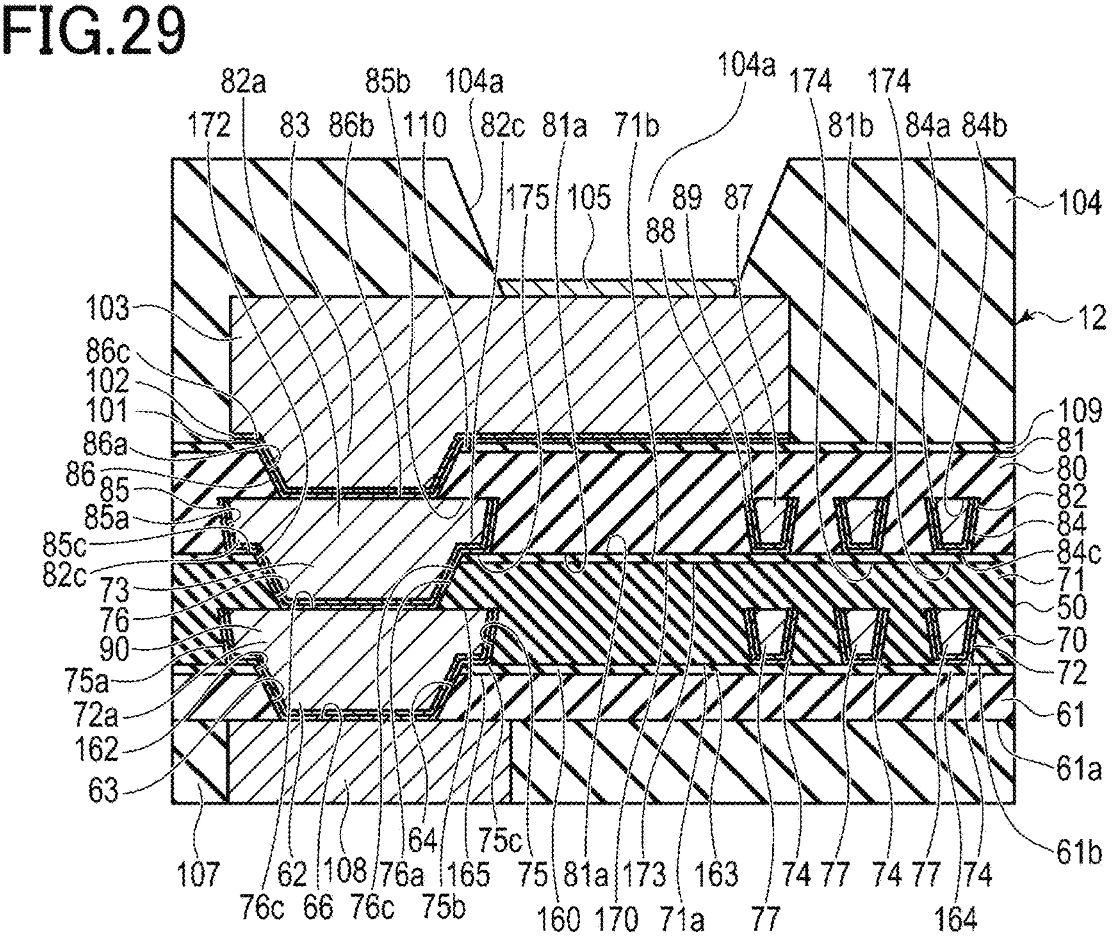
FIG. 29 is a cross-sectional view schematically illustrating a part of a multilayer wiring board used in a packaged device according to a second embodiment of the present invention.
Figure 30:
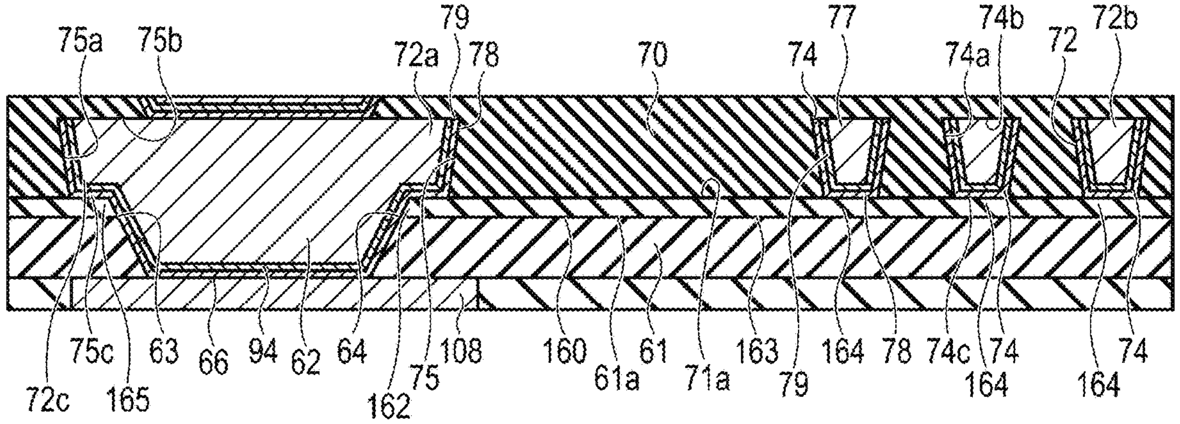
FIG. 30 is an enlarged cross-sectional view schematically illustrating a part of the multilayer wiring board shown in FIG. 29.

FIG. 29 is a cross-sectional view schematically illustrating a part of a multilayer wiring board according to the second embodiment. FIG. 30 is an enlarged cross-sectional view schematically illustrating a part of the multilayer wiring board shown in FIG. 29. Specifically, FIG. 30 illustrates a part of the first layer 70, a part of the second layer 80, and the vicinity thereof.

The multilayer wiring board 12 according to the second embodiment is the same as the multilayer wiring board 12 according to the first embodiment except that each of the layers 50 further includes an inorganic insulating layer. Specifically, the multilayer wiring board 12 according to the second embodiment is the same as the multilayer wiring board 12 according to the first embodiment except that the first layer 70 further includes a first inorganic insulating layer 160 and the second layer 80 further includes a second inorganic insulating layer 170.

The first inorganic insulating layer 160 includes a portion 163 covering the first surface 71*a*, a portion 164 closing the aperture 74*c* of the groove section 74, and a portion 165 covering a peripheral portion 72*c* of the land portion 72*a* of the first wiring layer 72 on the first surface 71*a* side, which will be described later. The first inorganic insulating layer 160 has a through hole 162 at a position of the via hole 63 formed in the insulating resin layer 61.

The second inorganic insulating layer 170 includes a portion 173 covering the first surface 81*a*, a portion 174 closing the aperture 84*c* of the groove section 84, and a portion 175 covering a peripheral portion 82*c* of the land portion 82*a* on the first surface 81*a* side. The second inorganic insulating layer 170 has a through hole 172 at a position of the aperture 76*c* of the via recess 76.

Next, an example method of producing the multilayer wiring board 12 will be described. FIGS. 31 to 39 are cross-sectional views schematically illustrating an example method of producing the multilayer wiring board 12.

In this method, first, a structure shown in FIG. 10 is obtained by the same method as that described with reference to FIGS. 4 to 10 in the first embodiment.

Figure 31:
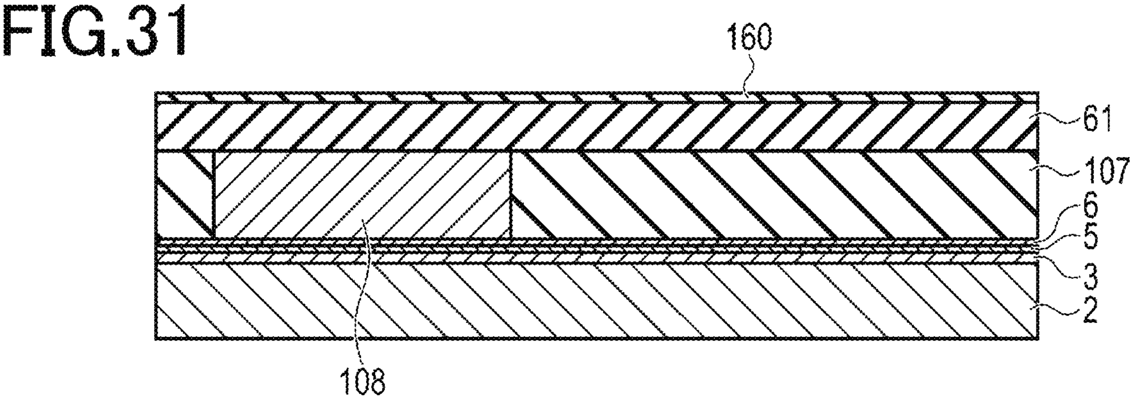
FIG. 31 is a cross-sectional view schematically illustrating one step in the method of producing a multilayer wiring board according to the second embodiment of the present invention.

Next, as shown in FIG. 31, an insulating resin layer 61 is provided on the conductor layer 108 and the insulating resin layer 107. The insulating resin layer 61 may be formed of, for example, a non-photosensitive resin material.

Examples of the non-photosensitive resin include a polyimide resin, a benzocyclobutene resin, an epoxy resin, and modified products thereof. The non-photosensitive resin such as polyimide is excellent in insulating properties and mechanical properties, and can achieve high heat resistance. Furthermore, inorganic particles such as silica, alumina or zirconia may be added as a filler to the non-photosensitive resin. As an example, a non-photosensitive polyimide resin is used as the non-photosensitive resin.

The non-photosensitive resin may be in a liquid form or a film-like form.

When a non-liquid photosensitive resin is used, the insulating resin layer 61 can be formed by a method selected from, for example, slit coating, curtain coating, die coating, spray coating, electrostatic coating, ink jet coating, gravure coating, screen printing, gravure offset printing, spin coating and doctor coating. For example, the insulating resin layer 61 may be formed by spin coating using a non-photosensitive resin.

When a film-like non-photosensitive resin is provided as the insulating resin layer 61, lamination, vacuum lamination, vacuum pressing, or the like can be applied.

The insulating resin layer 61 may be formed to have a thickness of, for example, 2 m on the conductor layer 108.

In addition, after the insulating resin layer 61 is formed, the surface of the insulating resin layer 61 can be flattened by physical polishing or by physical polishing and polishing such as CMP. Similarly, after the first insulating resin layer 71 and the second insulating resin layer 81 are formed, the surfaces may also be flattened.

The material used for the insulating resin layer 61 is not limited to the non-photosensitive resin. The insulating resin layer 61 may be formed of a photosensitive resin. An insulating resin layer formed of photosensitive resin contains elements such as phosphorus and sulfur derived from an initiator or the like. On the other hand, an insulating resin layer formed of non-photosensitive resin generally does not contain these elements. Therefore, whether the insulating resin layer is formed of a non-photosensitive resin or a photosensitive resin can be determined depending on whether the insulating resin layer contains the above elements.

Next, a first inorganic insulating layer 160 is formed on the insulating resin layer 61. The first inorganic insulating layer 160 may be formed by, for example, plasma chemical vapor deposition (CVD). The material of the first inorganic insulating layer 160 may include, for example, one or more insulators selected from the group consisting of silicon oxide, silicon nitride, silicon oxynitride, fluorine-doped silicon oxide and carbon-doped silicon oxide. The material of the first inorganic insulating layer 160 may be the same or different from the materials of the second inorganic insulating layer 170 and an inorganic insulating layer 109, which will be described later.

Figure 32:
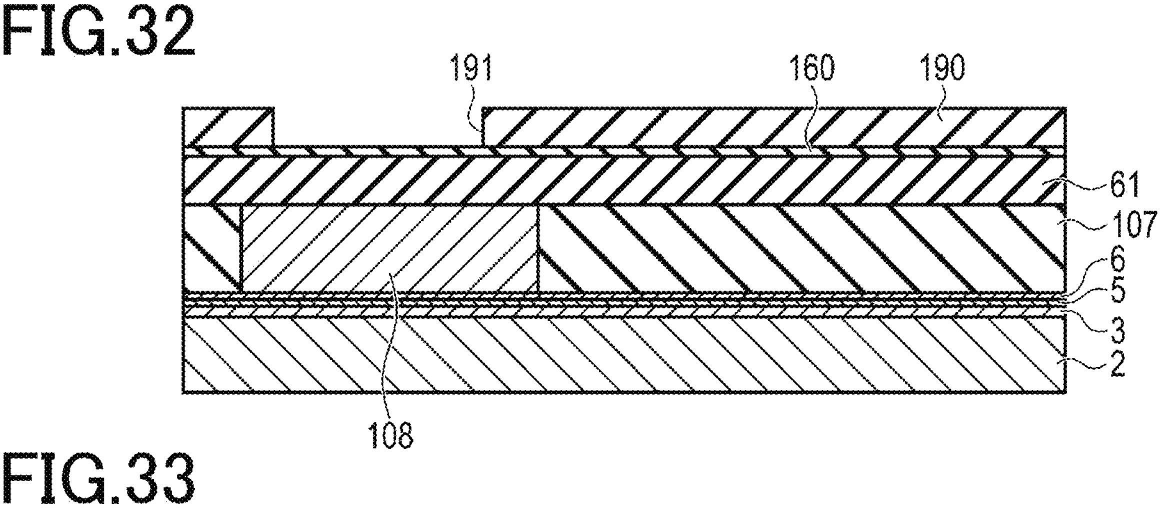
FIG. 32 is a cross-sectional view schematically illustrating another step in the method of producing a multilayer wiring board according to the second embodiment of the present invention.

Next, as shown in FIG. 32, a resist layer 190 having a through hole 191 is provided on the first inorganic insulating layer 160. The resist layer 190 can be provided by, for example, the same method as that for the resist layer 140.

Figure 33:
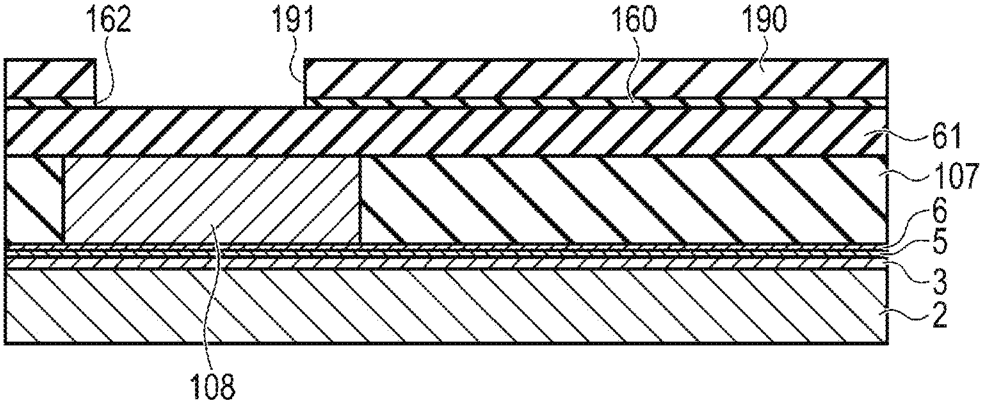
FIG. 33 is a cross-sectional view schematically illustrating still another step in the method of producing a multilayer wiring board according to the second embodiment of the present invention.

Next, as shown in FIG. 33, the first inorganic insulating layer 160 is etched using a resist layer 190 as a mask to form a through hole 162 which is a first through hole at the position of the conductor layer 108. The first inorganic insulating layer 160 can be etched by, for example, dry etching using a fluorocarbon gas.

Figure 34:
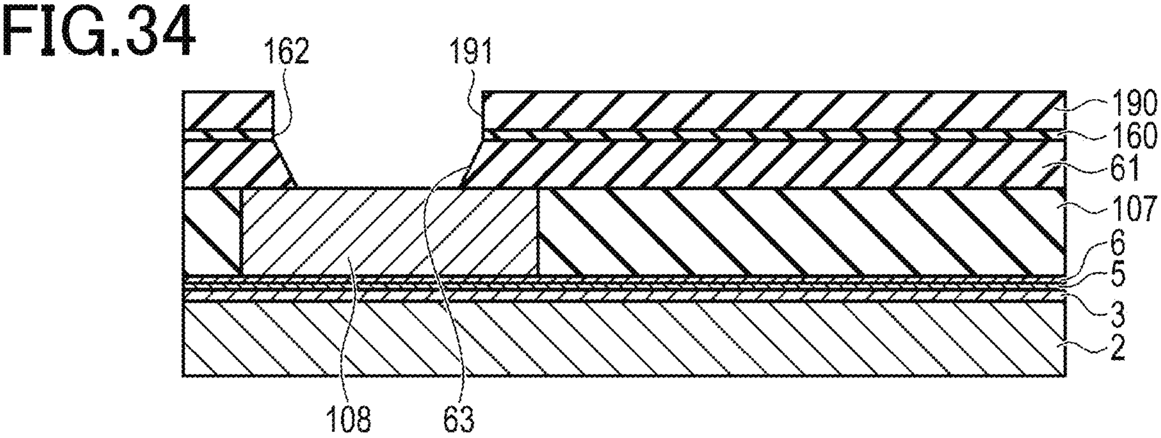
FIG. 34 is a cross-sectional view schematically illustrating still another step in the method of producing a multilayer wiring board according to the second embodiment of the present invention.

Next, as shown in FIG. 34, the insulating resin layer 61 is etched using the first inorganic insulating layer 160 as a mask to form a via hole 63 which is a recess at the position of the through hole 162. The insulating resin layer 61 can be etched by, for example, dry etching using oxygen gas. By forming the via hole 63 in a forward tapered shape, the seed adhesion layer 78 and the seed layer 79 can be easily formed without producing discontinuous portions in the via hole 63.

Figure 35:
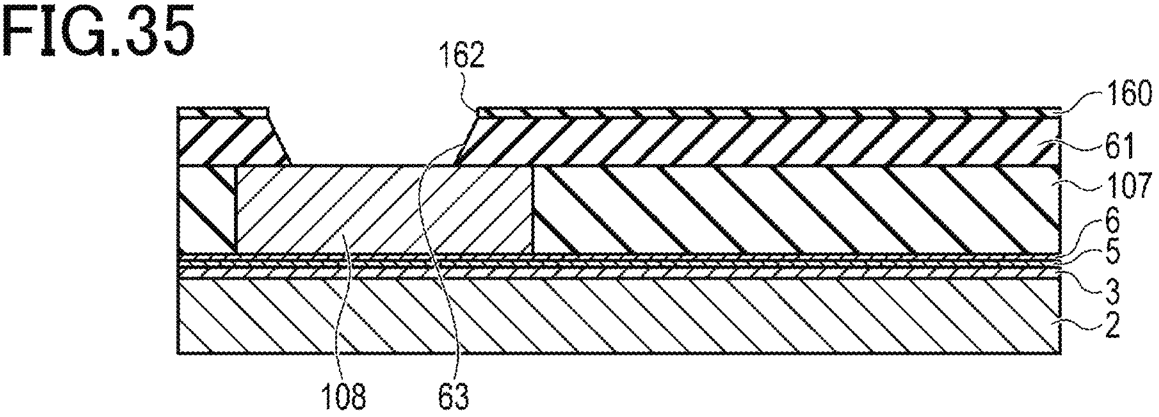
FIG. 35 is a cross-sectional view schematically illustrating still another step in the method of producing a multilayer wiring board according to the second embodiment of the present invention.

As shown in FIG. 34, if the resist layer 190 remains after the via hole 63 is formed, the resist layer 190 is removed as shown in FIG. 35.

Figure 36:
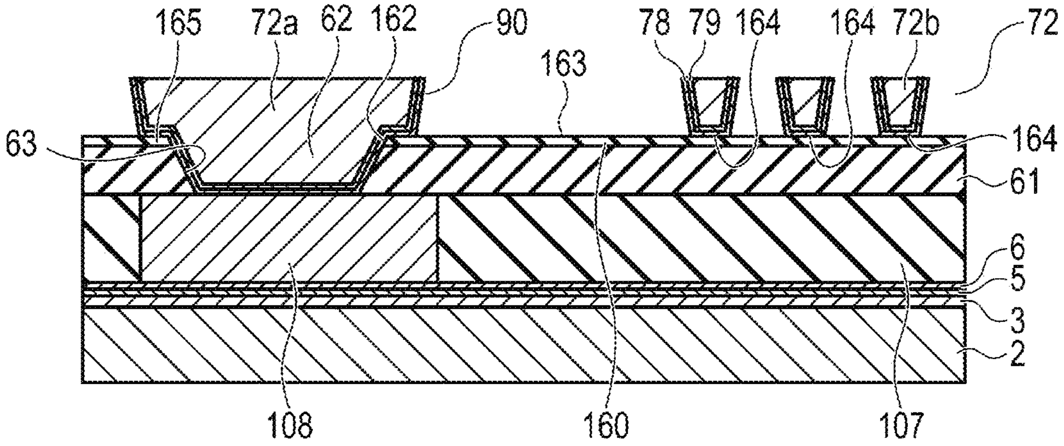
FIG. 36 is a cross-sectional view schematically illustrating still another step in the method of producing a multilayer wiring board according to the second embodiment of the present invention.

Next, the steps described above with reference to FIGS. 13 to 16 in the first embodiment are performed. Thus, a structure shown in FIG. 36 is obtained.

In addition, a layer made of a silane coupling agent may be provided between the first inorganic insulating layer 160 and the seed adhesion layer 78 and between the first inorganic insulating layer 160 and the first insulating resin layer 71. By providing a layer made of a silane coupling agent, the adhesion between the first inorganic insulating layer 160 and the seed adhesion layer 78 and the adhesion between the first inorganic insulating layer 160 and the first insulating resin layer 71 can be improved. When the adhesion between these layers improves, delamination becomes less likely to occur at the interface between the first inorganic insulating layer 160 and the seed adhesion layer 78 and at the interface between the first inorganic insulating layer 160 and the first insulating resin layer 71 even when the multilayer wiring board 12 warps due to heat, for example.

Further, the multilayer wiring board 12 of the present embodiment exhibits higher insulation reliability than a configuration obtained by forming an inorganic insulating layer on a wiring portion produced by a conventional semi-additive method. If the semi-additive method is used, the surface of the wiring portion is roughened since the wiring portion is formed by etching.

The roughened surface of the wiring portion causes a decrease in conformability of the inorganic insulating film, leading to formation of pinholes in the inorganic insulating film. Since copper diffuses through the pinholes, the insulation reliability is lowered. Further, if the inorganic insulating film is made thicker in order to eliminate pinholes, the effect of the difference in coefficient of linear thermal expansion between copper and the inorganic insulating film becomes stronger, leading to occurrence of delamination at the copper/inorganic insulating film interface.

Figure 37:
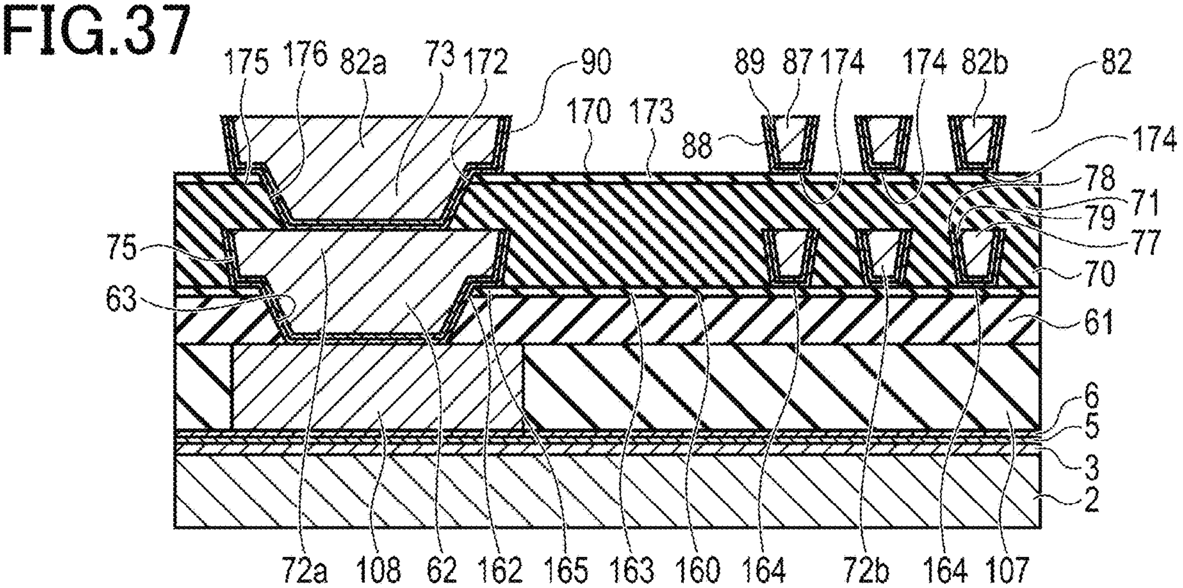
FIG. 37 is a cross-sectional view schematically illustrating still another step in the method of producing a multilayer wiring board according to the second embodiment of the present invention.

Next, as shown in FIG. 37, a first insulating resin layer 71 having a via recess 76 and a second inorganic insulating layer 170 covering the upper surface of the first insulating resin layer 71 are formed on the first inorganic insulating layer 160 and the conductor layer 77 by, for example, the same method as that described above for the insulating resin layer 61 and the first inorganic insulating layer 160. The first insulating resin layer 71 is formed to cover the first inorganic insulating layer 160 and the conductor layer 77 while filling a gap between the land portion 72*a* and the wiring portion 72*b*. The material of the first insulating resin layer 71 may be the same or different from the materials of the insulating resin layer 61 and the second insulating resin layer 81, which will be described later.

Thus, the first layer 70 including the first insulating resin layer 71, the conductor layer 77, the seed adhesion layer 78 and the seed layer 79 and the first inorganic insulating layer 160 is obtained.

Figure 38:
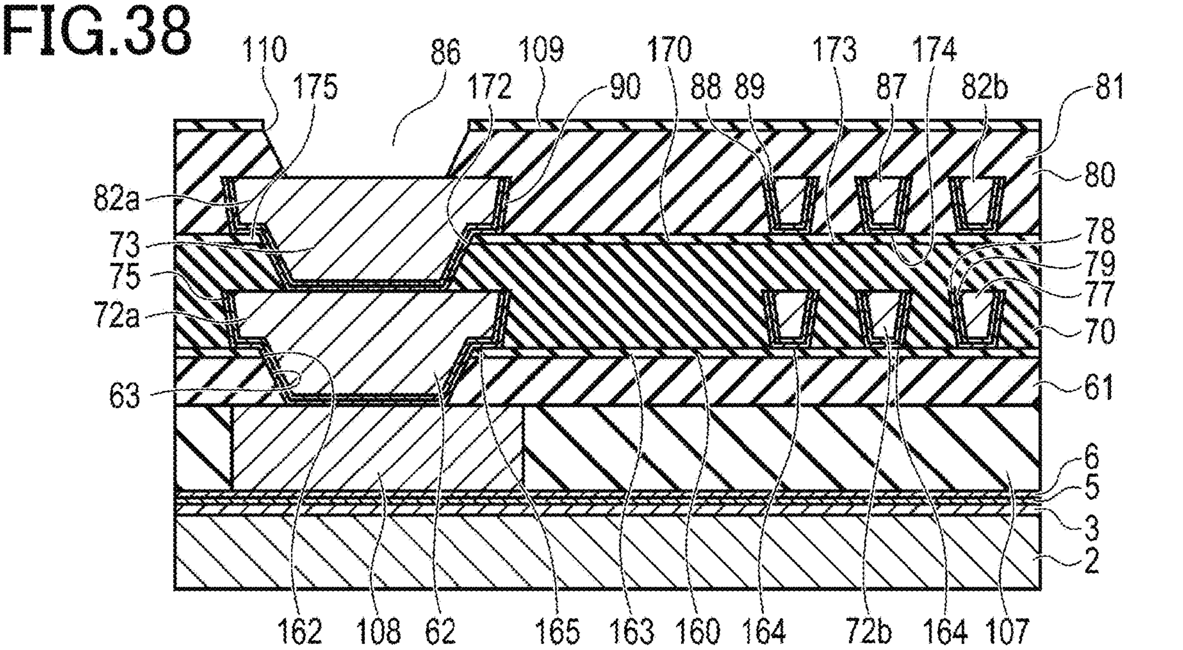
FIG. 38 is a cross-sectional view schematically illustrating still another step in the method of producing a multilayer wiring board according to the second embodiment of the present invention.

Next, as shown in FIG. 37, a second inorganic insulating layer 170, a seed adhesion layer 88, a seed layer 89, and a conductor layer 87 including a land portion 82*a*, a wiring portion 82*b* and a via portion 73 are formed by performing the same steps as those described above with reference to FIG. 36. Furthermore, as shown in FIG. 38, a second insulating resin layer 81 and an inorganic insulating layer 109 are formed by the same method as that described above for the insulating resin layer 61 and the first inorganic insulating layer 160. Thus, the second layer 80 including the second insulating resin layer 81, the conductor layer 87, the seed adhesion layer 88 and the seed layer 89 and the second inorganic insulating layer 170 is obtained. The material of the second inorganic insulating layer 170 may be the same or different from the materials of the first inorganic insulating layer 160 and the inorganic insulating layer 109, which will be described later. The material of the second insulating resin layer 81 may be the same or different from the materials of the insulating resin layer 61 and the first insulating resin layer 71.

Figure 39:
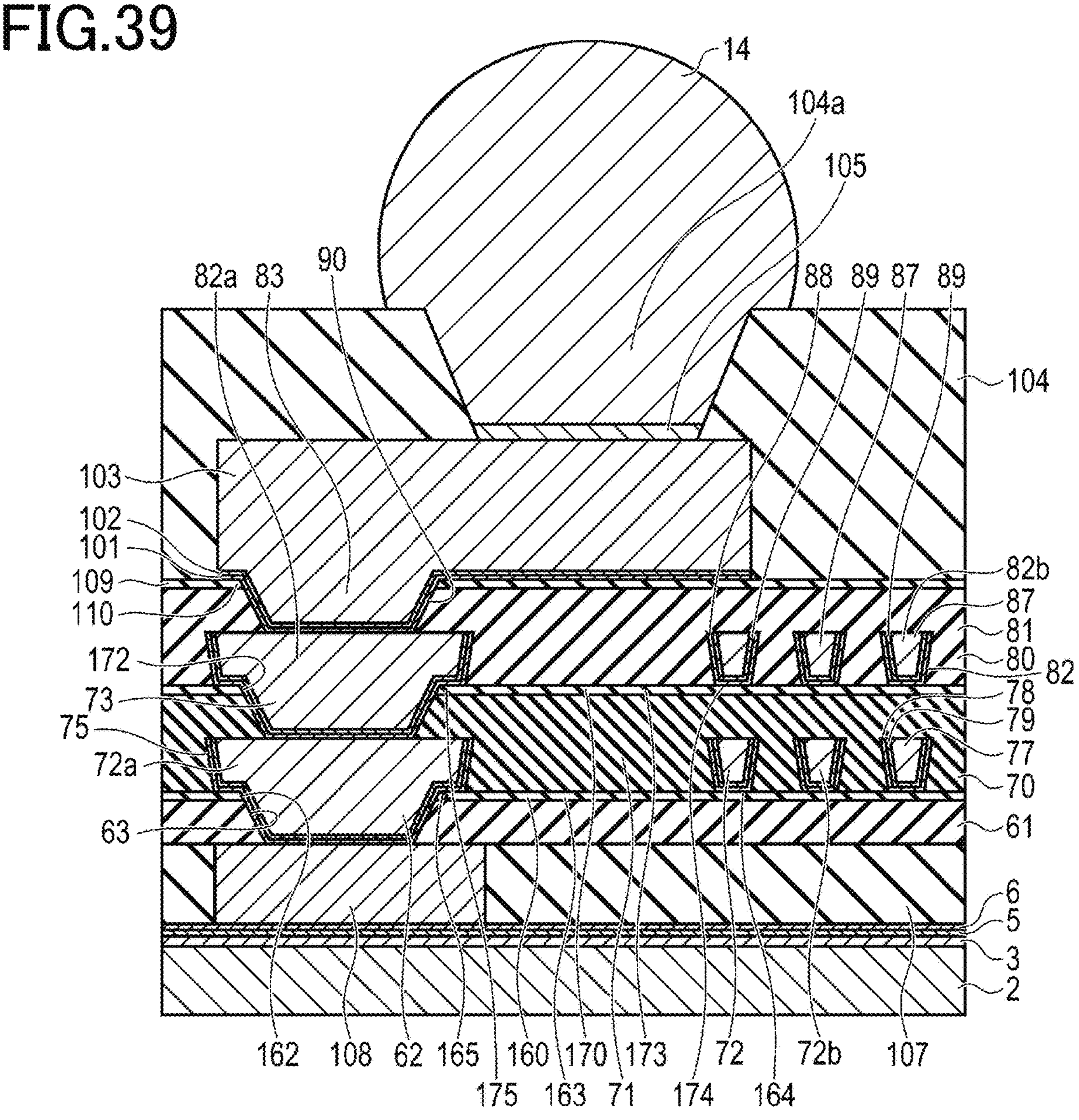
FIG. 39 is a cross-sectional view schematically illustrating one step in the method of producing a packaged device according to the second embodiment of the present invention.

Next, the steps described above with reference to FIGS. 19 to 24 in the first embodiment are performed. Thus, as shown in FIG. 39, a multilayer wiring board 12 supported by the support 2, that is, a multilayer wiring board with a support, is completed.

In addition, a composite wiring board and a packaged device according to the second embodiment can be produced by the same method as that described above for the first embodiment except that the above multilayer wiring board with a support is used.

The packaged device configured as described above includes the first inorganic insulating layer 160 including a portion 163 covering the first surface 71*a* of the first layer 70, and the second inorganic insulating layer 170 including a portion 173 covering the first surface 81*a* of the second layer 80. Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, since the portion 163 of the first inorganic insulating layer 160 covering the first surface 71*a* and the portion 173 of the second inorganic insulating layer 170 covering the first surface 81*a* improve the rigidity of the first layer 70 and the second layer 80, the multilayer wiring board 12 becomes less likely to warp or bend.

Further, the first inorganic insulating layer 160 serves as a protective layer for the insulating resin layer 61 in removal of the resist layer 190 and the resist layer 143. Therefore, the insulating resin layer 61 can be protected when the resist layer 190 and the resist layer 143 are removed. Similarly, the second inorganic insulating layer 170 of the second layer 80 can protect the first insulating resin layer 71.

Moreover, the first inorganic insulating layer 160 can be used as a mask for forming the via hole 63 of the insulating resin layer 61. Similarly, the second inorganic insulating layer 170 can be used as a mask for forming the via recess 76 of the first insulating resin layer 71.

In the above method, the resist layer 143 is removed after the conductor layer 77 is formed and polished, and the first insulating resin layer 71 is provided instead of using the resist layer 143 as a component of the multilayer wiring board 12. Similarly, the resist layer 190 is removed after the conductor layer 87 is formed and polished, and the second insulating resin layer 81 is provided instead of using the resist layer 190 as a component of the multilayer wiring board 12.

In the steps of forming and polishing the conductor layers 77, 87, and the like, metal may diffuse into the resist layers 143 and 190. Since the above-mentioned multilayer wiring board 12 does not include, as components, the resist layers 143 and 190 into which metal may have diffused, it is advantageous in achieving high insulation reliability.

Further, the first inorganic insulating layer 160 includes a portion 164 closing the aperture 74*c* of the groove section 74, and a portion 165 covering a peripheral portion 72*c* of the land portion 72*a* on the first surface 71*a* side. The second inorganic insulating layer 170 includes a portion 174 closing the aperture 84*c* of the groove section 84, and a portion 175 covering a peripheral portion 82*c* of the land portion 82*a* on the first surface 81*a* side. Therefore, diffusion of metal from one of the adjacent insulating resin layers to the other is much less likely to occur. As a result, the multilayer wiring board 12 described above achieves high insulation reliability. Accordingly, the composite wiring board and the packaged device including the multilayer wiring board 12 also achieve high insulation reliability.

The first insulating resin layer 71 and the second insulating resin layer 81 are made of a non-photosensitive resin. Therefore, the first insulating resin layer 71 and the second insulating resin layer 81 can achieve excellent insulating properties. As a result, the multilayer wiring board 12 described above achieves high insulation reliability. Accordingly, the composite wiring board and the packaged device including the multilayer wiring board 12 also achieve high insulation reliability.

The seed adhesion layers 78 and 88 also serve as barrier layers that prevent diffusion of metal from the conductor layers 77 and 87 to the first insulating resin layer 71 and the second insulating resin layer 81. Further, when the seed layers 79 and 89 are made of a metal material having a lower ionization tendency than the materials of the conductor layer 77 and the conductor layer 87, respectively, the seed layers 79 and 89 also serve as barrier layers that prevent diffusion of metal from the conductor layers 77 and 87 to the first insulating resin layer 71 and the second insulating resin layer 81.

Moreover, since the seed adhesion layers 78 and 88 cover the lower surface in addition to the side surfaces of the land portions 72*a* and 82*a*, the via portions 73 and 83, and the groove sections 74 and 84, in addition to the side surfaces thereof, the seed adhesion layers 78 and 88 can further prevent diffusion of metal from the conductor layers 77 and 87 to the insulating resin layers 71 and 81.

Next, a configuration of the multilayer wiring board 12 of the present embodiment described above and effects of the method of producing the multilayer wiring board 12 will be described.

In the example of the present embodiment, as shown in FIGS. 29 and 30, a gap between the land portion 72*a* and the wiring portion 72*b* is filled with the first insulating resin layer 71. The first inorganic insulating layer 160 includes the portion 163 covering the first surface 71*a* of the first insulating resin layer 71. Further, a gap between the land portion 82*a* and the wiring portion 82*b* is filled with the second insulating resin layer 81. The second inorganic insulating layer 170 includes the portion 173 covering the first surface 81*a* of the second insulating resin layer 81.

Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, the side surfaces of the land portions 72*a* and 82*a* of the interlayer connection conductor layer 90 are in contact with the insulating resin layers 71 and 81 via the seed adhesion layers 78 and 88, respectively. By using titanium, which has good adhesion to the insulating resin layers 71 and 81, for the seed adhesion layers 78 and 88, it is possible to prevent delamination of the interlayer connection conductor layer 90 from the insulating resin layers 71 and 81 due to a difference in coefficient of linear thermal expansion between copper and resin during a temperature cycle test.

<Verification of Effects>

In order to verify the effects of the present embodiment, the following evaluation was performed for the multilayer wiring board 12 of the present embodiment and the multilayer wiring board 150 of the comparative example described above with reference to FIG. 28.

<Evaluation Method 1> Evaluation of Insulation Reliability

Bias: Evaluation was performed under the environment of 3.3V, 130° C./85% RH. The wiring rule was L/S=2/2 μm. In the evaluation, the thickness of each insulating resin layer was set to 1 μm, 1.5 μm, 2 μm and 2.5 μm in both the multilayer wiring board 12 and the multilayer wiring board 150.

In the multilayer wiring board 12, the thickness of each of the first inorganic insulating layer 160 and the second inorganic insulating layer 170 was set to 50 nm. After 192 hours under the above bias and environment, a resistance value of $10^6\Omega$ or more was judged as a pass. The number of evaluations for each resin thickness was given by N=10.

<Evaluation Method 2> Evaluation of Adhesion between Interlayer Connection Conductor Layer and Resin Layer An environmental test was performed under the conditions of 1,000 cycles from −55° C. to 125° C. After the environmental test, the presence or absence of delamination at the interface between the interlayer connection conductor layer and the insulating resin was checked by cross-sectional observation.

<Evaluation Results>

<Evaluation 1> Evaluation of Insulation Reliability

In the multilayer wiring board 150 of the comparative example, insulation failure was found after 96 hours in all the cases regardless of the thickness of the insulating resin layer. On the other hand, in the multilayer wiring board 12 of the present embodiment, a resistance value was $10^6\Omega$ or more after 192 hours regardless of the thickness of the insulating resin layer, exhibiting good insulation reliability.

<Evaluation 2> Evaluation of Adhesion between Interlayer Connection Conductor Layer and Resin Layer In the multilayer wiring board 150 of the comparative example, delamination was found at the interface between the interlayer connection conductor layer and the insulating resin after 1,000 cycles. On the other hand, in the multilayer wiring board 12 of the present embodiment, no delamination was found at the interface between the interlayer connection conductor layer and the resin.

The above embodiment is merely an example, and specific details of the structure can be modified as appropriate.

In the above example, the first inorganic insulating layer 160 has been described as covering the bottom 74*b* and the side wall of the groove section 74 and the bottom 75*b* and the side wall of the land recess 75. However, the configuration is merely an example, and is not limited thereto. In another example, the first inorganic insulating layer 160 may be configured to cover only the bottom 74*b* of the groove section 74 and the bottom 75*b* of the land recess 75. Further, the first inorganic insulating layer 160 has been described as covering the first surface 71*a* of the first insulating resin layer 71. However, the configuration is merely an example, and is not limited thereto. In another example, the first inorganic insulating layer 160 may be configured not to be provided on the first surface 71*a*.

Similarly, the second inorganic insulating layer 170 has been described as covering the bottom 84*b* and the side wall of the groove section 84 and the bottom 85*b* and the side wall of the land recess 85. However, the configuration is merely an example, and is not limited thereto. In another example, the second inorganic insulating layer 170 may be configured to cover only the bottom 84*b* of the groove section 84 and the bottom 85*b* of the land recess 85. Further, the second inorganic insulating layer 170 has been described as covering the first surface 81*a* of the second insulating resin layer 81. However, the configuration is merely an example, and is not limited thereto. In another example, the second inorganic insulating layer 170 may be configured not to be provided on the first surface 81*a*.

Moreover, in the above example, the configuration of the first layer 70 has been described as an example in which the first layer 70 includes the seed adhesion layer 78 made of titanium, and the seed adhesion layer 78 covers the side surface of the conductor layer 77. The seed adhesion layer 78 made of titanium constitutes the inorganic insulating layer. In the present embodiment, in which the seed adhesion layer 78 is provided, the seed adhesion layer 78 can prevent diffusion of metal from the conductor layer 77 to the first insulating resin layer 71 even if the first inorganic insulating layer 160 does not cover the side walls of the groove section 74 and the land recess 75.

Similarly, in the second layer 80, the seed adhesion layer 88 can prevent diffusion of metal from the conductor layer 87 to the second insulating resin layer 81 even if the second inorganic insulating layer 170 does not cover the side walls of the groove section 84 and the land recess 75.

In the above example, the multilayer wiring board 12 includes the first layer 70 and the second layer 80, but the multilayer wiring board 12 may further include one or more layers which are similar to the first layer 70 and the second layer 80.

The present invention can be applied to semiconductor devices having a wiring substrate including an interposer or the like interposed between a main substrate and an IC chip.

<3> Third Embodiment

A packaged device, a composite wiring board and a multilayer wiring board according to a third embodiment are the same as the packaged device, the composite wiring board and the multilayer wiring board according to the first embodiment, respectively, except that the multilayer wiring board has the following configuration.

Figure 40:
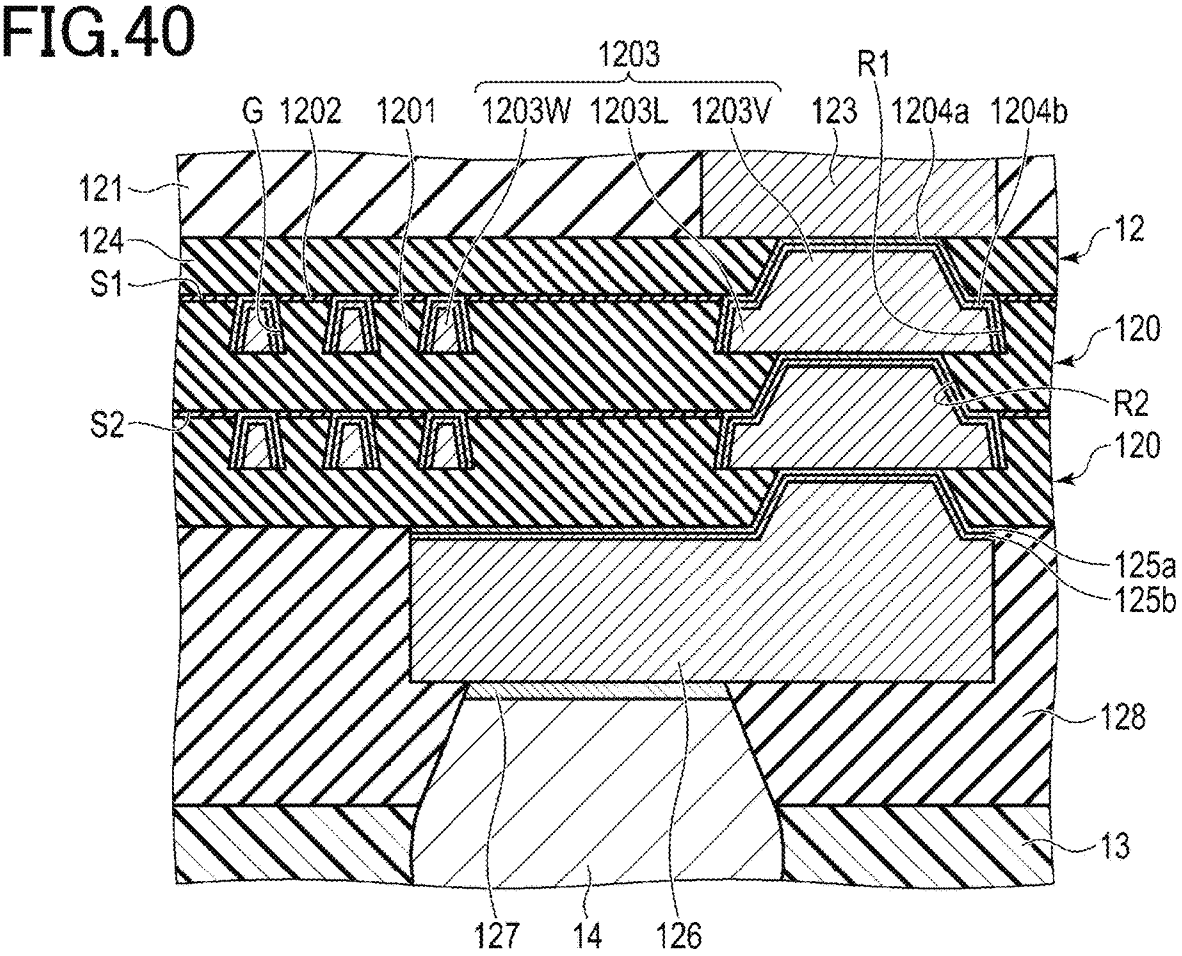
FIG. 40 is a cross-sectional view schematically illustrating a multilayer wiring board included in a packaged device according to a third embodiment of the present invention.
Figure 41:
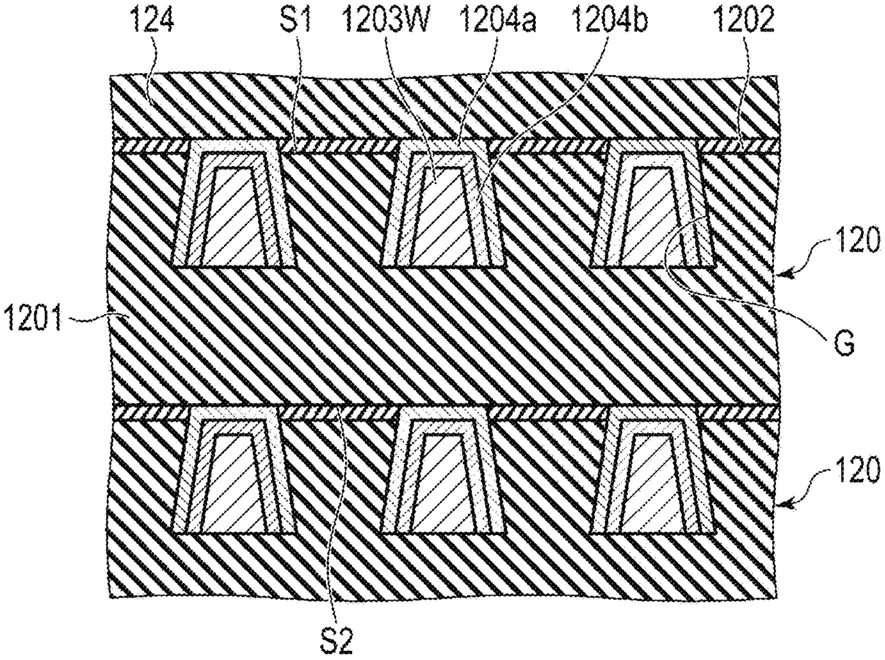
FIG. 41 is an enlarged cross-sectional view illustrating a part of the multilayer wiring board shown in FIG. 40.
Figure 42:
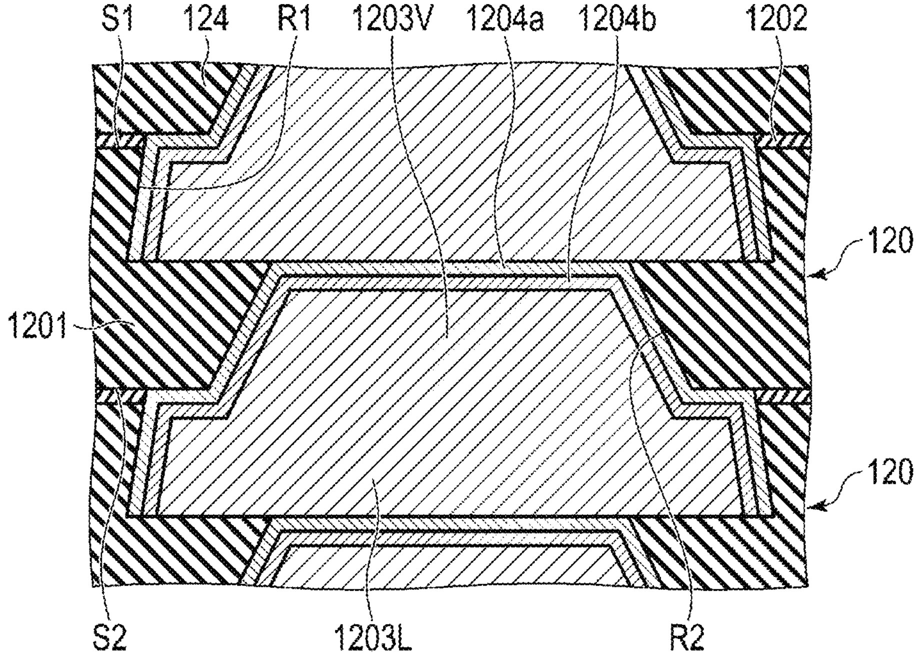
FIG. 42 is an enlarged cross-sectional view illustrating another part of the multilayer wiring board shown in FIG. 40.

FIG. 40 is a cross-sectional view schematically illustrating a multilayer wiring board included in a packaged device according to the third embodiment. FIG. 41 is an enlarged cross-sectional view illustrating a part of the multilayer wiring board shown in FIG. 40. FIG. 42 is an enlarged cross-sectional view illustrating another part of the multilayer wiring board shown in FIG. 40.

The multilayer wiring board 12 shown in FIGS. 40 to 42 includes two or more layers 120, an insulating resin layer 124, an insulating resin layer 121, a conductor layer 123, a conductor layer 126, an adhesive layer 125*a*, a seed layer 125*b*, a surface treatment layer 127 and an insulating resin layer 128 as shown in FIG. 40.

The two or more layers 120 are laminated together. In this example, two layers 120 are laminated. The number of layers 120 may be three or more.

Each of the layers 120 includes an insulating resin layer 1201, an inorganic insulating layer 1202, a conductor layer 1203, a first metal-containing layer 1204*a* and a second metal-containing layer 1204*b*.

The layers 120 in the multilayer wiring board 12 correspond to the layers 50, 70 or 80 in the first and second embodiments. The insulating resin layer 1201 of the multilayer wiring board 12 corresponds to the first insulating resin layer 71 or the second insulating resin layer 81 in the first and second embodiments. The conductor layer 1203 in the multilayer wiring board 12 corresponds to the conductor layer 77 or 87 in the first and second embodiments. The first metal-containing layer 1204*a* in the multilayer wiring board 12 corresponds to the seed adhesion layer 78 or 88 in the first and second embodiments. The second metal-containing layer 1204*b* in the multilayer wiring board 12 corresponds to the seed layer 79 or 89 in the first and second embodiments.

That is, the multilayer wiring board 12 is the same as the multilayer wiring board 12 according to the first embodiment except that each of the layers 120 includes the inorganic insulating layer 1202. In addition, the multilayer wiring board 12 is the same as the multilayer wiring board 12 according to the second embodiment except that the inorganic insulating layer 1202 has a structure described below.

The insulating resin layer 1201 is integrally formed in the thickness direction. The insulating resin layer 1201 is preferably made of an insulating resin containing no filler.

As shown in FIGS. 40 to 42, the insulating resin layer 1201 has a first surface S1 and a second surface S2 which is a rear surface thereof. The insulating resin layer 1201 is provided with a plurality of first recesses R1, a plurality of groove sections G, and a plurality of second recesses R2.

The first recesses R1 are open to the first surface S1. The first recesses R1 are land recesses filled with a land portion 1203L, which will be described later.

The first recesses R1 have the same depth. The depth of the first recess R1 is smaller than the thickness of the insulating resin layer 1201.

One or more of the first recesses R1 communicate with one of the groove sections G. One or more of the first recesses R1 communicate with the second recesses R2 of the insulating resin layer 1201 in which the first recesses R1 are provided.

The first recess R1 has an aperture, a side wall and a bottom. The bottom of the first recess R1 is a plane perpendicular to the thickness direction. In one example, the first recess R1 has a circular bottom, and the bottom of the first recess R1 communicating with the second recess R2 is open in a circular shape.

The first recess R1 in this example has a shape in which the dimension in a direction perpendicular to the thickness direction gradually increases from the aperture toward the bottom. That is, in this example, the first recess R1 has an inverted tapered cross-section perpendicular to the thickness direction. In one example, the first recess R1 has a frustoconical shape. The first recess R1 may have a rectangular cross-section parallel to the thickness direction. That is, the first recess R1 may have a prismatic or cylindrical shape in which the height direction is parallel to the thickness direction.

The groove sections G are open to the first surface S1. The groove sections are filled with the wiring portion 1203W, which will be described later. The depth of the groove sections G is the same as the depth of the first recesses R1.

The groove section G has an aperture, a side wall and a bottom. The bottom of the groove section G is a plane perpendicular to the thickness direction.

The groove section G has a shape in which the width gradually increases from the aperture toward the bottom. That is, in this example, the groove section G has an inverted tapered cross-section perpendicular to the length direction. The groove section G may have a rectangular cross-section perpendicular to the length direction.

The second recesses R2 are open to the second surface S2. The second recesses R2 are via recesses filled with a via portion 1203V, which will be described later.

The second recesses R2 communicate with one or more of the first recesses R1. Specifically, each of the second recesses R2 communicates with any of the first recesses R1.

The second recess R2 has an aperture and a side wall. The second recess R2 communicates with the first recess R1 at a position of the bottom thereof. The orthogonal projection of the second recess R2 onto a plane perpendicular to the thickness direction is surrounded by the outline of the orthogonal projection of the bottom of the first recess R1 communicating with the second recess R2 onto the above-mentioned plane.

The second recess R2 has a shape in which the dimension in a direction perpendicular to the thickness direction gradually increases from the aperture toward the bottom. That is, the second recess R2 has an inverted tapered cross-section perpendicular to the thickness direction. In one example, the second recess R2 has a frustoconical shape. The second recess R2 may have a rectangular cross-section parallel to the thickness direction. That is, the second recess R2 may have a prismatic or cylindrical shape in which the height direction is parallel to the thickness direction.

The details of the first recess R1, the groove section G and the second recess R2 will be described later.

The inorganic insulating layer 1202 covers the first surface S1 of the insulating resin layer 1201. The inorganic insulating layer 1202 covering the first surface S1 of each insulating resin layer 1201 has a through hole at a position of the second recess R2 provided in the insulating resin layer adjacent to the above insulating resin layer 1201 with the inorganic insulating layer 1202 interposed therebetween. Further, the inorganic insulating layer 1202 has a slit at a position of the groove section G provided in the insulating resin layer 1201 having the first surface S1 covered by the inorganic insulating layer 1202.

The conductor layer 1203 includes the land portion 1203L and the wiring portion 1203W filling the first recess R1 and the groove section G of the insulating resin layer 1201, respectively, and the via portion 1203V protruding from the first surface S1 at a position of the land portion 1203L. In each conductor layer 1203, each of the via portions 1203V is integrally formed with one of the land portions 1203L included in the conductor layer 1203. The via portion 1203V of each conductor layer 1203 fills the second recess R2 of another insulating resin layer adjacent to the first surface S1 of the insulating resin layer 1201, in which the first recess R1 and the groove section G are filled with the land portion 1203L and the wiring portion 1203W of the conductor layer 1203, respectively.

The conductor layer 1203 is made of a metal such as copper or an alloy thereof. The conductor layer 1203 may have a single-layer structure or a multilayer structure. In one example, the conductor layer 1203 is made of copper.

As shown in FIGS. 40 to 42, the first metal-containing layer 1204*a* includes a portion covering the side surface and the peripheral portion of the upper surface of the land portion 1203L, a portion covering the side surface and the upper surface of the wiring portion 1203W, and a portion covering the side surface and the upper surface of the via portion 1203V. That is, the first metal-containing layer 1204*a* is provided on the bottoms and side walls of the first recess R1, the second recess R2 and the groove section G.

The first metal-containing layer 1204*a* is an adhesive layer or a seed adhesion layer that improves adhesion of the second metal-containing layer 1204*b* to a dummy layer 2201, which will be described later, preventing the second metal-containing layer 1204*b* from being easily delaminated. In one example, the first metal-containing layer 1204*a* is a layer containing titanium, such as a titanium layer.

The second metal-containing layer 1204*b* is interposed between the first metal-containing layer 1204*a* and the conductor layer 1203. The second metal-containing layer 1204*b* is a seed layer that serves as a power supply layer in film formation of the conductor layer 1203 by electroplating. The second metal-containing layer 1204*b* may be, for example, made of the same material as the conductor layer 1203 or a metal material having a lower ionization tendency than the material of the conductor layer 1203. In one example, the second metal-containing layer 1204*b* is made of copper. When two layers laminated together are made of the same material, the interfaces between these layers can be identified by observing a cross-section parallel to the lamination direction with an electron microscope such as a scanning electron microscope, for example.

As shown in FIG. 40, the insulating resin layer 124 is provided on one of the major surfaces of the multilayer wiring structure composed of the layers 120. The material of the insulating resin layer 124 may be the same or different from the material of the insulating resin layer 1201.

The insulating resin layer 124 has a through hole at a position of the via portion 1203V of the insulating resin layer 1201 included in the adjacent layer 120. The through hole of the insulating resin layer 124 is filled with the via portion 1203V of the insulating resin layer 1201 included in the adjacent layer 120.

The through hole of the insulating resin layer 124 is a recess open to a surface on the layer 120 side. The recess has a shape in which the dimension in a direction perpendicular to the thickness direction gradually decreases from the lower side toward the upper side. That is, the recess of the insulating resin layer 124 in this example has a forward tapered cross-section perpendicular to the thickness direction. In one example, the through hole has a frustoconical shape. The through hole (or recess) may have a rectangular cross-section parallel to the thickness direction. That is, the through hole may have a prismatic or cylindrical shape in which the height direction is parallel to the thickness direction.

The insulating resin layer 121 is provided on the insulating resin layer 124. The material of the insulating resin layer 121 may be the same or different from the materials of the insulating resin layers 124 and 1201. The insulating resin layer 121 has a through hole at a position of the through hole of the insulating resin layer 124.

The conductor layer 123 fills the through hole of the insulating resin layer 121. The conductor layer 123 is an electrode for bonding the multilayer wiring board 12 to the functional device 20. The conductor layer 123 may be made of copper, for example.

The conductor layer 126 fills the second recess R2 of the insulating resin layer 1201 included in the layer 120 located on the lower side, and covers the aperture and a region around the aperture of the second recess R2 on the second surface S2 of the insulating resin layer 1201. The conductor layer 126 is made of a metal such as copper or an alloy thereof.

The adhesive layer 125*a* includes a portion covering the inner surface of the second recess R2 of the insulating resin layer 1201 included in the layer 120 located on the lower side, and a portion covering a region around the aperture of the second recess R2 on the second surface S2 of the insulating resin layer 1201. The adhesive layer 125*a* is a layer that improves adhesion of the seed layer 125*b* to the insulating resin layer 1201, preventing the seed layer 125*b* from being easily delaminated.

The seed layer 125*b* is disposed on the adhesive layer 125*a*. The seed layer 125*b* serves as a power supply layer in film formation of the conductor layer 126 by electroplating.

The insulating resin layer 128 is provided on the insulating resin layer 1201 included in the layer 120 located on the lower side and the conductor layer 126. The insulating resin layer 128 has a through hole at a position of the conductor layer 126.

The surface treatment layer 127 is disposed on a portion of the conductor layer 126 exposed through the through hole of the insulating resin layer 128. The surface treatment layer 127 is provided to prevent oxidation of the surface of the conductor layer 126 and improve wettability with solder.

The multilayer wiring board 12 can be produced by the following method, for example.

FIGS. 43 to 53 are cross-sectional views schematically illustrating a method of producing a multilayer wiring board according to the third embodiment of the present invention.

Figure 43:
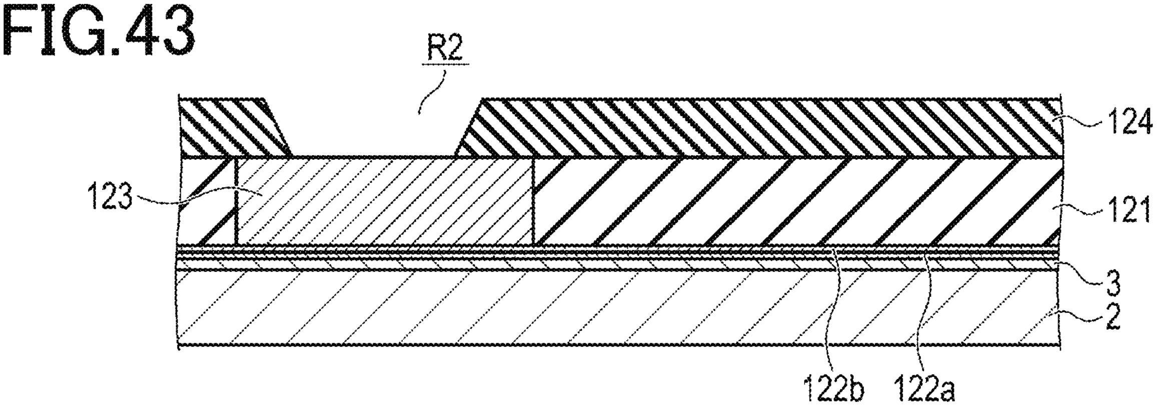
FIG. 43 is a cross-sectional view schematically illustrating one step in the method of producing a multilayer wiring board according to the third embodiment of the present invention.

In this method, first, a structure shown in FIG. 43 is obtained by the same method as that described with reference to FIGS. 4 to 11 in the first embodiment. The structure shown in FIG. 43 includes a support 2, a release layer 3, an adhesive layer 122*a*, a seed layer 122*b*, an insulating resin layer 121, a conductor layer 123 and an insulating resin layer 124. The adhesive layer 122*a*, the seed layer 122*b*, the insulating resin layer 121, the conductor layer 123 and the insulating resin layer 124 correspond to the seed adhesion layer 5, the seed layer 6, the insulating resin layer 107, the conductor layer 108 and the insulating resin layer 61, respectively, of the first and second embodiments.

The through hole of the insulating resin layer 124 is the second recess R2 that is open to the second surface of the insulating resin layer 124, which is the upper surface of the insulating resin layer 124 in this example. The second recess R2 may be formed to have a rectangular cross-section, but is preferably formed to have a forward tapered cross-section. By forming in a forward tapered shape, a first metal-containing layer 1204*a* and a second metal-containing layer 1204*b* can be easily formed without producing discontinuous portions in the second recess R2.

Figure 44:
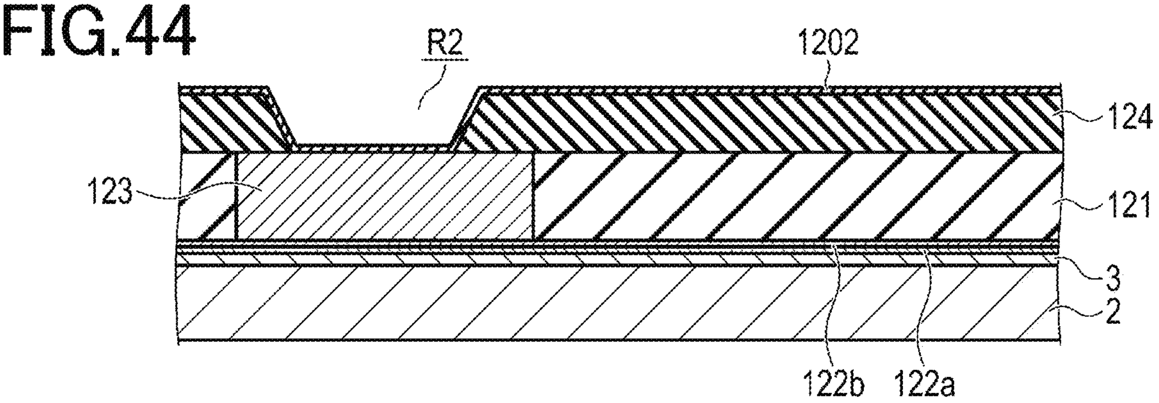
FIG. 44 is a cross-sectional view schematically illustrating another step in the method of producing a multilayer wiring board according to the third embodiment of the present invention.

Next, as shown in FIG. 44, an inorganic insulating layer 1202 is formed on the insulating resin layer 124 and the conductor layer 123. The inorganic insulating layer 1202 is formed to cover the upper surface of the insulating resin layer 124 and the inner surface of the second recess R2.

The inorganic insulating layer 1202 may be formed by, for example, plasma chemical vapor deposition (CVD). The inorganic insulating layer 1202 may be formed of, for example, one or more insulators selected from the group consisting of silicon oxide, silicon nitride, silicon oxynitride, fluorine-doped silicon oxide and carbon-doped silicon oxide.

The inorganic insulating layer 1202 preferably has a thickness of 50 nm or more, and more preferably 100 nm or more. When the inorganic insulating layer 1202 has a reduced thickness, discontinuous portions such as pinholes are likely to be formed. The inorganic insulating layer 1202 preferably has a thickness of 1,000 nm or less, and more preferably 500 nm or less. When the inorganic insulating layer 1202 has an increased thickness, a longer time is required for film formation or partial removal of the film by etching, for example.

Figure 45:
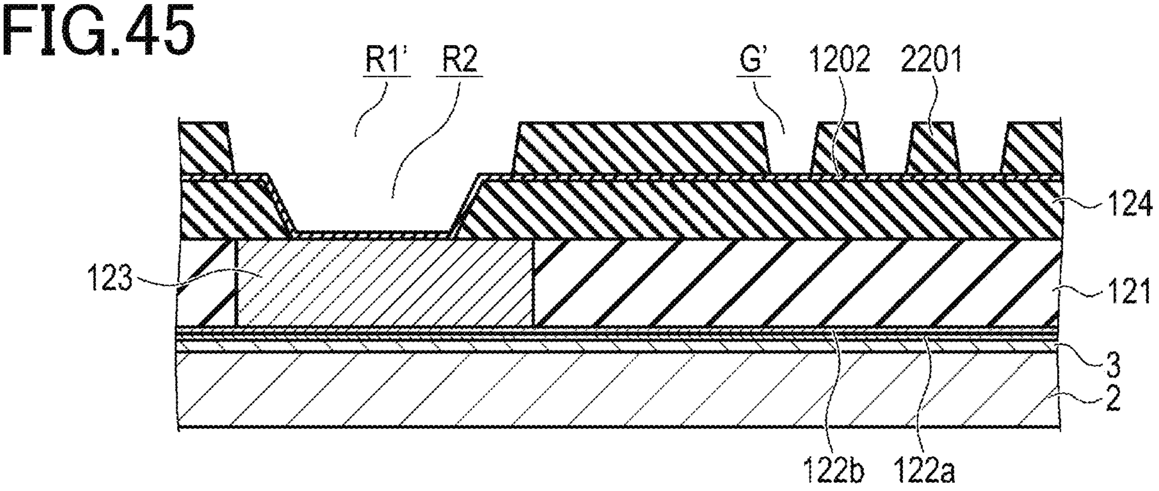
FIG. 45 is a cross-sectional view schematically illustrating still another step in the method of producing a multilayer wiring board according to the third embodiment of the present invention.

Next, as shown in FIG. 45, a dummy layer 2201 is formed on the inorganic insulating layer 1202, in which the dummy layer 2201 has a groove G' and one or more of the through holes R1' communicate with the second recess R2. The dummy layer 2201 corresponds to the first insulating resin layer 71 in the first embodiment. The groove G' and the through hole R1' of the dummy layer 2201 correspond to the groove section G and the first recess R1 of the insulating resin layer 1201, respectively.

The dummy layer 2201 is made of a photosensitive resin. As the photosensitive resin, for example, the same material as that described for the resist layer 143 can be used. Further, the dummy layer 2201 having the groove G' and the through hole R1' can be formed by, for example, the same method as that described above for the resist layer 143.

The through hole R1' of the dummy layer 2201 is formed such that the opening size on the upper surface thereof is larger than the opening size of the through hole of the insulating resin layer 124 on the upper surface thereof. The through hole R1' is formed in a forward tapered shape. The groove G' is also formed to have a cross-section perpendicular to the length direction in a forward tapered shape.

The groove G' and the through hole R1' may be formed to have a rectangular cross-section, but by forming in a forward tapered shape, a first metal-containing layer 1204*a* and a second metal-containing layer 1204*b* can be easily formed without producing discontinuous portions in the groove G' and the through hole R1'.

In addition, when the groove G' and the through hole R1' are formed to have a cross-section in a forward tapered shape, the contact area between the insulating resin layer 1201 and the inorganic insulating layer 1202 can be increased compared with a case where the groove G' and the through hole R1' are formed to have a cross-section in a rectangular shape without changing the cross-sectional area. Accordingly, adhesion between the insulating resin layer 1201 and the inorganic insulating layer 1202 can be improved. Similarly, adhesion between the insulating resin layer 1201 and the conductor layer 1203 can also be improved. Therefore, occurrence of interlayer delamination can be reduced.

Figure 46:
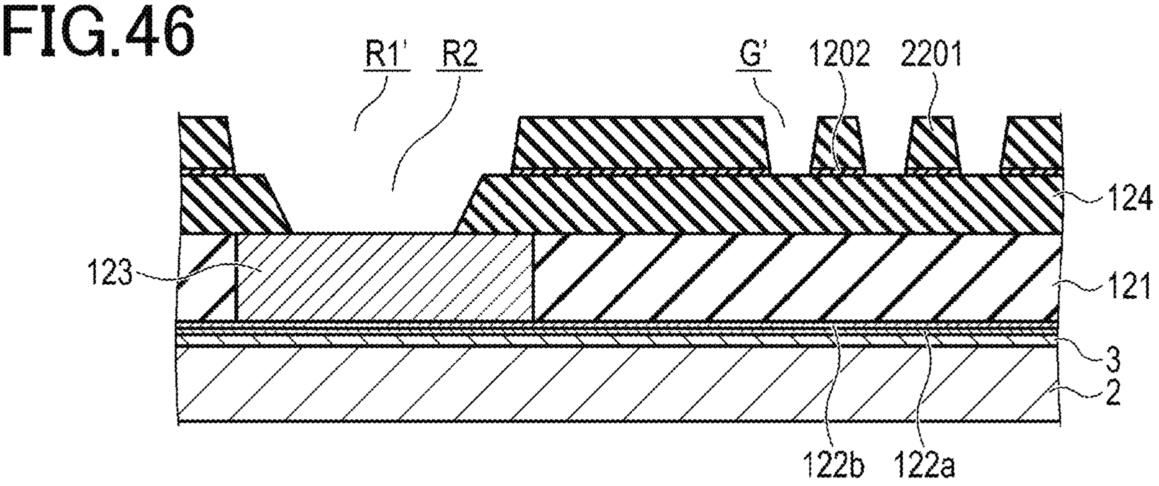
FIG. 46 is a cross-sectional view schematically illustrating still another step in the method of producing a multilayer wiring board according to the third embodiment of the present invention.

Next, as shown in FIG. 46, a portions of the inorganic insulating layer 1202 exposed in the second recess R2, a portion exposed in the groove G', and a portion exposed in the through hole R1' are removed. The portions can be removed by, for example, dry etching using the dummy layer 2201 as a mask.

Next, the steps described above with reference to FIGS. 13 to 16 in the first embodiment are performed. Thus, a structure shown in FIG. 47 is obtained.

Figure 47:
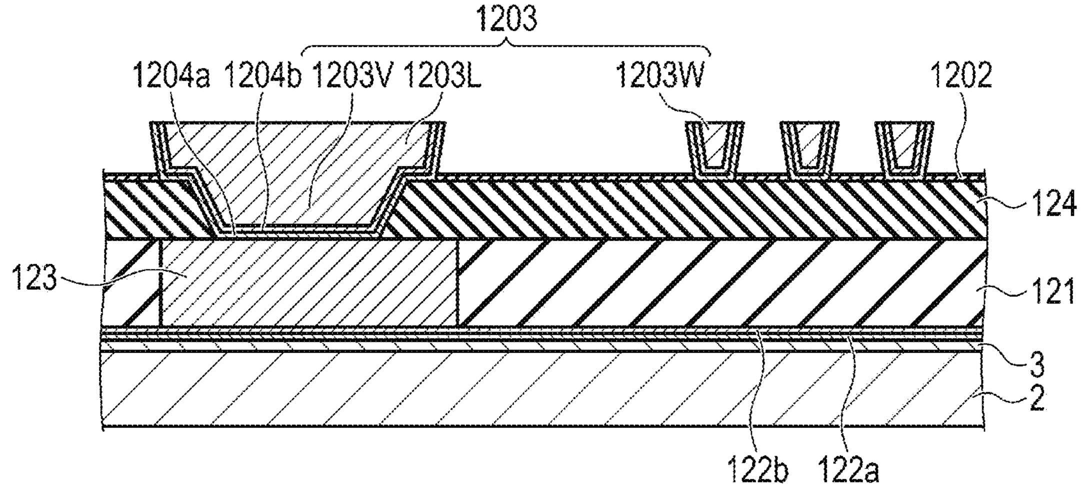
FIG. 47 is a cross-sectional view schematically illustrating still another step in the method of producing a multilayer wiring board according to the third embodiment of the present invention.

In FIG. 47, a portion of the conductor layer 1203 that fills the second recess R2, a portion that fills the through hole R1', and a portion that fills the groove G' are a via portion 1203V, a land portion 1203L and a wiring portion 1203W, respectively. The via portion 1203V corresponds to the via portion 62 or 73 in the first and second embodiments. The land portion 1203L corresponds to the land portion 72*a* or 82*a* in the first and second embodiments. The wiring portion 1203W corresponds to the wiring portion 72*b* or 82*b* in the first and second embodiments.

Figure 48:
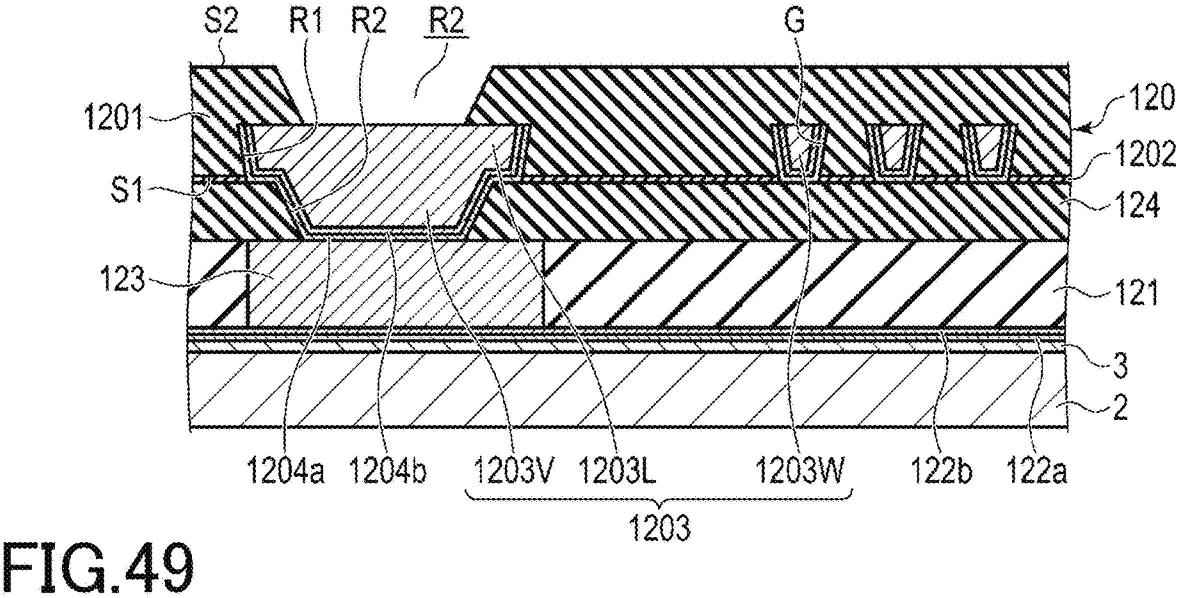
FIG. 48 is a cross-sectional view schematically illustrating still another step in the method of producing a multilayer wiring board according to the third embodiment of the present invention.
Figure 49:
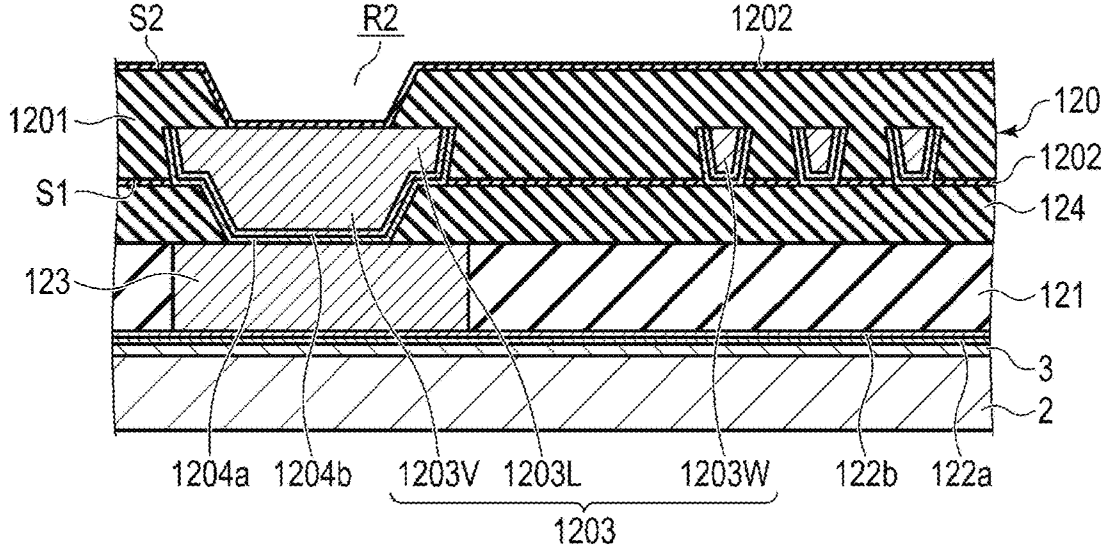
FIG. 49 is a cross-sectional view schematically illustrating still another step in the method of producing a multilayer wiring board according to the third embodiment of the present invention.
Figure 50:
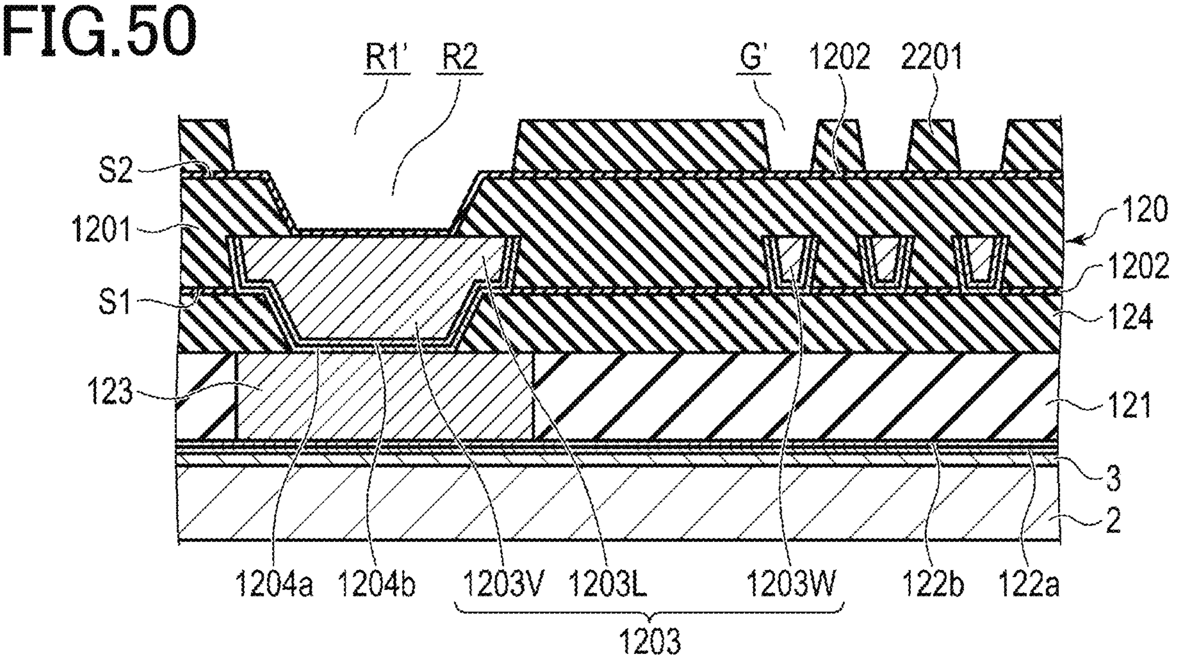
FIG. 50 is a cross-sectional view schematically illustrating still another step in the method of producing a multilayer wiring board according to the third embodiment of the present invention.
Figure 51:
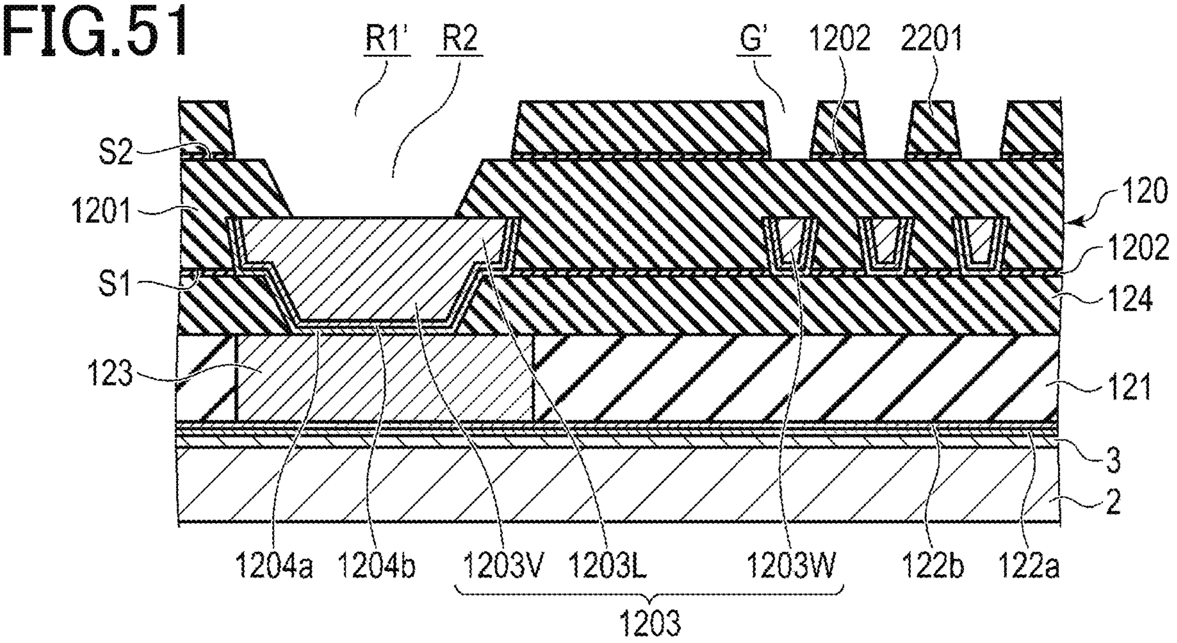
FIG. 51 is a cross-sectional view schematically illustrating still another step in the method of producing a multilayer wiring board according to the third embodiment of the present invention.
Figure 52:
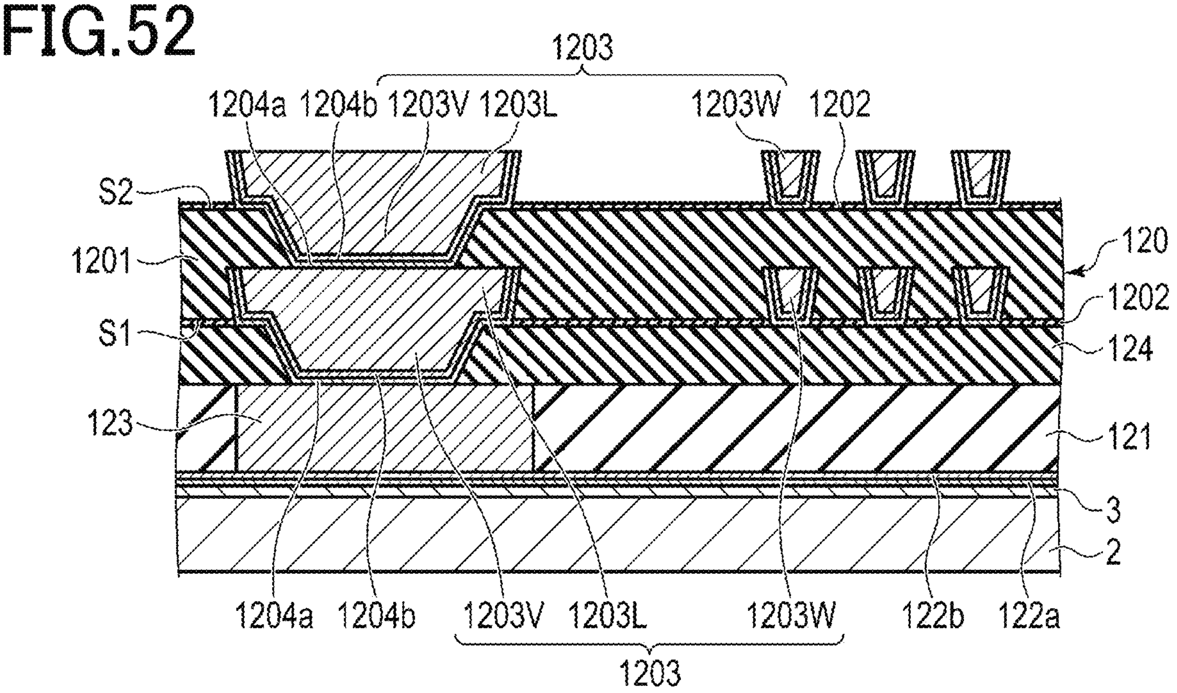
FIG. 52 is a cross-sectional view schematically illustrating still another step in the method of producing a multilayer wiring board according to the third embodiment of the present invention.
Figure 53:
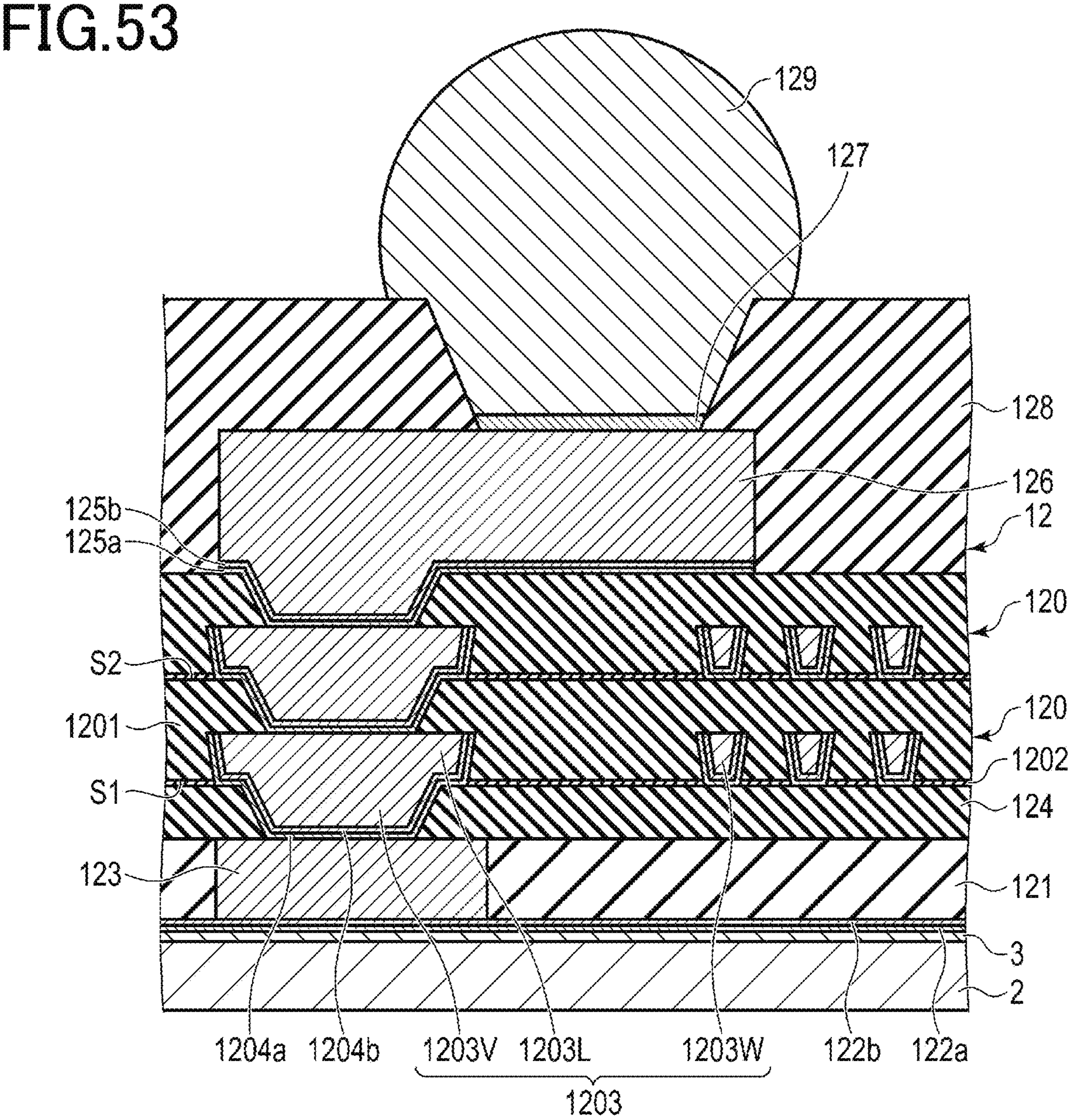
FIG. 53 is a cross-sectional view schematically illustrating still another step in the method of producing a multilayer wiring board according to the third embodiment of the present invention.

Next, as shown in FIG. 48, an insulating resin layer 1201 is provided to cover the conductor layer 1203 while filling a gap between the land portion 1203L and the wiring portion 1203W. The insulating resin layer 1201 has a through hole as the second recess R2. In the insulating resin layer 1201, the lower surface and the upper surface of the insulating resin layer 1201 are the first surface S1 and the second surface S2, respectively. Further, the recess of the insulating resin layer 1201 filled with the land portion 1203L is the first recess R1 described above. The recess of the insulating resin layer 1201 filled with the wiring portion 1203W is the groove section G described above.

The insulating resin layer 1201 is made of a photosensitive resin or a non-photosensitive resin. As the photosensitive resin or the non-photosensitive resin, for example, the same material as that described for the resist layer 140 and the insulating resin layer 61 can be used. Further, the insulating resin layer 1201 having the first recess R1, the second recess R2 and the groove section G can be formed by, for example, the same method as that described above for the resist layer 140 and the insulating resin layer 61.

In addition, prior to forming the insulating resin layer 1201, a layer made of a silane coupling agent may be formed on the inorganic insulating layer 1202 and the first metal-containing layer 1204*a*. By providing a layer made of a silane coupling agent, the adhesion between the insulating resin layer 1201 and the inorganic insulating layer 1202 and between the insulating resin layer 1201 and the first metal-containing layer 1204*a* can be improved. When the adhesion between these layers improves, interlayer delamination between the conductor layer 1203 and the insulating resin layer 1201 and interlayer delamination between the inorganic insulating layer 1202 and the insulating resin layer 1201 become less likely to occur even when the multilayer wiring board 12 warps due to heat, for example.

Thus, the layer 120 including the insulating resin layer 1201, the inorganic insulating layer 1202, the conductor layer 1203, the first metal-containing layer 1204*a* and the second metal-containing layer 1204*b* can be obtained.

The sequence of the steps described above with reference to FIGS. 44 to 48 is repeated. Then, the steps described above with reference to FIGS. 19 to 24 in the first embodiment are performed. Thus, the structures shown in FIGS. 49 to 53 are sequentially obtained. That is, a multilayer wiring structure including two layers 120 is obtained. When the above sequence is repeated one more time or more, the multilayer wiring structure including three or more layers 120 can be obtained.

Thus, a multilayer wiring board 12 supported by the support 2, that is, a multilayer wiring board with a support, is obtained.

In addition, a composite wiring board and a packaged device according to the third embodiment can be produced by the same method as that described above for the first embodiment except that the above multilayer wiring board with a support is used.

Interposers obtained by silicon interposer technology, that is, silicon interposers, are manufactured using silicon wafers and semiconductor pre-process equipment. Silicon wafers are limited in shape and size, and the number of interposers that can be manufactured from a single wafer is not always large. Also, the manufacturing equipment is expensive. Therefore, silicon interposers are also expensive. In addition, since the silicon wafer is a semiconductor, the use of a silicon interposer causes a problem of deterioration in transmission performance.

Silicon wafers are not required for production of the above-mentioned multilayer wiring board 12. Further, most of the insulating layers in the multilayer wiring board 12 can be insulating resin layers. Therefore, the multilayer wiring board 12 can be manufactured with inexpensive materials and equipment, reducing the cost and achieving excellent transmission performance.

In a technique by which a multilayer wiring structure including conductor layers having a fine wiring pattern are directly formed in an FC-BGA substrate, the deterioration in transmission performance occurring in silicon interposers is small. However, this technique has a problem in the manufacturing yield of the FC-BGA substrate itself. Also, the manufacturing yield as a whole is low since it is difficult to form a multilayer wiring structure including conductor layers having a fine wiring pattern on a core layer such as a glass epoxy substrate. Furthermore, in the FC-BGA substrate, it is difficult to achieve high symmetry relative to a plane bisecting the thickness of the FC-BGA substrate. Accordingly, the FC-BGA substrate tends to warp or distort when heated.

In production of the composite wiring board and the packaged device described above, the multilayer wiring board 12 is produced separately from the FC-BGA substrate, and these are bonded to each other. A multilayer wiring structure including conductor layers 1203 having a fine wiring pattern is formed not in the FC-BGA substrate, but in the multilayer wiring board 12. Therefore, the composite wiring board and the packaged device described above can be produced with high yield.

Further, in production of the composite wiring board 10, a multilayer wiring structure including conductor layers 1203 having a fine wiring pattern is formed not on the core layer such as a glass epoxy substrate, but on the support 2. Since a support having excellent flatness can be used as the support 2, a fine pattern or the like formed thereon can achieve high shape accuracy. For this reason also, the composite wiring board and the packaged device described above can be produced with high yield.

Moreover, in the composite wiring board and the packaged device described above, it is easy to achieve high symmetry relative to a plane bisecting the thickness of the FC-BGA substrate, and it is also easy to achieve high symmetry relative to a plane bisecting the thickness of the multilayer wiring board 12. Therefore, the composite wiring board and the packaged device described above are not likely to cause warpage or distortion when heated.

In the semi-additive method, the first metal-containing layer 1204*a* and the second metal-containing layer 1204*b* are patterned using the land portion 1203L and the wiring portion 1203W as masks. Therefore, in the semi-additive method, the surfaces of the land portion 1203L and the wiring portion 1203W are damaged by the etching. That is, the surface roughness increases. With an increase in the surface roughness of the surfaces of the land portion 1203L and the wiring portion 1203W, especially the wiring portion 1203W, the transmission performance deteriorates.

On the other hand, in production of the above multilayer wiring board 12, the via portion 1203V, the land portion 1203L and the wiring portion 1203W are formed by forming recesses and grooves in the foundation layer composed of the dummy layer and the insulating resin layer, sequentially forming the first metal-containing layer 1204*a*, the second metal-containing layer 1204*b* and the conductor layer 1203 on the upper surface of the foundation layer and the inner surfaces of the recesses and grooves, and removing portions of the layers located outside the recesses and grooves by polishing. That is, in production of the above multilayer wiring board 12, etching for patterning the first metal-containing layer 1204*a* and the second metal-containing layer 1204*b* is not performed. Therefore, the surfaces of the via portion 1203V, the land portion 1203L and the wiring portion 1203W are undamaged and can be smooth surfaces. As a result, the above multilayer wiring board 12 can achieve excellent transmission performance.

In the above multilayer wiring board 12, each of the layers 120 includes the inorganic insulating layer 1202. By providing the inorganic insulating layer 1202, damage to the insulating resin layer 124 due to etching for removing the dummy layer 2201 can be reduced. Also, by providing the inorganic insulating layer 1202, the multilayer wiring board 12 has increased rigidity, and becomes less likely to warp or bend.

Thus, the inorganic insulating layer 1202 prevents diffusion of metal between the insulating resin layers. Therefore, the above multilayer wiring board 12 can achieve excellent insulation reliability.

Further, in the above multilayer wiring board 12, the side surfaces of the lower surfaces of the via portion 1203V, the land portion 1203L and the wiring portion 1203W are covered with the first metal-containing layer 1204*a* and the second metal-containing layer 1204*b*. The first metal-containing layer 1204*a* and the second metal-containing layer 1204*b* prevent diffusion of metal from the conductor layer 1203 to the insulating resin layer 1201, and the like. Therefore, also for this reason, the above multilayer wiring board 12 can achieve excellent insulation reliability.

<Verification of Effects>

The effects of the above multilayer wiring board 12 were verified by the following method.

Example

The multilayer wiring board 12 described with reference to FIGS. 40 to 42 was produced by the method described with reference to FIGS. 43 to 53. The wiring rule was L/S=2 μm/2 μm.

Comparative Example

Figure 54:
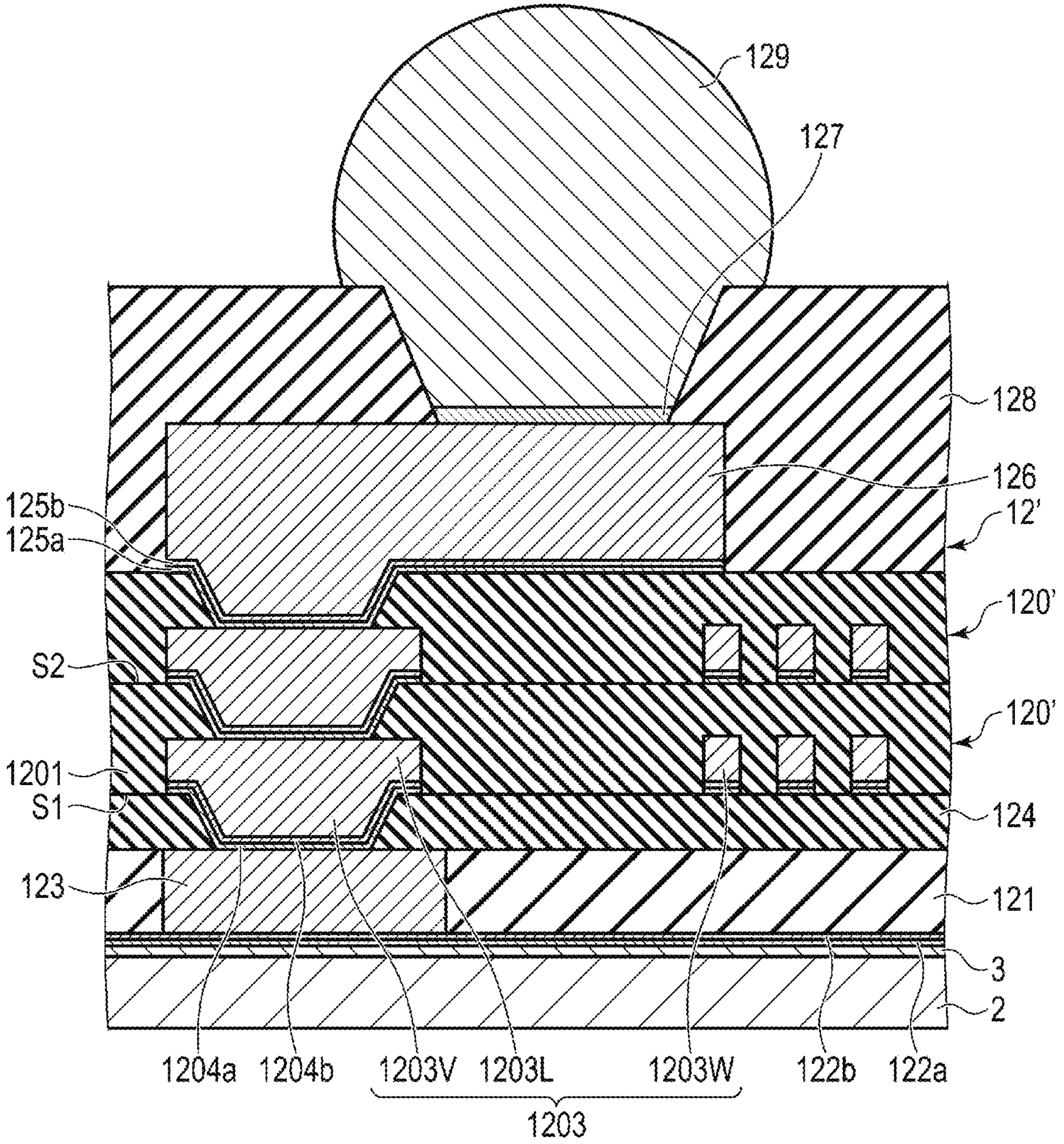
FIG. 54 is a cross-sectional view schematically illustrating a multilayer wiring board according to a comparative example.
Figure 55:
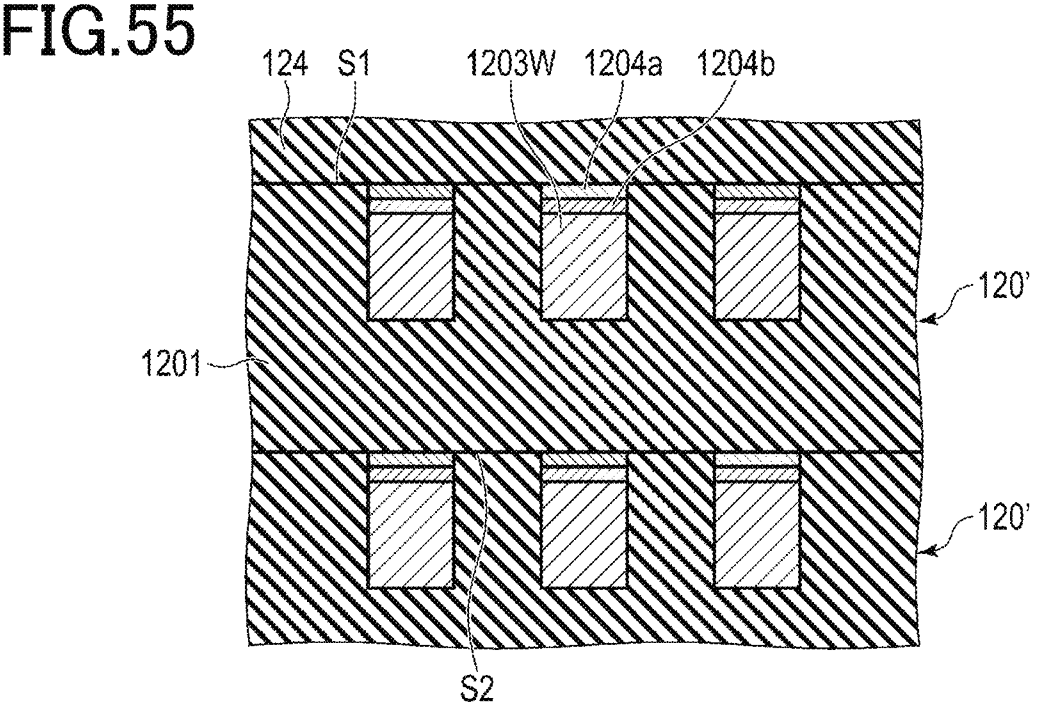
FIG. 55 is an enlarged cross-sectional view illustrating a part of the multilayer wiring board shown in FIG. 54.
Figure 56:
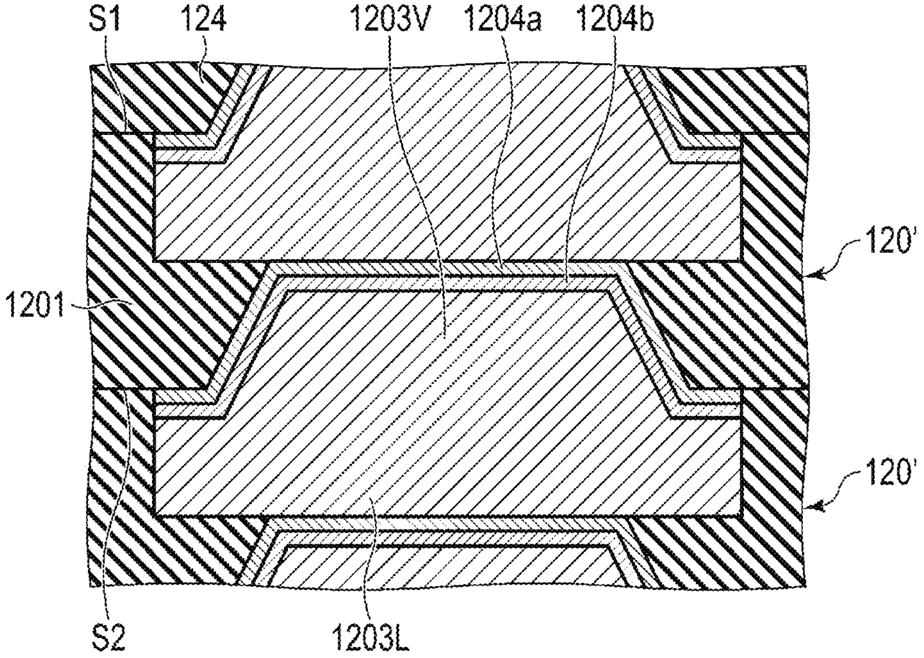
FIG. 56 is an enlarged cross-sectional view illustrating another part of the multilayer wiring board shown in FIG. 54.

FIG. 54 is a cross-sectional view schematically illustrating a multilayer wiring board according to a comparative example. FIG. 55 is an enlarged cross-sectional view illustrating a part of the multilayer wiring board shown in FIG. 54. FIG. 56 is an enlarged cross-sectional view illustrating another part of the multilayer wiring board shown in FIG. 54.

A multilayer wiring board 12' shown in FIGS. 54 to 56 is the same as the multilayer wiring board 12 according to the example except for the following points.

That is, the multilayer wiring board 12' includes layers 120' instead of the layers 120. Each of the layers 120' includes an insulating resin layer 1201, a first metal-containing layer 1204*a* and a second metal-containing layer 1204*b*, but does not include an inorganic insulating layer 1202. Since the first metal-containing layer 1204*a*, the second metal-containing layer 1204*b* and the conductor layer 1203 are formed by a conventional semi-additive method, the side surfaces of the land portion 1203L and the wiring portion 1203W are not covered with the first metal-containing layer 1204*a* and the second metal-containing layer 1204*b*. Further, each of the land portion 1203L and the wiring portion 1203W has substantially a rectangular cross-section. Except for the above points, the multilayer wiring board 12' according to the comparative example is the same as the multilayer wiring board 12 according to the example.

(Tests)

Bias: Evaluation was performed under the environment of 3.3V, 130° C./85% RH. After 192 hours under the above bias and environment, a resistance value of $10^6\Omega$ or more was judged as a pass. For each of the example and the comparative example, the number of evaluations was given by N=10.

As a result, in the multilayer wiring boards 12' according to the comparative example, insulation failure was found in all the cases after 96 hours. On the other hand, in the multilayer wiring boards 12 according to the example, a resistance value was $10^6\Omega$ or more in all the cases after 192 hours, exhibiting good insulation reliability.

<4> Fourth Embodiment

A packaged device, a composite wiring board and a multilayer wiring board according to a fourth embodiment are the same as the packaged device, the composite wiring board and the multilayer wiring board according to the first embodiment, respectively, except that the multilayer wiring board has the following configuration.

Figure 57:
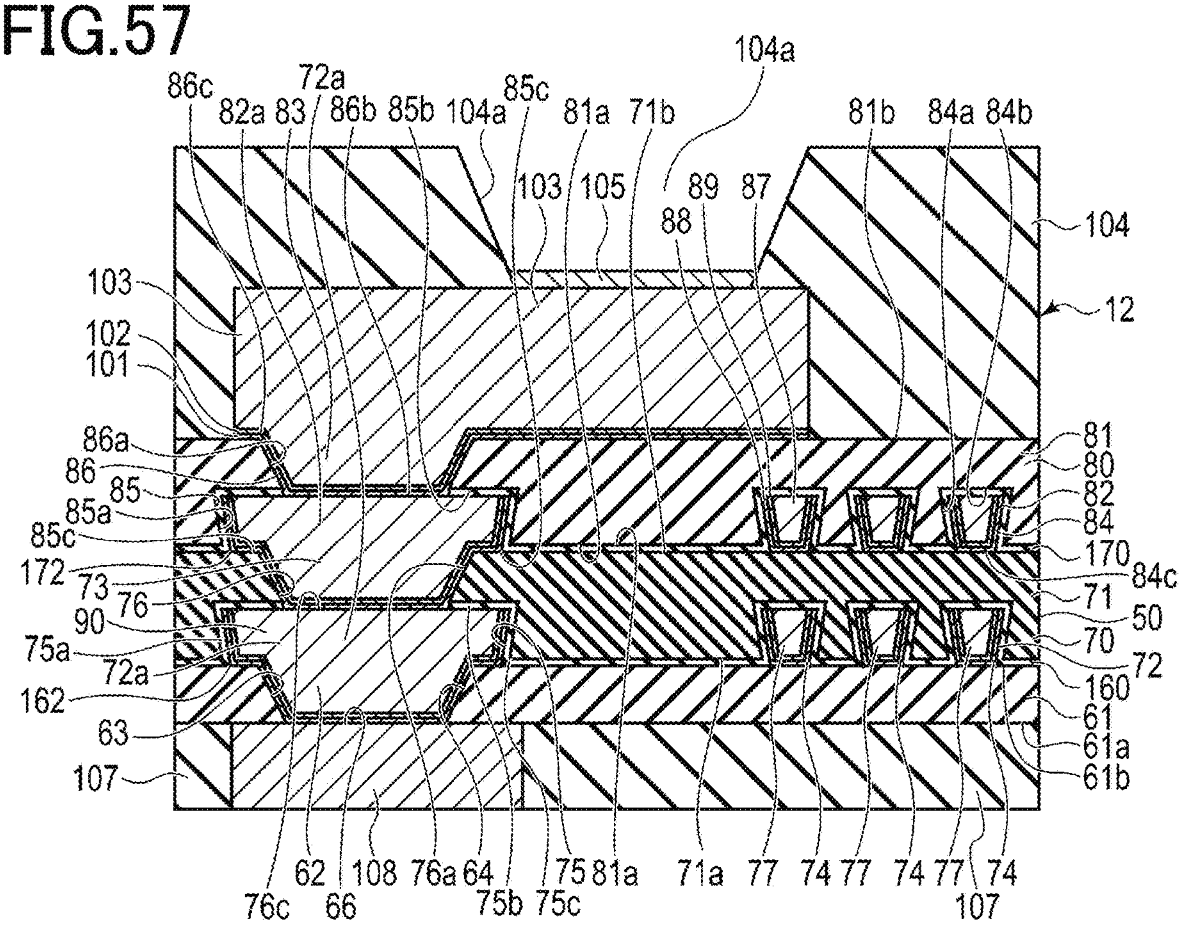
FIG. 57 is a cross-sectional view schematically illustrating a part of a multilayer wiring board used in a packaged device according to a fourth embodiment of the present invention.
Figure 58:
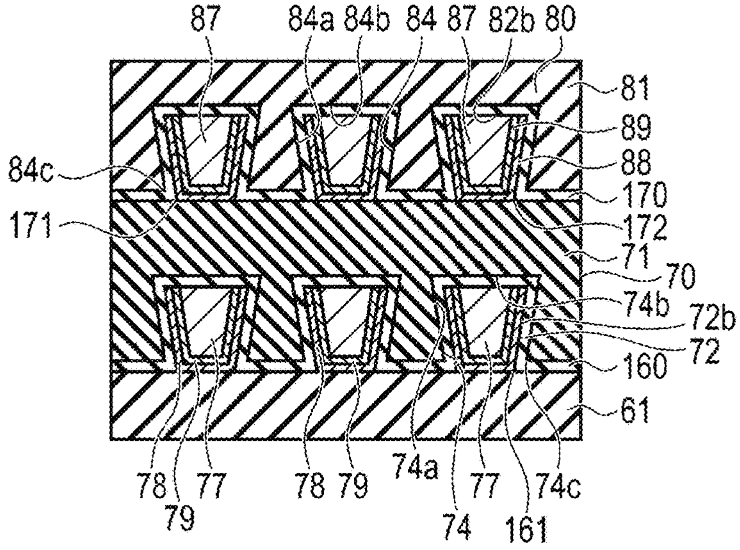
FIG. 58 is an enlarged cross-sectional view schematically illustrating a part of the multilayer wiring board shown in FIG. 57.

FIG. 57 is a cross-sectional view schematically illustrating a part of a multilayer wiring board used in a packaged device according to the fourth embodiment of the present invention. FIG. 58 is an enlarged cross-sectional view schematically illustrating a part of the multilayer wiring board shown in FIG. 57. Specifically, FIG. 58 illustrates a part of the first layer 70, a part of the second layer 80, and the vicinity thereof, which will be described later.

The multilayer wiring board 12 according to the fourth embodiment is the same as the multilayer wiring board 12 according to the first embodiment except that each of the layers 50 further includes an inorganic insulating layer. Specifically, the multilayer wiring board 12 according to the fourth embodiment is the same as the multilayer wiring board 12 according to the first embodiment except that the first layer 70 further includes a first inorganic insulating layer 160 and the second layer 80 further includes a second inorganic insulating layer 170. In addition, the multilayer wiring board 12 is the same as the multilayer wiring board 12 according to the second embodiment except that the first inorganic insulating layer 160 and the second inorganic insulating layer 170 have a structure described below.

The first inorganic insulating layer 160 is conformal to a surface of the first insulating resin layer 71 on the first surface 71*a* side. The first inorganic insulating layer 160 forms an aperture 161 at the position of the aperture 74*c* of the groove section 74, and an aperture 162 at the position of the aperture 75*c* of the land recess 75. Since the land recess 75 communicates with the via recess 76 at the position of the bottom 75*b*, the bottom 75*b* is formed in an annular shape. Therefore, a portion of the first inorganic insulating layer 160 covering the bottom 75*b* is also formed in an annular shape.

The second inorganic insulating layer 170 corresponds to the first inorganic insulating layer 160. The second inorganic insulating layer 170 is conformal to a surface of the second insulating resin layer 81 on the first surface 81*a* side. The second inorganic insulating layer 170 forms an aperture 171 at the position of the aperture 84*c* of the groove section 84, and an aperture 172 at the position of the aperture 85*c* of the land recess 85. The apertures 171 and 172 correspond to the apertures 161 and 162, respectively, formed by the first inorganic insulating layer 160. Since the land recess 85 communicates with the via recess 86 at the position of the bottom 85*b*, the bottom 85*b* is formed in an annular shape. Therefore, a portion of the second inorganic insulating layer 170 covering the bottom 85*b* is also formed in an annular shape.

Next, an example method of producing the multilayer wiring board 12 will be described. FIGS. 59 to 65 are cross-sectional views schematically illustrating an example method of producing the multilayer wiring board 12.

In this method, first, a structure shown in FIG. 16 is obtained by the same method as that described with reference to FIGS. 4 to 16 in the first embodiment.

Figure 59:
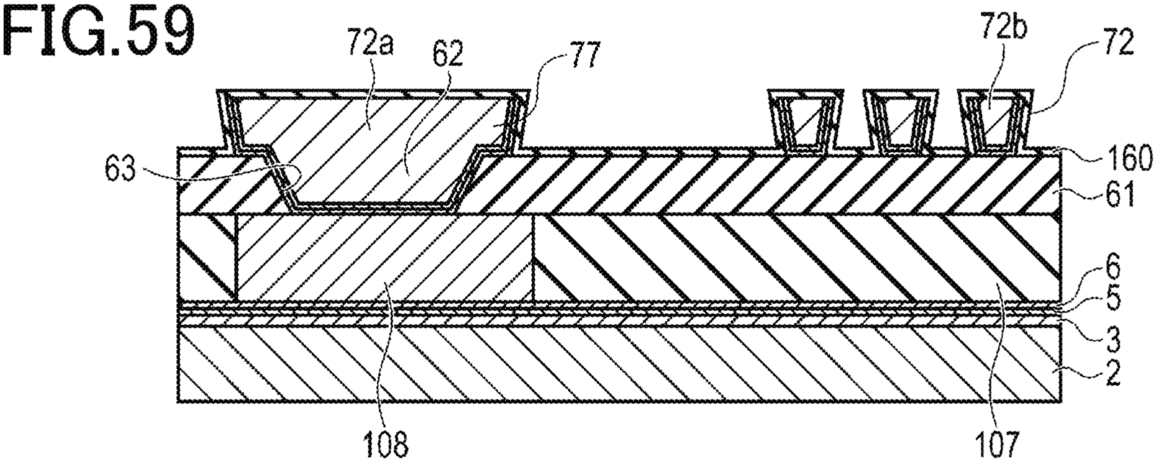
FIG. 59 is a cross-sectional view schematically illustrating one step in the method of producing a multilayer wiring board according to the fourth embodiment of the present invention.

Next, as shown in FIG. 59, a first inorganic insulating layer 160 is formed on the structure shown in FIG. 16 on the insulating resin layer 61 side. The material of the first inorganic insulating layer 160 may include, for example, one or more insulators selected from the group consisting of silicon oxide, silicon nitride, silicon oxynitride, fluorine-doped silicon oxide and carbon-doped silicon oxide.

The first inorganic insulating layer 160 can be formed by, for example, plasma chemical vapor deposition (CVD). The land portion 72*a* and the wiring portion 72*b* have an inverted tapered cross-section. According to the plasma CVD, the first inorganic insulating layer 160 can be formed not only on the upper surfaces of the conductor layer 77 and the insulating resin layer 61, but also on portions of the seed adhesion layer 78 covering the side surfaces of the land portion 72*a* and the wiring portion 72*b*.

In addition, a layer made of a silane coupling agent may be provided between the first inorganic insulating layer 160 and the wiring portion 72*b* and between the first inorganic insulating layer 160 and the land portion 72*a*. By providing a layer made of a silane coupling agent, the adhesion between the first inorganic insulating layer 160 and the seed adhesion layer 78, the adhesion between the first inorganic insulating layer 160 and the seed layer 79, and the adhesion between the first inorganic insulating layer 160 and the conductor layer 77 can be improved. When the adhesion between these layers improves, delamination becomes less likely to occur at the interface between the first inorganic insulating layer 160 and the seed adhesion layer 78, at the interface between the first inorganic insulating layer 160 and the seed layer 79, and at the interface between the first inorganic insulating layer 160 and the conductor layer 77 even when the multilayer wiring board 12 warps due to heat, for example.

Further, the multilayer wiring board 12 of the present embodiment exhibits higher insulation reliability than a configuration obtained by forming an inorganic insulating layer on a wiring portion produced by a conventional semi-additive method. If the semi-additive method is used, the surface of the wiring portion is roughened since the wiring portion is formed by etching.

The roughened surface of the wiring portion causes a decrease in conformability of the inorganic insulating film, leading to formation of pinholes in the inorganic insulating film. Since copper diffuses through the pinholes, the insulation reliability is lowered. Further, if the inorganic insulating film is made thicker in order to eliminate pinholes, the effect of the difference in coefficient of linear thermal expansion between copper and the inorganic insulating film becomes stronger, leading to occurrence of delamination at the copper/inorganic insulating film interface.

Figure 60:
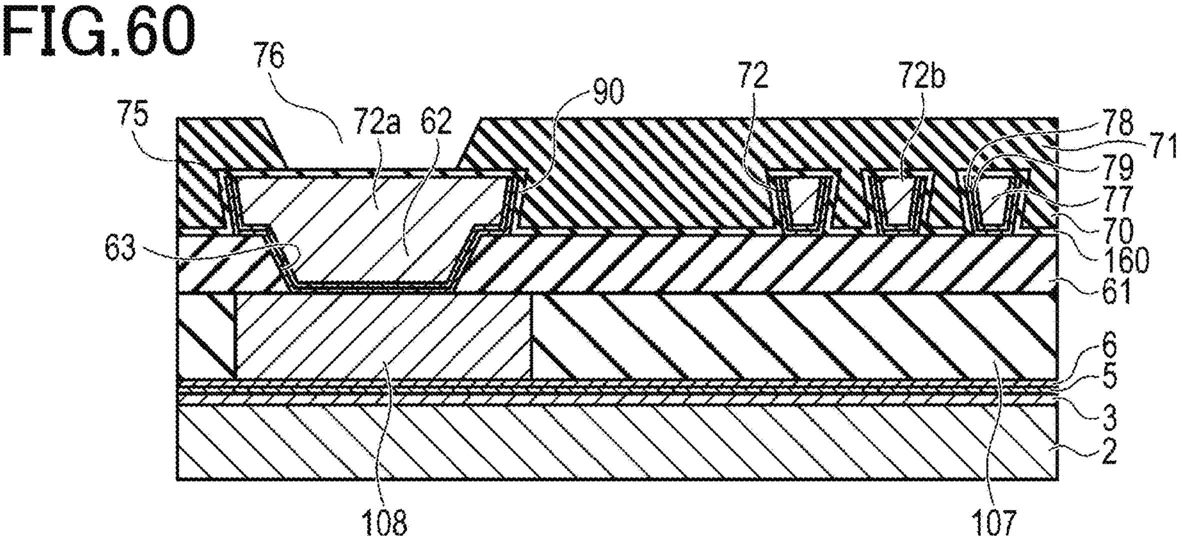
FIG. 60 is a cross-sectional view schematically illustrating another step in the method of producing a multilayer wiring board according to the fourth embodiment of the present invention.

Next, as shown in FIG. 60, a first insulating resin layer 71 having a via recess 76 is formed on the first inorganic insulating layer 160 by the same method as that described above with reference to FIG. 17 in the first embodiment.

Thus, the first layer 70 including the first insulating resin layer 71, the conductor layer 77, the seed adhesion layer 78 and the seed layer 79 and the first inorganic insulating layer 160 is obtained.

Next, a second layer 80 is formed on the foundation layer composed of the first insulating resin layer 71 and the first inorganic insulating layer 160 by the same method as that described above for the first layer 70.

Figure 61:
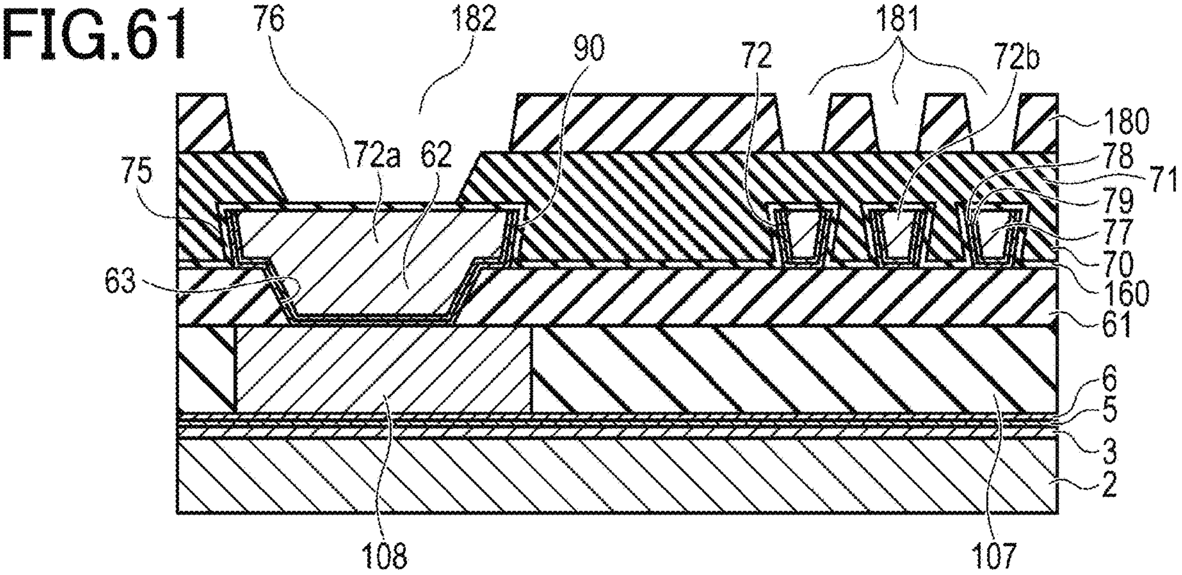
FIG. 61 is a cross-sectional view schematically illustrating still another step in the method of producing a multilayer wiring board according to the fourth embodiment of the present invention.

That is, first, as shown in FIG. 61, a resist layer 180 having a groove 181 and the through hole 182 corresponding to the groove section 84 and the land recess 85, respectively, is formed on the foundation layer of the first insulating resin layer 71 and the first inorganic insulating layer 160 by the same method as that described above for the resist layer 143 with reference to FIG. 12 in the first embodiment. The resist layer 180 is an example of a dummy layer.

A base layer composed of the first insulating resin layer 71 and the first inorganic insulating layer 160

Figure 62:
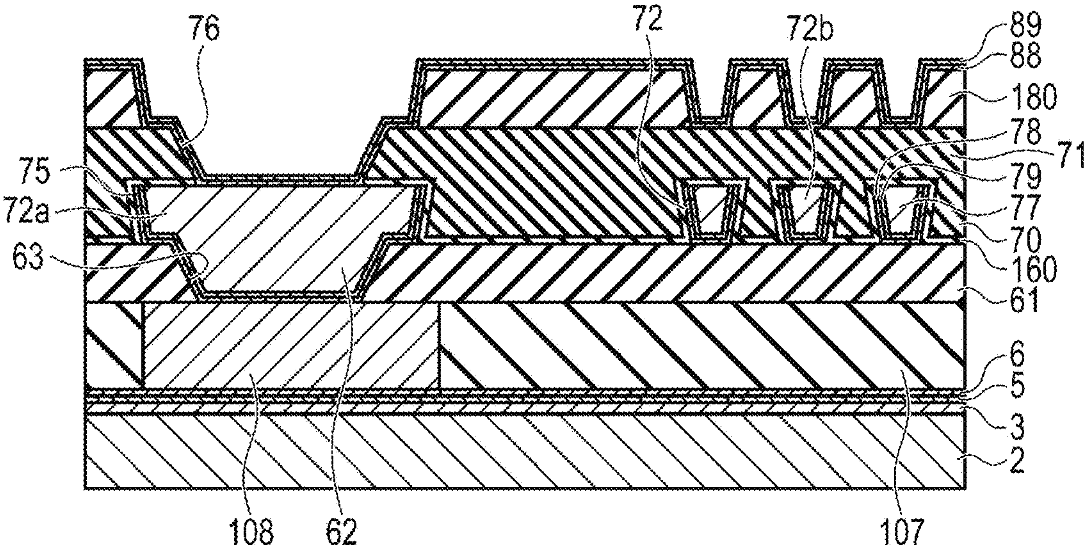
FIG. 62 is a cross-sectional view schematically illustrating still another step in the method of producing a multilayer wiring board according to the fourth embodiment of the present invention.

Next, as shown in FIG. 62, a portion of the first inorganic insulating layer 160 exposed in the via recess 76 is removed by dry etching or the like. Next, the seed adhesion layer 88 and the seed layer 89 are sequentially formed by the same method as that described above for the seed adhesion layer 78 and the seed layer 79, respectively.

This enables electrical connection between the land portion 72*a* and the via portion 73 formed on the land portion 72*a*. The portion of the first inorganic insulating layer 160 exposed in the via recess 76 may be removed after the via recess 76 is formed in the first insulating resin layer 71 and before the resist layer 180 is formed.

Figure 63:
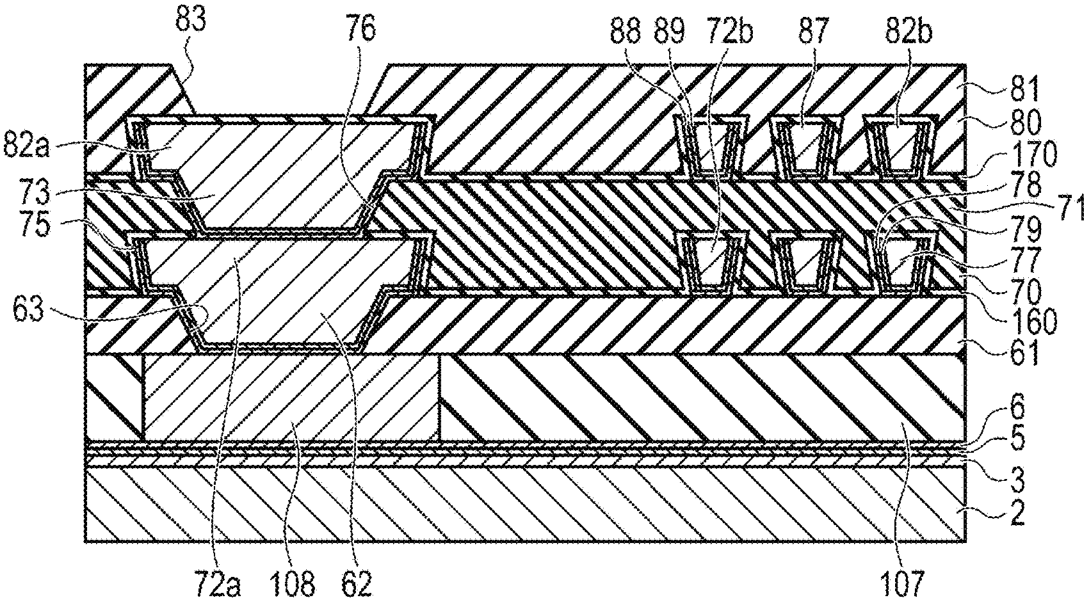
FIG. 63 is a cross-sectional view schematically illustrating still another step in the method of producing a multilayer wiring board according to the fourth embodiment of the present invention.

Next, as shown in FIG. 63, a seed adhesion layer 88, a seed layer 89, a conductor layer 87 including a land portion 82*a*, a wiring portion 82*b* and a via portion 73, a second inorganic insulating layer 170 and a second insulating resin layer 81 are formed by sequentially performing the same steps as those described above with reference to FIGS. 14 to 16, 59 and 60.

Thus, the second layer 80 including the second insulating resin layer 81, the conductor layer 87, the seed adhesion layer 88 and the seed layer 89 and the second inorganic insulating layer 170 is obtained.

Figure 64:
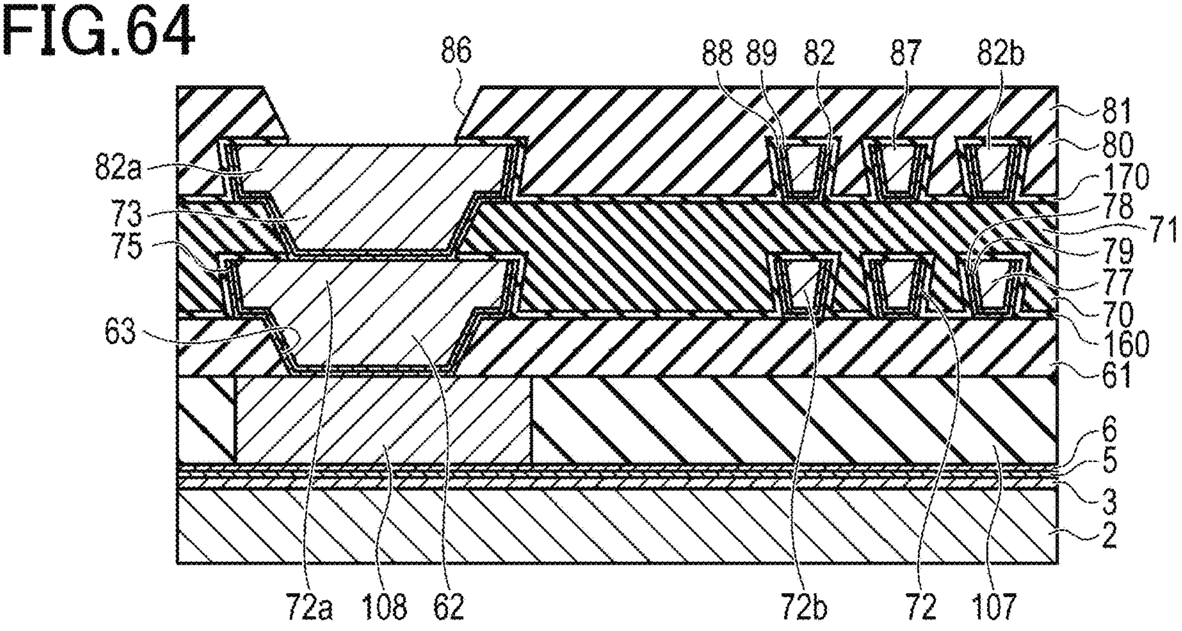
FIG. 64 is a cross-sectional view schematically illustrating still another step in the method of producing a multilayer wiring board according to the fourth embodiment of the present invention.

Next, as shown in FIG. 64, a portion of the second inorganic insulating layer 170 exposed in the via recess 86 is removed by dry etching, for example.

Figure 65:
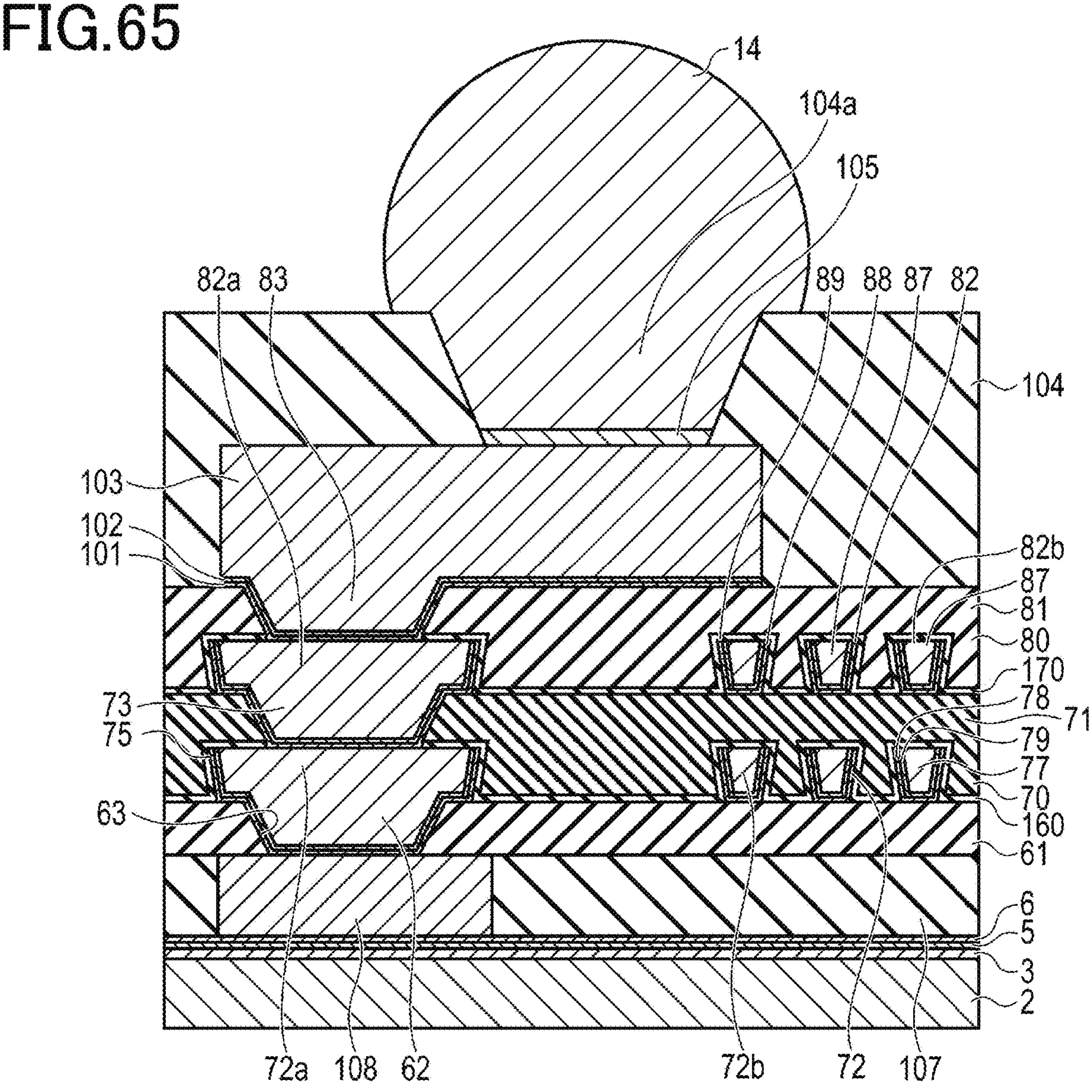
FIG. 65 is a cross-sectional view schematically illustrating one step in the method of producing a packaged device according to the fourth embodiment of the present invention.

Next, the steps described above with reference to FIGS. 19 to 24 in the first embodiment are performed. Thus, as shown in FIG. 65, a multilayer wiring board 12 supported by the support 2, that is, a multilayer wiring board with a support, is completed.

In addition, a composite wiring board and a packaged device according to the fourth embodiment can be produced by the same method as that described above for the first embodiment except that the above multilayer wiring board with a support is used.

In the packaged device configured as described above, the first inorganic insulating layer 160 is interposed between the bottom 74*b* of the groove section 74 and the first insulating resin layer 71 and between the bottom 75*b* of the land recess 75 and the first insulating resin layer 71 in the first layer 70. A portion of the first inorganic insulating layer 160 interposed between the bottom 74*b* and the first insulating resin layer 71 and a portion interposed between the bottom 75*b* and the first insulating resin layer 71 serve as barrier layers that prevent diffusion of metal from the upper surfaces of the land portion 72*a* and the wiring portion 72*b* into the first insulating resin layer 71.

Similarly, the second inorganic insulating layer 170 is interposed between the bottom 84*b* of the groove section 84 and the second insulating resin layer 81 and between the bottom 85*b* of the land recess 85 and the second insulating resin layer 81 in the second layer 80. A portion of the second insulating resin layer 170 interposed between the bottom 84*b* and the second insulating resin layer 81 and a portion interposed between the bottom 85*b* and the second insulating resin layer 81 serve as barrier layers that prevent diffusion of metal from the upper surfaces of the land portion 82*a* and the wiring portion 82*b* into the second insulating resin layer 81.

As a result, the multilayer wiring board 12 described above achieves high insulation reliability. Accordingly, the composite wiring board and the packaged device including the multilayer wiring board 12 also achieve high insulation reliability.

The seed adhesion layers 78 and 88 also serve as barrier layers that prevent diffusion of metal from the conductor layers 77 and 87 to the first insulating resin layer 71 and the second insulating resin layer 81. Further, when the seed layers 79 and 89 are made of a metal material having a lower ionization tendency than the materials of the conductor layer 77 and the conductor layer 87, respectively, the seed layers 79 and 89 also serve as barrier layers that prevent diffusion of metal from the conductor layers 77 and 87 to the first insulating resin layer 71 and the second insulating resin layer 81.

However, portions of the seed adhesion layer 78 and the seed layer 79 covering the side surfaces of the land portion 72*a* and the wiring portion 72*b* tend to become thinner as the distance from the upper surface of the conductor layer 77 increases. Similarly, portions of the seed adhesion layer 88 and the seed layer 89 covering the side surfaces of the land portion 82*a* and the wiring portion 82*b* also tend to become thinner as the distance from the upper surface of the conductor layer 87 increases. As the thickness of the barrier layer decreases, the ability to prevent diffusion of metal decreases.

The first inorganic insulating layer 160 further includes a portion covering the side wall of the land recess 75 and a portion covering the side wall of the groove section 74. Therefore, this structure prevents diffusion of metal from the side surfaces of the land portion 72*a* and the wiring portion 72*b* to the first insulating resin layer 71 compared with a structure in which the first inorganic insulating layer 160 does not include a portion covering the side walls of the land recess 75 and the groove section 74.

The first inorganic insulating layer 160 further includes a portion covering the first surface 71*a* of the first insulating resin layer 71. Similarly, the second inorganic insulating layer 170 further includes a portion covering the first surface 81*a* of the second insulating resin layer 81. Therefore, diffusion of metal from one of the adjacent insulating resin layers to the other is less likely to occur. Further, since the portion of the first inorganic insulating layer 160 covering the first surface 71*a* and the portion of the second inorganic insulating layer 170 covering the first surface 81*a* are provided, the multilayer wiring board 12 becomes less likely to warp or bend.

In the above method, the resist layer 143 is removed after the conductor layer 77 is formed and polished, and the first insulating resin layer 71 is provided instead of using the resist layer 143 as a component of the multilayer wiring board 12. Similarly, the resist layer 180 is removed after the conductor layer 87 is formed and polished, and the second insulating resin layer 81 is provided instead of using the resist layer 180 as a component of the multilayer wiring board 12.

In the steps of forming and polishing the conductor layers 77, 87, and the like, metal may diffuse into the resist layers 143 and 180. Since the above-mentioned multilayer wiring board 12 does not include, as components, the resist layers 143 and 180 into which metal may have diffused, it is advantageous in achieving high insulation reliability.

Next, a configuration of the multilayer wiring board 12 of the present embodiment described above and effects of the method of producing the multilayer wiring board 12 will be described with reference to the multilayer wiring board 150 shown in FIG. 66 as a comparative example.

In the example of the present embodiment, as shown in FIGS. 57 and 58, a gap between the land portion 72*a* and the wiring portion 72*b* is filled with the first insulating resin layer 71. Further, the first inorganic insulating layer 160 is provided on the upper surface and the side surface of the land portion 72*a* and the upper surface and the side surface of the wiring portion 72*b*.

Thus, due to the upper surface and the side surface of the land portion 72*a* being covered with the first inorganic insulating layer 160 and the upper surface and the side surface of the wiring portion 72*b* being covered with the first inorganic insulating layer 160, diffusion of metal from the conductor layer 77 to the first insulating resin layer 71 can be less likely to occur.

The same effects are achieved in the second layer 80. As a result, the reliability of insulation between the plurality of wiring portions 72*b* and insulation between the land portion 72*a* and the wiring portion 72*b* can be improved.

Figure 66:
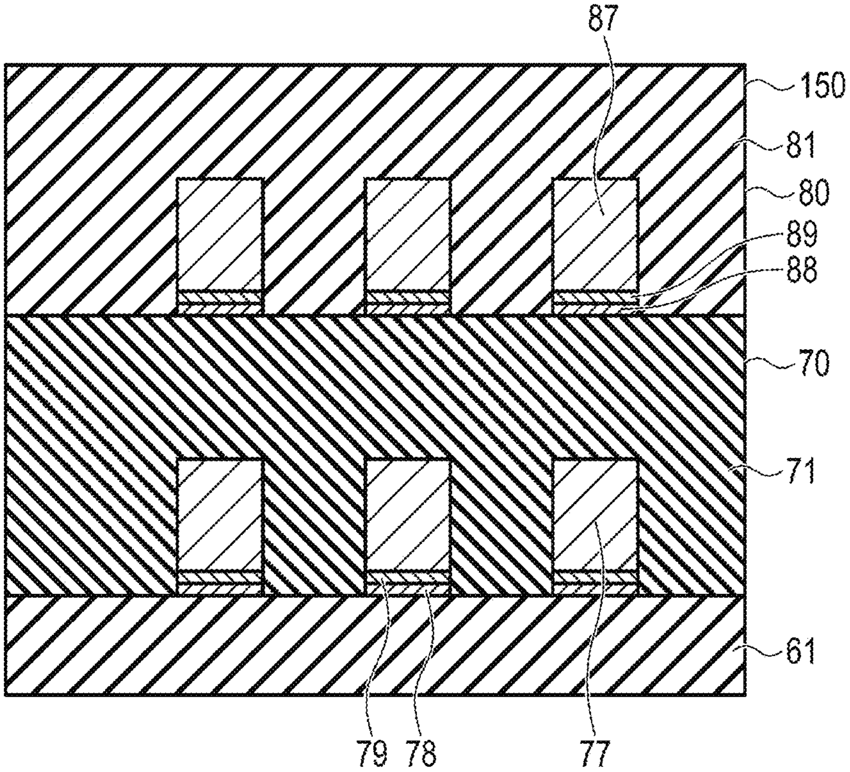
FIG. 66 is a cross-sectional view schematically illustrating a multilayer wiring board according to a comparative example.

As shown in FIG. 66, a comparative example is a multilayer wiring board 150 in which an inner conductor layer and an interlayer connection conductor layer are produced by a semi-additive method which is a known technique. The multilayer wiring board 150 has the same configuration as that of the multilayer wiring board 12 of the present embodiment, but is different in the following points. Further, components of the multilayer wiring board 150 having the same function as those of the multilayer wiring board 12 of the present embodiment are denoted by the same reference signs as those of the multilayer wiring board 12. FIG. 66 is a cross-sectional view illustrating the wiring portion 72*b* of the first layer 70 and the wiring portion 82*b* of the second layer 80 in the multilayer wiring board 150 and the vicinity thereof.

As shown in FIG. 66, the multilayer wiring board 150 of the comparative example is different from the multilayer wiring board 12 of the present embodiment in that the first inorganic insulating layer 160 and the second inorganic insulating layer 170 are not provided. Further, the multilayer wiring board 150 of the comparative example is different from the multilayer wiring board 12 of the present embodiment in that the seed adhesion layer 78 and the seed layer 79 of the first wiring layer 72 do not cover the side surface of the conductor layer 77. Also, the multilayer wiring board 150 of the comparative example is different from the multilayer wiring board 12 in that the seed adhesion layer 88 and the seed layer 89 of the second wiring layer 82 do not cover the side surface of the conductor layer 87.

The structure of the multilayer wiring board 150 of the comparative example will be described with reference to the first layer 70. As shown in FIG. 66, in the multilayer wiring board 150 of the comparative example, the side surface of the conductor layer 77 of the first wiring layer 72 is in contact with the first insulating resin layer 71. That is, the contact area of the first insulating resin layer 71 to the conductor layer 77 is larger than that in the multilayer wiring board 12 of the present embodiment. Therefore, the copper of the conductor layer 77 is likely to diffuse into the first insulating resin layer 71. As a result, the insulation reliability of the first insulating resin layer 71 is likely to decrease. The second layer 80 in the multilayer wiring board 150 of the comparative example is the same as the first layer 70, that is, the insulation reliability of the second insulating resin layer 81 is likely to decrease.

Further, since the multilayer wiring board 150 of the comparative example does not include the first inorganic insulating layer 160 and the second inorganic insulating layer 170, the insulation reliability between the first insulating resin layer 71 and the second insulating resin layer 81 is likely to decrease.

<Verification of Effects>

In order to verify the effects of the present embodiment, the following evaluation was performed for the multilayer wiring board 12 of the present embodiment and the multilayer wiring board 150 of the comparative example.

<Evaluation Method> Evaluation of Insulation Reliability

Bias: Evaluation was performed under the environment of 3.3V, 130° C./85% RH. The wiring rule was L/S=2/2 μm. In the evaluation, the thickness of each insulating resin layer was set to 1 μm, 1.5 μm, 2 μm and 2.5 μm in both the multilayer wiring board 12 and the multilayer wiring board 150.

In the multilayer wiring board 12, the thickness of each of the first inorganic insulating layer 160 and the second inorganic insulating layer 170 was set to 50 nm. After 192 hours under the above bias and environment, a resistance value of $10^6\Omega$ or more was judged as a pass. The number of evaluations for each resin thickness was given by N=10.

<Evaluation Results>

In the multilayer wiring board 150 of the comparative example, insulation failure was found after 96 hours in all the cases regardless of the thickness of the insulating resin layer. On the other hand, in the multilayer wiring board 12 of the present embodiment, the resistance value was $10^6\Omega$ or more after 192 hours regardless of the thickness of the insulating resin layer, exhibiting good insulation reliability.

The above embodiment is merely an example, and specific details of the structure can be modified as appropriate.

In the above example, the first inorganic insulating layer 160 has been described as covering the bottom 74*b* and the side wall of the groove section 74 and the bottom 75*b* and the side wall of the land recess 75. However, the configuration is merely an example, and is not limited thereto. In another example, the first inorganic insulating layer 160 may be configured to cover only the bottom 74*b* of the groove section 74 and the bottom 75*b* of the land recess 75. Further, the first inorganic insulating layer 160 has been described as covering the first surface 71*a* of the first insulating resin layer 71. However, the configuration is merely an example, and is not limited thereto. In another example, the first inorganic insulating layer 160 may be configured not to be provided on the first surface 71*a*.

Similarly, the second inorganic insulating layer 170 has been described as covering the bottom 84*b* and the side wall of the groove section 84 and the bottom 85*b* and the side wall of the land recess 85. However, the configuration is merely an example, and is not limited thereto. In another example, the second inorganic insulating layer 170 may be configured to cover only the bottom 84*b* of the groove section 84 and the bottom 85*b* of the land recess 85. Further, the second inorganic insulating layer 170 has been described as covering the first surface 81*a* of the second insulating resin layer 81. However, the configuration is merely an example, and is not limited thereto. In another example, the second inorganic insulating layer 170 may be configured not to be provided on the first surface 81*a*.

Moreover, in the above example, the configuration of the first layer 70 has been described as an example in which the first layer 70 includes the seed adhesion layer 78 made of titanium, and the seed adhesion layer 78 covers the side surface of the conductor layer 77. The seed adhesion layer 78 made of titanium constitutes the inorganic insulating layer. In the present embodiment, in which the seed adhesion layer 78 is provided, the seed adhesion layer 78 can prevent diffusion of metal from the conductor layer 77 to the first insulating resin layer 71 even if the first inorganic insulating layer 160 does not cover the side walls of the groove section 74 and the land recess 75.

Similarly, in the second layer 80, the seed adhesion layer 88 can prevent diffusion of metal from the conductor layer 87 to the second insulating resin layer 81 even if the second inorganic insulating layer 170 does not cover the side walls of the groove section 84 and the land recess 75.

In the above example, the multilayer wiring board 12 includes the first layer 70 and the second layer 80, but the multilayer wiring board 12 may further include one or more layers which are similar to the first layer 70 and the second layer 80.

The present invention can be applied to semiconductor devices having a wiring substrate including an interposer or the like interposed between a main substrate and an IC chip.

<5> Fifth Embodiment

A packaged device, a composite wiring board and a multilayer wiring board according to a fifth embodiment are the same as the packaged device, the composite wiring board and the multilayer wiring board according to the fourth embodiment, respectively, except that the multilayer wiring board has the following configuration.

Figure 67:
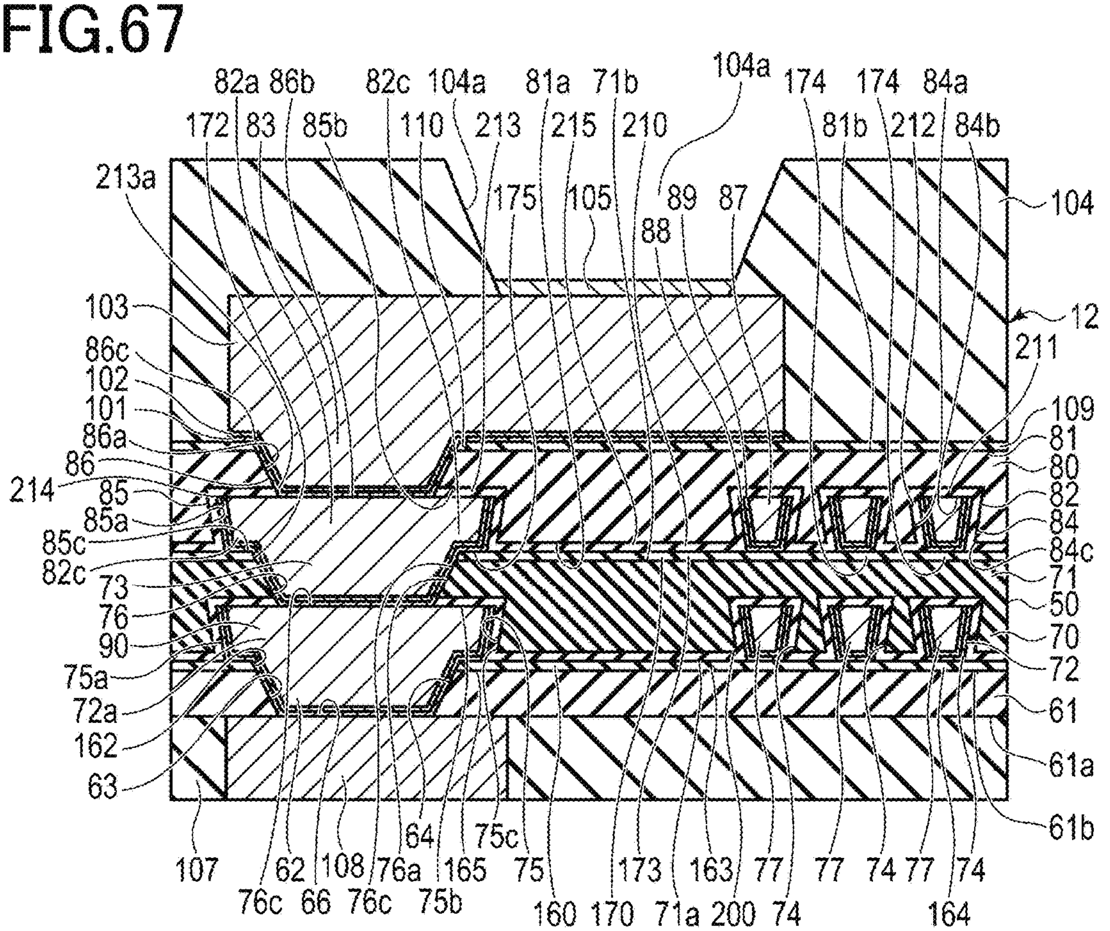
FIG. 67 is a cross-sectional view schematically illustrating a part of a multilayer wiring board used in a packaged device according to a fifth embodiment of the present invention.
Figure 68:
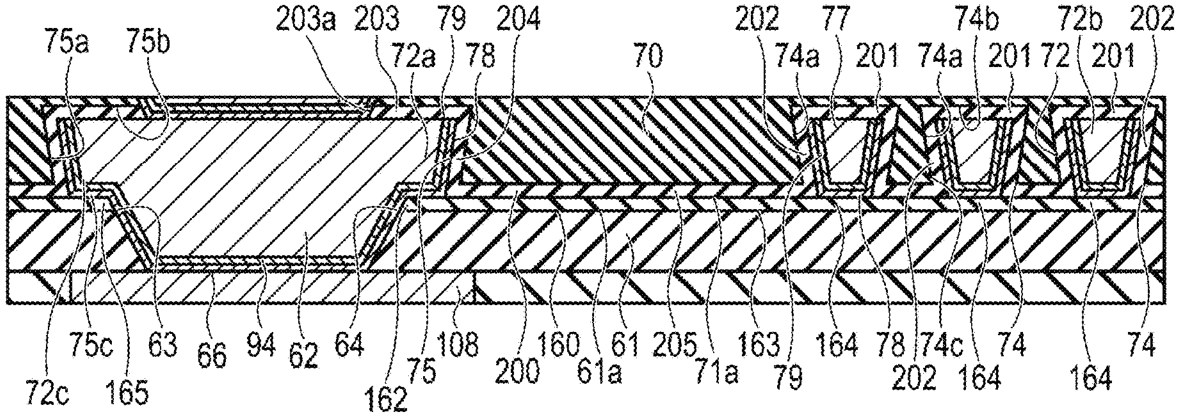
FIG. 68 is an enlarged cross-sectional view schematically illustrating a part of the multilayer wiring board shown in FIG. 67.

FIG. 67 is a cross-sectional view schematically illustrating a part of a multilayer wiring board according to the fifth embodiment. FIG. 68 is an enlarged cross-sectional view schematically illustrating a part of the multilayer wiring board shown in FIG. 67. Specifically, FIG. 68 illustrates a part of the first layer 70, a part of the second layer 80, and the vicinity thereof.

The fifth embodiment corresponds to a combination of the second embodiment and the fourth embodiment. The multilayer wiring board 12 according to the fifth embodiment is the same as the multilayer wiring board 12 according to the fourth embodiment except that each of the layers 50 further includes an inorganic insulating layer as described above for the layers 50 in the second embodiment. Specifically, the multilayer wiring board 12 according to the fifth embodiment is the same as the multilayer wiring board 12 according to the fourth embodiment except that the first layer 70 further includes a first inorganic insulating layer 160 and a second inorganic insulating layer 200 as inorganic insulating layers and the second layer 80 further includes a first inorganic insulating layer 170 and a second inorganic insulating layer 210 as inorganic insulating layers. The first inorganic insulating layers 160 and 170 in FIGS. 67 and 68 correspond to the first inorganic insulating layer 160 and the second inorganic insulating layer 170 in the second embodiment, respectively. Further, the second inorganic insulating layers 200 and 210 in FIGS. 67 and 68 correspond to the first inorganic insulating layer 160 and the second inorganic insulating layer 170 in the fourth embodiment, respectively.

In the multilayer wiring board 12, the first inorganic insulating layer 160 includes a first portion 163 covering the first surface 71*a*, a second portion 164 closing the aperture 74*c* of the groove section 74, and a third portion 165 covering a peripheral portion 72*c* of the land portion 72*a* of the first wiring layer 72 on the first surface 71*a* side, which will be described later. The first inorganic insulating layer 160 has a through hole 162 at a position of the via hole 63 formed in the insulating resin layer 61.

The second inorganic insulating layer 210 includes a fourth portion 211, a fifth portion 212, a sixth portion 213, a seventh portion 214 and an eighth portion 215.

The fourth portion 211 is a portion covering the bottom 84*b* of the groove section 84. The fifth portion 212 is a portion covering the side surface 84*a* of the groove section 84.

The sixth portion 213 is a portion covering the bottom 85*b* of the land recess 85. The sixth portion 213 formed in the land recess 85 communicating with the via recess 86 has a through hole 213*a* at a position of the via recess 86.

The seventh portion 214 is a portion covering the side surface 85*a* of the land recess 85. The eighth portion 215 is a portion interposed between the first surface 81*a* and the first portion 173 covering the first surface 81*a* of the first inorganic insulating layer 170.

Next, an example method of producing the multilayer wiring board 12 will be described. FIGS. 69 to 72 are cross-sectional views schematically illustrating an example method of producing the multilayer wiring board 12.

In this example of the production method, first, a structure shown in FIG. 36 is obtained by the same method as that described with reference to FIGS. 31 to 36, and the like in the second embodiment.

Figure 69:
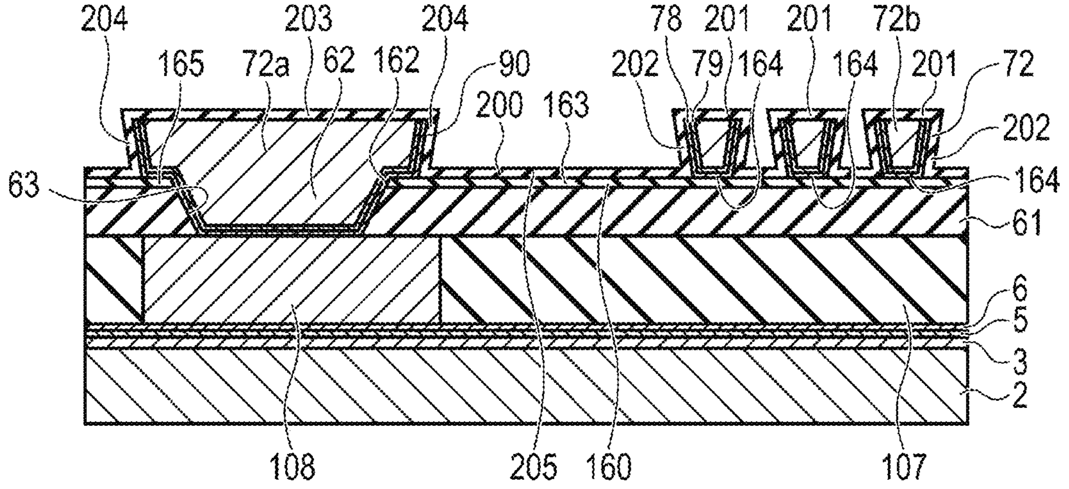
FIG. 69 is a cross-sectional view schematically illustrating one step in the method of producing a multilayer wiring board according to the fifth embodiment of the present invention.

Next, the steps described above with reference to FIG. 59 in the fourth embodiment are performed. Thus, as shown in FIG. 69, a second inorganic insulating layer 200 covering at least the upper surfaces of the land portion 72*a* and the wiring portion 72*b* is formed. In the example of the present embodiment, the second inorganic insulating layer 200 is formed to cover the upper surface of the land portion 72*a*, the upper surface of the wiring portion 72*b*, the upper surface of the seed adhesion layer 78, the upper surface of the seed layer 79, the side surface of the seed adhesion layer 78 and the upper surface of the insulating resin layer 61. The material of the second inorganic insulating layer 200 may be the same or different from the materials of the first inorganic insulating layer 160, the first inorganic insulating layer 170 and the second inorganic insulating layer 210.

In addition, a layer made of a silane coupling agent may be provided between the first inorganic insulating layer 160 and the seed adhesion layer 78 and between the second inorganic insulating layer 200 and the insulating resin layer 71. By providing a layer made of a silane coupling agent, the adhesion between the first inorganic insulating layer 160 and the seed adhesion layer 78 and the adhesion between the second inorganic insulating layer 200 and the insulating resin layer 71 can be improved. When the adhesion between these layers improves, delamination becomes less likely to occur at the interface between the first inorganic insulating layer 160 and the seed adhesion layer 78 and at the interface between the second inorganic insulating layer 200 and the insulating resin layer 71 even when the multilayer wiring board 12 warps due to heat, for example.

Further, the multilayer wiring board 12 of the present embodiment exhibits higher insulation reliability than a configuration obtained by forming an inorganic insulating layer on a wiring portion produced by a conventional semi-additive method. If the semi-additive method is used, the surface of the wiring portion is roughened since the wiring portion is formed by etching.

The roughened surface of the wiring portion causes a decrease in conformability of the inorganic insulating film, leading to formation of pinholes in the inorganic insulating film. Since copper diffuses through the pinholes, the insulation reliability is lowered. Further, if the inorganic insulating film is made thicker in order to eliminate pinholes, the effect of the difference in coefficient of linear thermal expansion between copper and the inorganic insulating film becomes stronger, leading to occurrence of delamination at the copper/inorganic insulating film interface.

Figure 70:
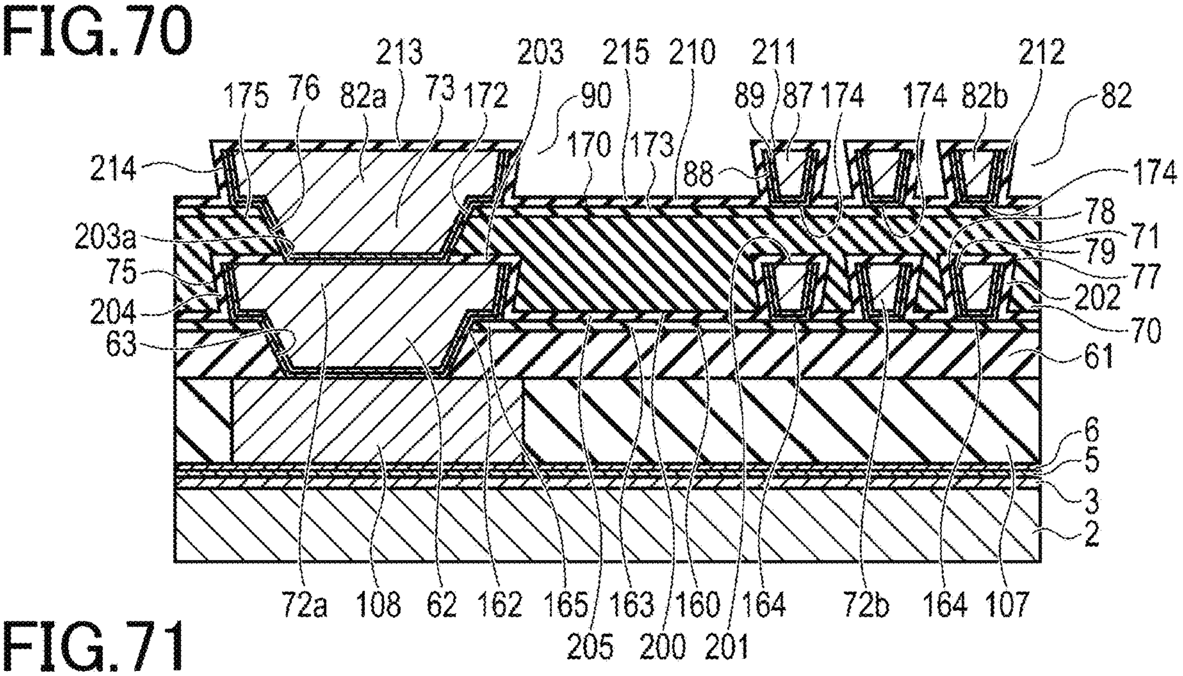
FIG. 70 is a cross-sectional view schematically illustrating another step in the method of producing a multilayer wiring board according to the fifth embodiment of the present invention.

Next, the steps described with reference to FIGS. 60 to 62, the steps described with reference to FIGS. 14 to 16, and the steps described with reference to FIG. 69 are performed. Thus, a structure shown in FIG. 70 is obtained.

Figure 71:
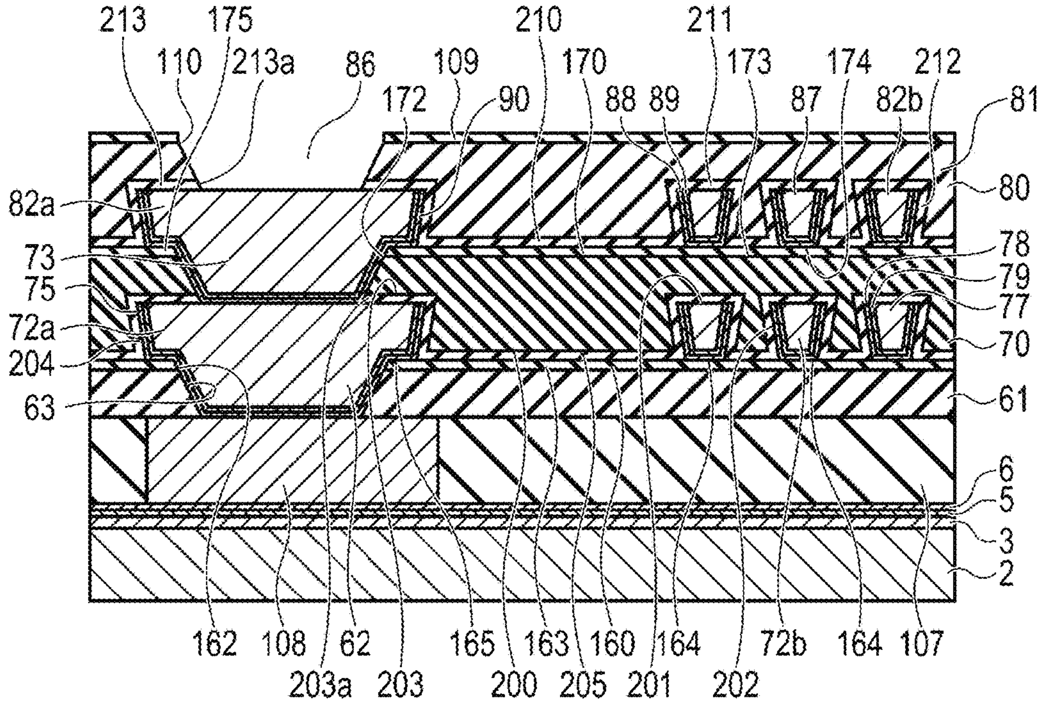
FIG. 71 is a cross-sectional view schematically illustrating still another step in the method of producing a multilayer wiring board according to the fifth embodiment of the present invention.

Next, the steps described with reference to FIGS. 31 to 35, and the steps described with reference to FIG. 64 are performed. Thus, a structure shown in FIG. 71 is obtained.

Figure 72:
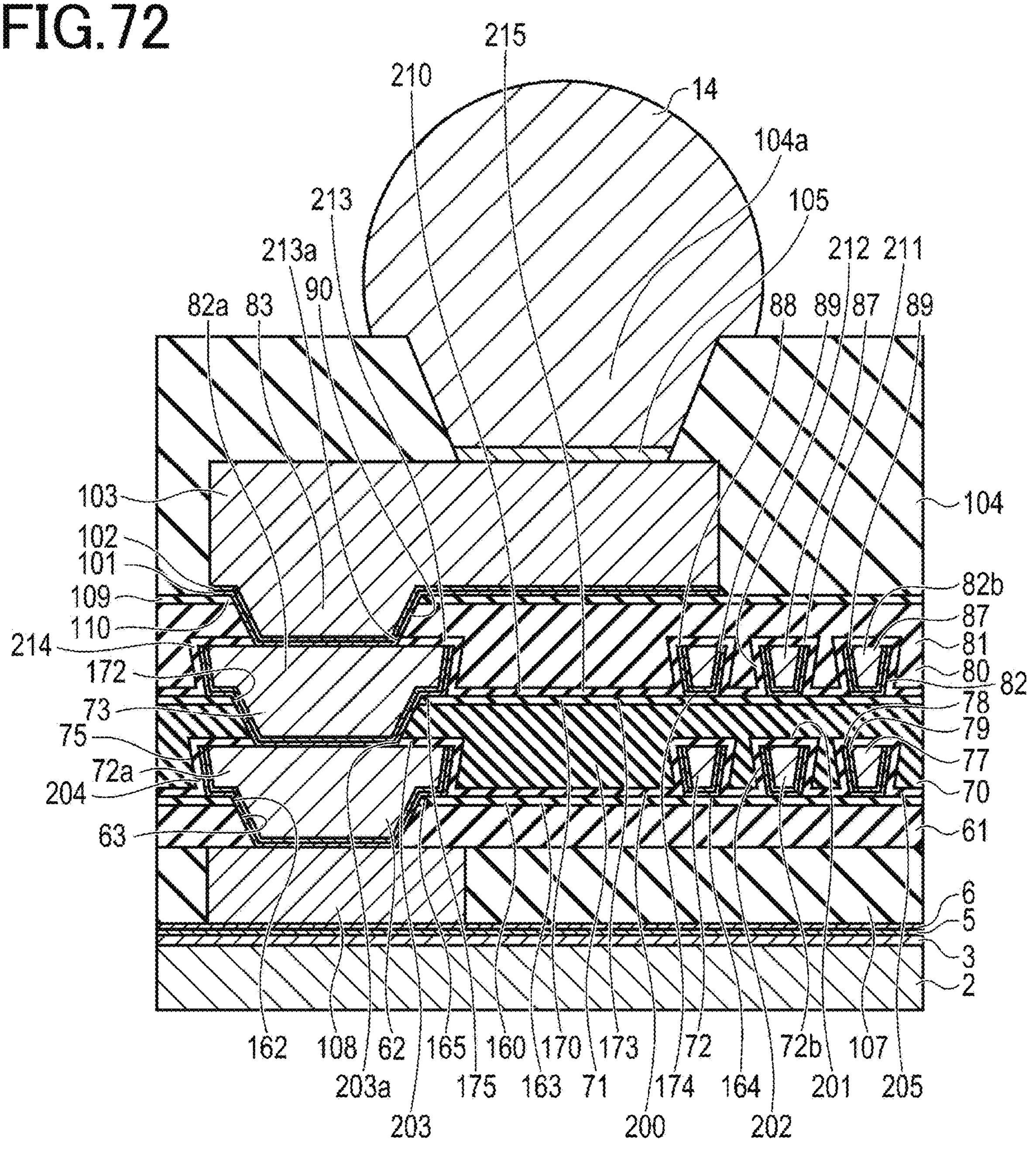
FIG. 72 is a cross-sectional view schematically illustrating one step in the method of producing a packaged device according to the fifth embodiment of the present invention.

Next, the steps described above with reference to FIGS. 19 to 24 in the first embodiment are performed. Thus, as shown in FIG. 72, a multilayer wiring board 12 supported by the support 2, that is, a multilayer wiring board with a support, is completed.

In addition, a composite wiring board and a packaged device according to the fifth embodiment can be produced by the same method as that described above for the first embodiment except that the above multilayer wiring board with a support is used.

In the packaged device configured as described above, the first layer 70 includes the first inorganic insulating layer 160 and the second inorganic insulating layer 200. The first inorganic insulating layer 160 includes a first portion 163 covering the first surface 71*a*, a second portion 164 closing the aperture of the groove section 74, and a third portion 165 covering a peripheral portion of a surface on the first surface 71*a* side of the land portion 72*a*.

The second inorganic insulating layer 200 includes a fourth portion 201 covering the bottom 74*b* of the groove section 74 and a sixth portion 203 covering the bottom 75*b* of the land recess 75. That is, the second inorganic insulating layer 200 is interposed between the upper surface of the land portion 72*a* and the insulating resin layer 71 and between the upper surface of the wiring portion 72*b* and the insulating resin layer 71. The second inorganic insulating layer 200 serves as a barrier layer that prevents diffusion of metal from the upper surfaces of the land portion 72*a* and the wiring portion 72*b* into the insulating resin layer 71.

Similarly, the second layer 80 includes the first inorganic insulating layer 170 and the second inorganic insulating layer 210. The first inorganic insulating layer 170 includes a first portion 173 covering the first surface 81*a* of the second layer 80, a second portion 174 closing the aperture of the groove section 84, and a third portion 175 covering a peripheral portion of a surface on the first surface 81*a* side of the land portion 82*a*.

The second inorganic insulating layer 210 includes a fourth portion 211 covering the bottom 84*b* of the groove section 84 and a sixth portion 213 covering the bottom 85*b* of the land recess 85. That is, the second inorganic insulating layer 210 is interposed between the upper surface of the land portion 82*a* and the insulating resin layer 81 and between the upper surface of the wiring portion 82*b* and the insulating resin layer 81. The second inorganic insulating layer 210 serves as a barrier layer that prevents diffusion of metal from the upper surfaces of the land portion 82*a* and the wiring portion 82*b* into the insulating resin layer 81.

Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, since the first portion 163 of the first inorganic insulating layer 160 covering the first surface 71*a* and the first portion 173 of the first inorganic insulating layer 170 covering the first surface 81*a* improve the rigidity of the first layer 70 and the second layer 80, the multilayer wiring board 12 becomes less likely to warp or bend.

Further, the first inorganic insulating layer 160 serves as a protective layer for the insulating resin layer 61 in removal of the resist layer 190 and the resist layer 143. Therefore, the insulating resin layer 61 can be protected when the resist layer 190 and the resist layer 143 are removed. Similarly, the first inorganic insulating layer 170 of the second layer 80 can protect the insulating resin layer 71.

Moreover, the first inorganic insulating layer 160 can be used as a mask for forming the via hole 63 of the insulating resin layer 61. Similarly, the first inorganic insulating layer 170 can be used as a mask for forming the via recess 76 of the insulating resin layer 71.

In the above method, the resist layer 143 is removed after the conductor layer 77 is formed and polished, and the insulating resin layer 71 is provided instead of using the resist layer 143 as a component of the multilayer wiring board 12. Similarly, the resist layer 190 is removed after the conductor layer 87 is formed and polished, and the insulating resin layer 81 is provided instead of using the resist layer 190 as a component of the multilayer wiring board 12.

In the steps of forming and polishing the conductor layers 77, 87, and the like, metal may diffuse into the resist layers 143 and 190. Since the above-mentioned multilayer wiring board 12 does not include, as components, the resist layers 143 and 190 into which metal may have diffused, it is advantageous in achieving high insulation reliability.

In the first layer 70, the second inorganic insulating layer 200 further includes a seventh portion 204 covering the side surface 75*a* which is a side wall of the land recess 75, a fifth portion 202 covering the side surface 74*a* which is a side wall of the groove section 74, and an eighth portion 205 interposed between the first surface 71*a* and the first portion 163 of the first inorganic insulating layer 160 covering the first surface 71*a*.

In the second layer 80, the second inorganic insulating layer 210 further includes a seventh portion 214 covering the side surface 85*a* which is a side wall of the land recess 85, a fifth portion 212 covering the side surface 84*a* which is a side wall of the groove section 84, and an eighth portion 205 interposed between the first surface 81*a* and the first portion 173 of the first inorganic insulating layer 170 covering the first surface 81*a*.

Therefore, the structure prevents diffusion of metal from the side surfaces of the land portions 72*a* and 82*a* and the wiring portions 72*b* and 82*b* to the insulating resin layers 71 and 81 compared with a structure in which the second inorganic insulating layers 200 and 210 do not include portions covering the side walls of the land recesses 75 and 85 and the groove sections 74 and 84. As a result, the multilayer wiring board 12 described above achieves high insulation reliability. Accordingly, the composite wiring board and the packaged device including the multilayer wiring board 12 also achieve high insulation reliability.

Further, since the eighth portion 205 interposed between the first surface 71*a* and the first portion 163 covering the first surface 71*a* and the eighth portion 215 interposed between the first surface 81*a* the first portion 173 covering the first surface 81*a* improve the rigidity of the first layer 70 and the second layer 80, the multilayer wiring board 12 becomes less likely to warp or bend.

The insulating resin layer 71 and the insulating resin layer 81 are made of a non-photosensitive resin. Therefore, the insulating resin layer 71 and the insulating resin layer 81 can achieve excellent insulating properties. As a result, the multilayer wiring board 12 described above achieves high insulation reliability. Accordingly, the composite wiring board and the packaged device including the multilayer wiring board 12 also achieve high insulation reliability.

The seed adhesion layers 78 and 88 also serve as barrier layers that prevent diffusion of metal from the conductor layers 77 and 87 to the insulating resin layer 71 and the insulating resin layer 81. Further, when the seed layers 79 and 89 are made of a metal material having a lower ionization tendency than the materials of the conductor layer 77 and the conductor layer 87, respectively, the seed layers 79 and 89 also serve as barrier layers that prevent diffusion of metal from the conductor layers 77 and 87 to the insulating resin layer 71 and the insulating resin layer 81.

Moreover, since the seed adhesion layers 78 and 88 cover the lower surfaces in addition to the side surfaces of the land portions 72*a* and 82*a*, the via portions 73 and 83, and the groove sections 74 and 84, in addition to the side surfaces thereof, the seed adhesion layers 78 and 88 can further prevent diffusion of metal from the conductor layers 77 and 87 to the insulating resin layers 71 and 81.

Portions of the seed adhesion layer 78 and the seed layer 79 covering the side surfaces of the land portion 72*a* and the wiring portion 72*b* tend to become thinner as the distance from the upper surface of the conductor layer 77 increases. Similarly, portions of the seed adhesion layer 88 and the seed layer 89 covering the side surfaces of the land portion 82*a* and the wiring portion 82*b* also tend to become thinner as the distance from the upper surface of the conductor layer 87 increases. As the thickness of the barrier layer decreases, the ability to prevent diffusion of metal decreases.

On the other hand, in the present embodiment, the second inorganic insulating layer 200 includes, as described above, a portion covering the side surface 75*a* which is a side wall of the land recess 75, and a portion covering the side surface 74*a* which is a side wall of the groove section 74. The second inorganic insulating layer 210 includes a portion covering the surface 75*a* which is a side wall of the land recess 85, and a portion covering the side surface 84*a* which is a side wall of the groove section 84.

Therefore, even when portions of the seed adhesion layer 78 and the seed layer 79 covering the side surfaces of the land portion 72*a* and the wiring portion 72*b* and portions of the seed adhesion layer 88 and the seed layer 89 covering the side surfaces of the land portion 82*a* and the wiring portion 72*b* are thin, the second inorganic insulating layers 200 and 210 prevent diffusion of metal from the side surfaces of the land portion 72*a* and the wiring portion 72*b* to the insulating resin layer 71.

Next, a configuration of the multilayer wiring board 12 of the present embodiment described above and effects of the method of producing the multilayer wiring board 12 will be described with reference to the multilayer wiring board 150 shown in FIG. 66*s* a comparative example.

In the example of the present embodiment, as shown in FIGS. 67 and 68, a gap between the land portion 72*a* and the wiring portion 72*b* is filled with the insulating resin layer 71. The first inorganic insulating layer 160 includes the first portion 163 covering the first surface 71*a* of the insulating resin layer 71. Further, a gap between the land portion 82*a* and the wiring portion 82*b* is filled with the insulating resin layer 81. The first inorganic insulating layer 170 includes the first portion 173 covering the first surface 81*a* of the insulating resin layer 81.

Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, the side surfaces of the land portions 72*a* and 82*a* of the interlayer connection conductor layer 90 are in contact with the insulating resin layers 71 and 81 via the seed adhesion layers 78 and 88, respectively. By using titanium, which has good adhesion to the insulating resin layers 71 and 81, for the seed adhesion layers 78 and 88, it is possible to prevent delamination of the interlayer connection conductor layer 90 from the insulating resin layers 71 and 81 due to a difference in coefficient of linear thermal expansion between copper and resin during a temperature cycle test.

<Verification of Effects>

In order to verify the effects of the present embodiment, the following evaluation was performed for the multilayer wiring board 12 of the present embodiment and the multilayer wiring board 150 of the comparative example.

<Evaluation Method> Evaluation of Insulation Reliability

Bias: Evaluation was performed under the environment of 3.3V, 130° C./85% RH. The wiring rule was L/S=2/2 μm. In the evaluation, the thickness of each insulating resin layer was set to 1 μm, 1.5 μm, 2 μm and 2.5 μm in both the multilayer wiring board 12 and the multilayer wiring board 150.

In the multilayer wiring board 12, the thickness of each of the first inorganic insulating layer 160 and the first inorganic insulating layer 170 was set to 50 nm. After 192 hours under the above bias and environment, a resistance value of $10^6\Omega$ or more was judged as a pass. The number of evaluations for each resin thickness was given by N=10.

<Evaluation Results> Evaluation of Insulation Reliability

In the multilayer wiring board 150 of the comparative example, insulation failure was found after 96 hours in all the cases regardless of the thickness of the insulating resin layer. On the other hand, in the multilayer wiring board 12 of the present embodiment, a resistance value was $10^6\Omega$ or more after 192 hours regardless of the thickness of the insulating resin layer, exhibiting good insulation reliability.

The above embodiment is merely an example, and specific details of the structure can be modified as appropriate.

Moreover, in the above example, the configuration of the first layer 70 has been described as an example in which the first layer 70 includes the seed adhesion layer 78 made of titanium, and the seed adhesion layer 78 covers the side surface of the conductor layer 77. The seed adhesion layer 78 made of titanium constitutes the inorganic insulating layer. In the present embodiment, in which the seed adhesion layer 78 is provided, the second inorganic insulating layer 200 may have a configuration that does not include the fifth portion 202 covering the side wall of the groove section 74 and the seventh portion 204 covering the side wall of the land recess 75. Even with this configuration, the seed adhesion layer 78 can prevent diffusion of metal from the conductor layer 77 to the insulating resin layer 71.

Similarly, in the second layer 80, the second inorganic insulating layer 210 may have a configuration that does not include the fifth portion 212 covering the side wall of the groove section 84 and the seventh portion 214 covering the side wall of the land recess 75. Even with this configuration, the seed adhesion layer 88 can prevent diffusion of metal from the conductor layer 87 to the insulating resin layer 81.

In the above example, the second inorganic insulating layer 200 has been described as including the eighth portion 205 interposed between the first surface 71*a* and the first portion 163 covering the first surface 71*a*. However, the configuration is merely an example, and is not limited thereto. In another example, the second inorganic insulating layer 200 may be configured not to include the eighth portion 205. Similarly, the second inorganic insulating layer 210 has been described as including the eighth portion 205 interposed between the first surface 81*a* and the first portion 173 covering the first surface 81*a*. However, the configuration is merely an example, and is not limited thereto. In another example, the second inorganic insulating layer 200 may be configured not to include the eighth portion 205.

In the above example, the multilayer wiring board 12 includes the first layer 70 and the second layer 80, but the multilayer wiring board 12 may further include one or more layers which are similar to the first layer 70 and the second layer 80.

The present invention can be applied to semiconductor devices having a wiring substrate including an interposer or the like interposed between a main substrate and an IC chip.

<6> Sixth Embodiment

A packaged device, a composite wiring board and a multilayer wiring board according to a sixth embodiment are the same as the packaged device, the composite wiring board and the multilayer wiring board according to the fourth embodiment, respectively, except that the multilayer wiring board has the following configuration.

Figure 73:
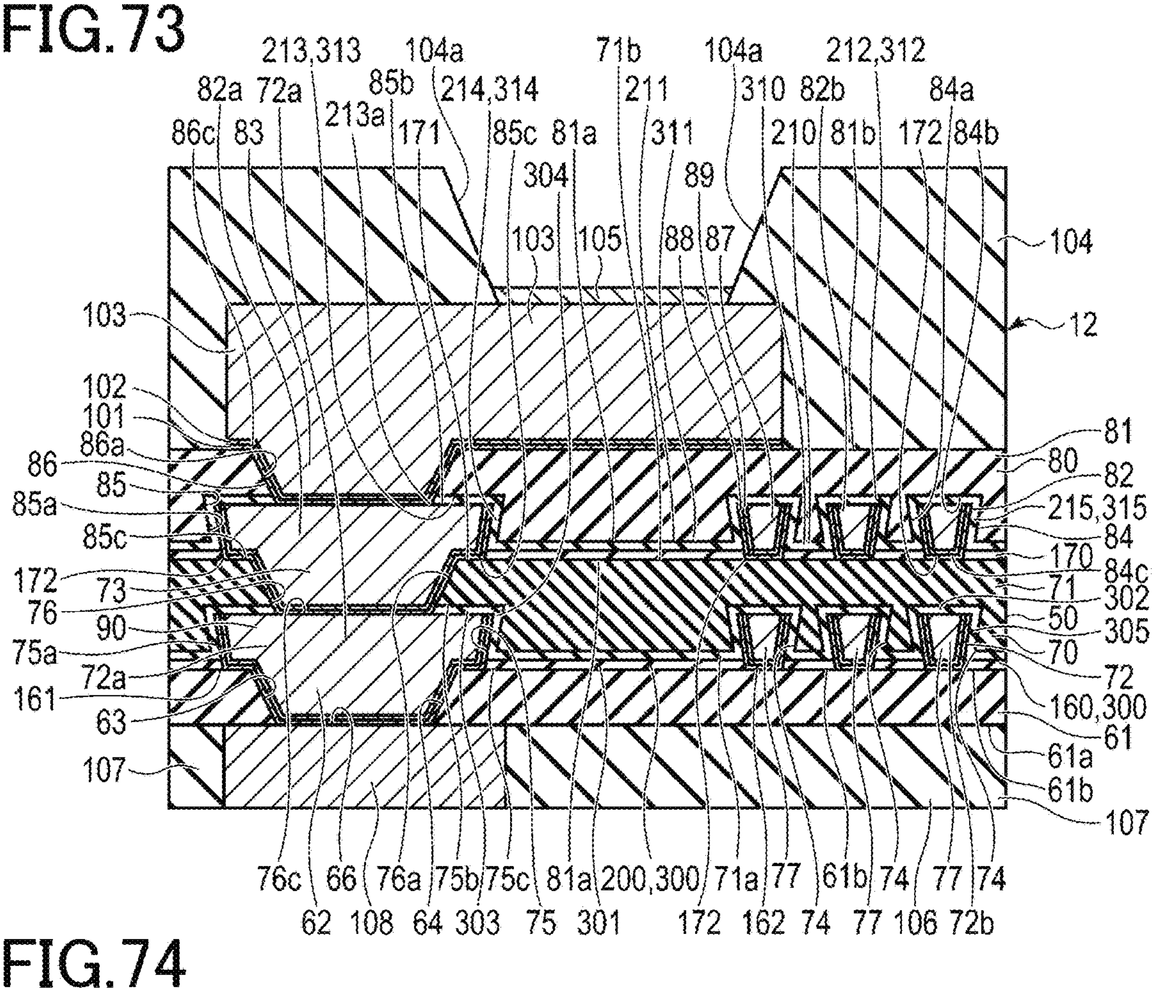
FIG. 73 is a cross-sectional view schematically illustrating a multilayer wiring board included in a packaged device according to a sixth embodiment of the present invention.
Figure 74:
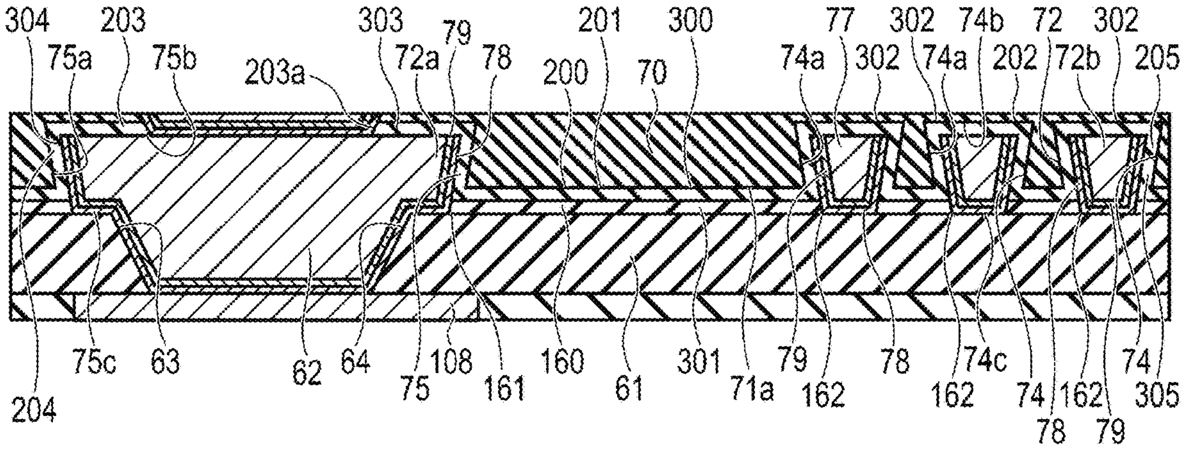
FIG. 74 is an enlarged cross-sectional view illustrating a part of the multilayer wiring board shown in FIG. 73.

FIG. 73 is a cross-sectional view schematically illustrating a part of a multilayer wiring board according to the sixth embodiment. FIG. 74 is an enlarged cross-sectional view schematically illustrating a part of the multilayer wiring board shown in FIG. 73. Specifically, FIG. 74 illustrates a part of the first layer 70, a part of the second layer 80, and the vicinity thereof.

From one viewpoint, the multilayer wiring board 12 according to the sixth embodiment is the same as the multilayer wiring board 12 according to the fourth embodiment except that the inorganic insulating layers included in the layers 50 are formed such that a portion interposed between the insulating resin layers is thicker than a portion interposed between the insulating resin layer and the conductor layer.

From another viewpoint, the sixth embodiment corresponds to a combination of the third embodiment and the fourth embodiment. The multilayer wiring board 12 according to the sixth embodiment is the same as the multilayer wiring board 12 according to the fourth embodiment except that each of the layers 50 further includes an inorganic insulating layer as described above for the layers 120 in the third embodiment. Specifically, the multilayer wiring board 12 according to the sixth embodiment is the same as the multilayer wiring board 12 according to the fourth embodiment except that the first layer 70 further includes a first inorganic insulating layer 160 and a second inorganic insulating layer 200 as inorganic insulating layers and the second layer 80 further includes a first inorganic insulating layer 170 and a second inorganic insulating layer 210 as inorganic insulating layers. Each of the first inorganic insulating layers 160 and 170 in FIGS. 73 and 74 corresponds to the inorganic insulating layer 1202 in the third embodiment. Further, the second inorganic insulating layers 200 and 210 in FIGS. 73 and 74 correspond to the first inorganic insulating layer 160 and the second inorganic insulating layer 170 in the fourth embodiment, respectively.

In the multilayer wiring board 12, the first layer 70 includes the insulating resin layer 71, the wiring layer 72 and the inorganic insulating layer 300. The inorganic insulating layer 300 includes a first portion 301 covering the first surface 71*a*, a second portion 302 covering the bottom 74*b* of the groove section 74, a third portion 303 covering the bottom 75*b* of the land recess 75, a fourth portion 304 covering the side surface 75*a* which is a side wall of the land recess 75, and a fifth portion 305 covering the side surface 74*a* which is a side wall of the groove section 74. The first portion 301 is thicker than each of the second portion 302, the third portion 303, the fourth portion 304 and the fifth portion 305. The inorganic insulating layer 300 may not necessarily include the fourth portion 304 and the fifth portion 305.

The first portion 301 preferably has a thickness in a range of 50 nm or more and 1,000 nm or less, and more preferably in a range of 100 nm or more and 500 nm or less. With an increase in thickness of the first portion 301, the multilayer wiring board 12 becomes less likely to warp or bend. However, increasing the thickness of the first portion 301 increases the cost.

The portion of the inorganic insulating layer 300 other than the first portion 301 preferably has a thickness in a range of 10 nm or more and 500 nm or less, and more preferably in a range of 50 nm or more and 300 nm or less. With an increase in thickness, diffusion of metal from the conductor layer 77 to the insulating resin layer 71 becomes less likely to occur. However, increasing the thickness increases the cost.

In the example of the present embodiment, the first portion 301 of the inorganic insulating layer 300 has a two-layer structure, and a portion of the inorganic insulating layer 300 other than the first portion 301 has a single-layer structure. Specifically, in the example of the present embodiment, the inorganic insulating layer 300 includes the first inorganic insulating layer 160 and the second inorganic insulating layer 200.

The first inorganic insulating layer 160 covers the first surface 71*a* with the second inorganic insulating layer 200 interposed therebetween. The first inorganic insulating layer 160 has a through hole 161 at a position of the aperture 75*c* of the land recess 75. Further, the first inorganic insulating layer 160 has a slit 162 at a position of the aperture 74*c* of the groove section 74.

The second inorganic insulating layer 200 extends across the entire inorganic insulating layer 300. The second inorganic insulating layer 200 includes an interposed portion 201, a first bottom covering portion 202, a second bottom covering portion 203, a first side wall covering portion 204 and a second side wall covering portion 205.

The interposed portion 201 is a portion interposed between the first surface 71*a* and the first inorganic insulating layer 160. The interposed portion 201 constitutes the first portion 301 of the inorganic insulating layer 300 together with the first inorganic insulating layer 160.

The first bottom covering portion 202 is a portion covering the bottom 74*b* of the groove section 74. The first bottom covering portion 202 constitutes the second portion 302 of the inorganic insulating layer 300.

The second bottom covering portion 203 is a portion covering the bottom 75*b* of the land recess 75. The second bottom covering portion 203 constitutes the third portion 303 of the inorganic insulating layer 300. The second bottom covering portion 203 formed in the land recess 75 communicating with the via recess 76 has a through hole 203*a* at a position of the via recess 76.

The first side wall covering portion 204 is a portion covering the side wall of the land recess 75. The first side wall covering portion 204 constitutes the fourth portion 304 of the inorganic insulating layer 300.

The second side wall covering portion 205 is a portion covering the side wall of the groove section 74. The second side wall covering portion 205 constitutes the fifth portion 305 of the inorganic insulating layer 300.

The second layer 80 has the same structure as the first layer 70. The second layer 80 includes the insulating resin layer 81, the wiring layer 82, the first inorganic insulating layer 170 and the second inorganic insulating layer 210. The insulating resin layer 81, the wiring layer 82, the first inorganic insulating layer 170 and the second inorganic insulating layer 210 correspond to the insulating resin layer 71, the wiring layer 72, the first inorganic insulating layer 160 and the second inorganic insulating layer 200, respectively.

The first inorganic insulating layer 170 covers the first surface 81*a* of the insulating resin layer 81 with the second inorganic insulating layer 210 interposed therebetween. The first inorganic insulating layer 170 has the through hole 171 and the slit 172 at positions of the land recess 75 and the groove section 74, respectively. The through hole 171 and the slit 172 correspond to the through hole 161 and the slit 162 of the first inorganic insulating layer 160, respectively.

The second inorganic insulating layer 210 includes an interposed portion 211, a first bottom covering portion 212, a second bottom covering portion 213, a first side wall covering portion 214 and a second side wall covering portion 215.

The interposed portion 211 is a portion interposed between the first surface 81*a* and the first inorganic insulating layer 170. The first bottom covering portion 212 is a portion covering the bottom 84*b* of the groove section 84. The second bottom covering portion 213 is a portion covering the bottom 85*b* of the land recess 85. The second bottom covering portion 213 formed in the land recess 85 communicating with the via recess 86 has a through hole 213*a* at a position of the via recess 86. The first side wall covering portion 214 is a portion covering the side surface 85*a* which is a side wall of the land recess 85. The second side wall covering portion 215 is a portion covering the side surface 84*a* which is a side wall of the groove section 84.

In the second layer 80, the first inorganic insulating layer 170 and the second inorganic insulating layer 210 constitute an inorganic insulating layer 310, which corresponds to the inorganic insulating layer 300 of the first layer 70. The inorganic insulating layer 310 includes a first portion 311, a second portion 312, a third portion 313, a fourth portion 314 and a fifth portion 315.

The first portion 311 is a portion covering the first surface 81*a*, and is composed of the first inorganic insulating layer 170 and the interposed portion 211 of the second inorganic insulating layer 210. The second portion 312 is a portion covering the bottom 84*b* of the groove section 84, and is composed of the first bottom covering portion 212 of the second inorganic insulating layer 210. The third portion 313 is a portion covering the bottom 85*b* of the land recess 85, and is composed of the second bottom covering portion 213 of the second inorganic insulating layer 210. The fourth portion 314 is a portion covering the side surface 85*a* which is a side wall of the land recess 85, and is composed of the first side wall covering portion 214 of the second inorganic insulating layer 200. The fifth portion 315 is a portion covering the side surface 84*a* which is a side wall of the groove section 84, and is composed of the second side wall covering portion 215 of the second inorganic insulating layer 200.

Next, an example method of producing the multilayer wiring board 12 will be described. FIGS. 75 to 85 are cross-sectional views schematically illustrating an example method of producing the multilayer wiring board 12 according to the sixth embodiment.

Figure 75:
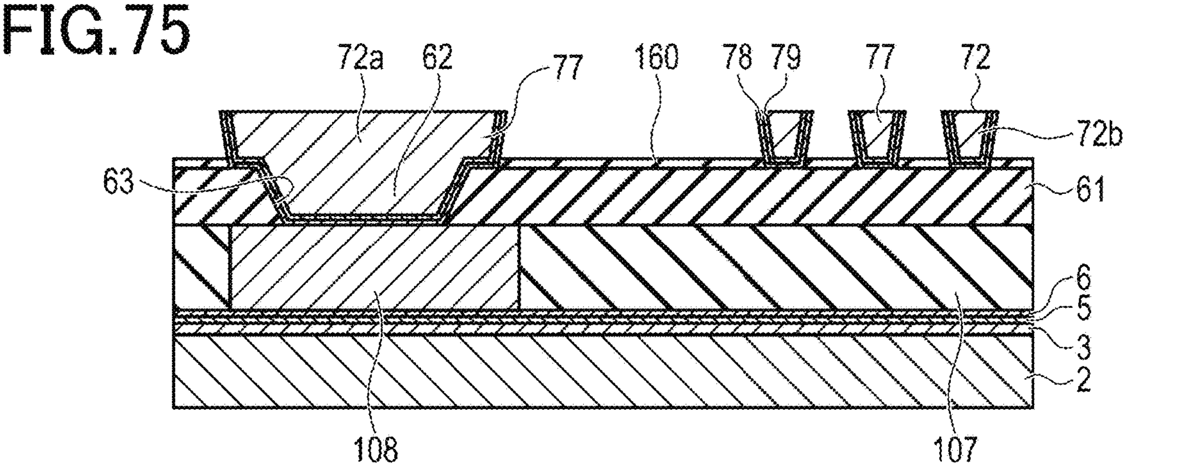
FIG. 75 is a cross-sectional view schematically illustrating one step in the method of producing a multilayer wiring board according to the sixth embodiment of the present invention.

In this production method, first, a structure shown in FIG. 75 is obtained by the method described with reference to FIGS. 43 to 47 in the third embodiment. The insulating resin layer 107, the seed adhesion layer 5, the seed layer 6, the insulating resin layer 61, the first inorganic insulating layer 160, the conductor layer 77, the seed adhesion layer 78 and the seed layer 79 in FIG. 75 correspond to the insulating resin layer 121, the adhesive layer 122*a*, the seed layer 122*b*, the insulating resin layer 124, the inorganic insulating layer 1202, the conductor layer 1203, the first metal-containing layer 1204*a* and the second metal-containing layer 1204*b* in FIG. 47, respectively.

Figure 76:
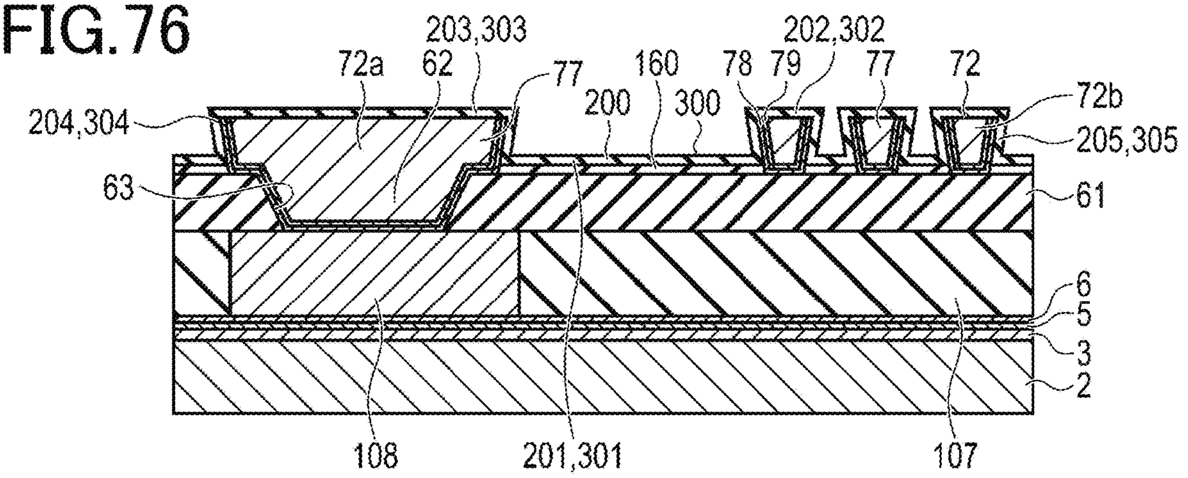
FIG. 76 is a cross-sectional view schematically illustrating another step in the method of producing a multilayer wiring board according to the sixth embodiment of the present invention.

Next, as shown in FIG. 76, a second inorganic insulating layer 200 covering the upper surface of the first inorganic insulating layer 160, the upper surface of the land portion 72*a*, the side surface of the land portion 72*a*, the upper surface of the wiring portion 72*b* and the side surface of the wiring portion 72*b* is formed.

The second inorganic insulating layer 200 can be formed by the same method as that described above for the first inorganic insulating layer 160 in the fourth embodiment. The material of the second inorganic insulating layer 200 may be the same or different from the materials of the first inorganic insulating layer 160, the first inorganic insulating layer 170 and the second inorganic insulating layer 210.

Next, a structure shown in FIGS. 77 to 80 by performing the steps described above with reference to FIGS. 48 to 51 in the third embodiment. The insulating resin layer 71, the first inorganic insulating layer 170 and the resist layer 143 in FIGS. 77 to 80 correspond to the insulating resin layer 1201, the inorganic insulating layer 1202 and the dummy layer 2201 in FIGS. 48 to 51, respectively.

A layer made of a silane coupling agent may be provided between the second inorganic insulating layer 200 and the seed adhesion layer 78 and between the second inorganic insulating layer 200 and the insulating resin layer 71. By providing a layer made of a silane coupling agent, the adhesion between the second inorganic insulating layer 200 and the seed adhesion layer 78 and the adhesion between the second inorganic insulating layer 200 and the insulating resin layer 71 can be improved. When the adhesion between these layers improves, delamination becomes less likely to occur at the interface between the second inorganic insulating layer 200 and the seed adhesion layer 78 and at the interface between the second inorganic insulating layer 200 and the insulating resin layer 71 even when the multilayer wiring board 12 warps due to heat, for example.

Further, the multilayer wiring board 12 of the present embodiment exhibits higher insulation reliability than a configuration obtained by forming an inorganic insulating layer on a wiring portion produced by a conventional semi-additive method. If the semi-additive method is used, the surface of the wiring portion is roughened since the wiring portion is formed by etching.

The roughened surface of the wiring portion causes a decrease in conformability of the inorganic insulating layer, leading to formation of pinholes in the inorganic insulating layer. Since copper diffuses through the pinholes, the insulation reliability is lowered. Further, if the inorganic insulating layer is made thicker in order to eliminate pinholes, the effect of the difference in coefficient of linear thermal expansion between copper and the inorganic insulating layer becomes stronger, leading to occurrence of delamination at the copper/inorganic insulating layer interface.

Figure 81:
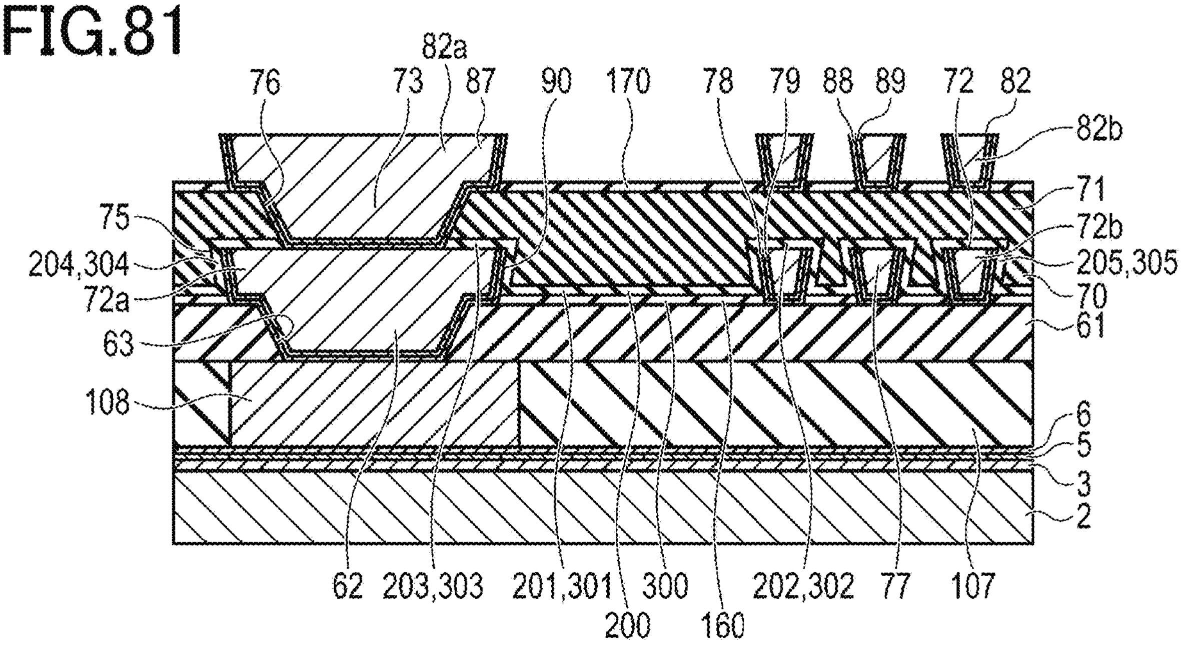
FIG. 81 is a cross-sectional view schematically illustrating still another step in the method of producing a multilayer wiring board according to the sixth embodiment of the present invention.

Next, a structure shown in FIG. 81 is obtained by performing the steps described above with reference to FIG. 52 in the third embodiment. The second wiring layer 82 in FIG. 81 corresponds to the conductor layer 1203 in FIG. 52.

Figure 77:
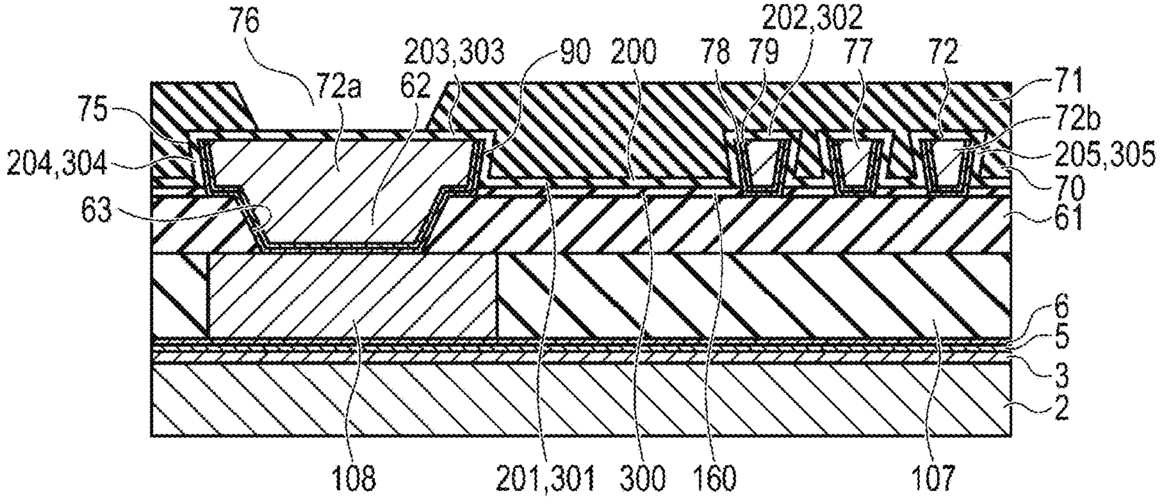
FIG. 77 is a cross-sectional view schematically illustrating still another step in the method of producing a multilayer wiring board according to the sixth embodiment of the present invention.
Figure 78:
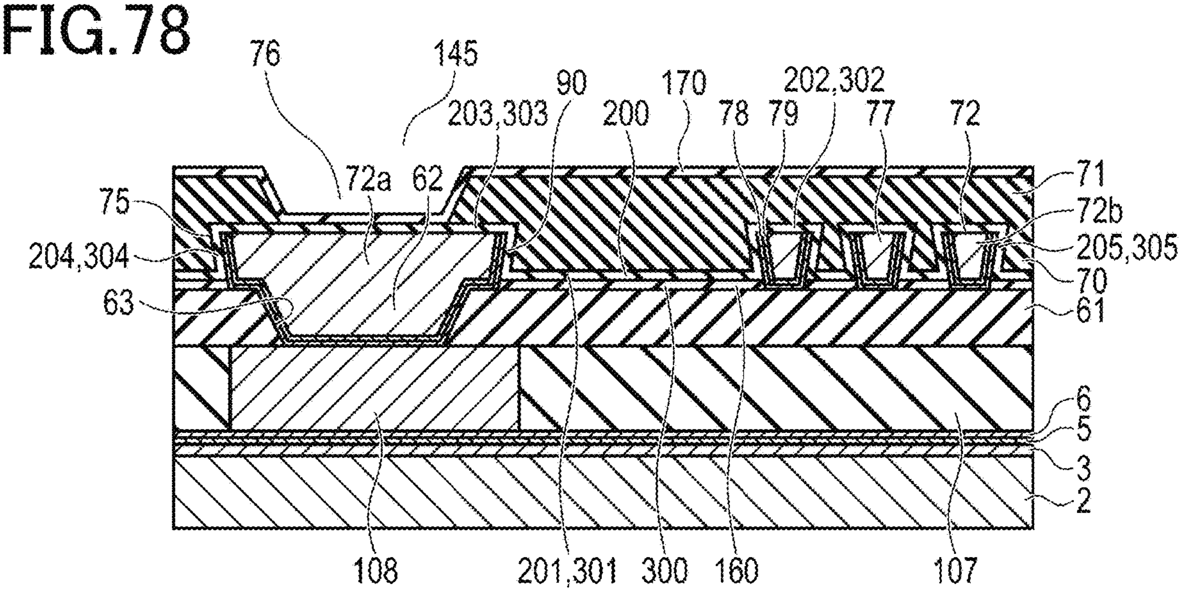
FIG. 78 is a cross-sectional view schematically illustrating still another step in the method of producing a multilayer wiring board according to the sixth embodiment of the present invention.
Figure 79:
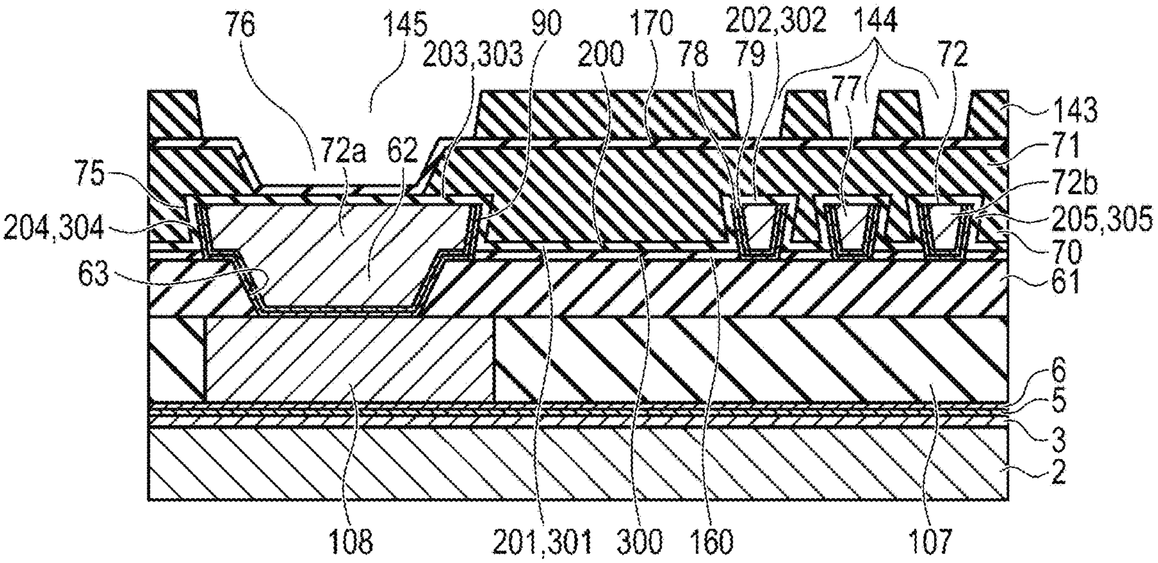
FIG. 79 is a cross-sectional view schematically illustrating still another step in the method of producing a multilayer wiring board according to the sixth embodiment of the present invention.
Figure 80:
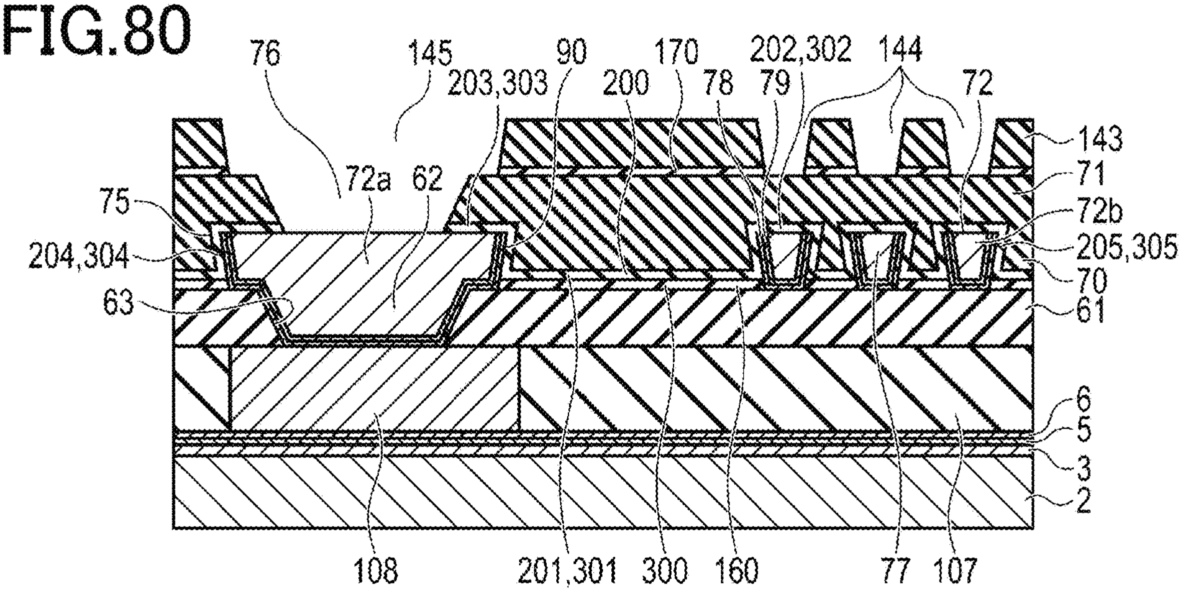
FIG. 80 is a cross-sectional view schematically illustrating still another step in the method of producing a multilayer wiring board according to the sixth embodiment of the present invention.
Figure 82:
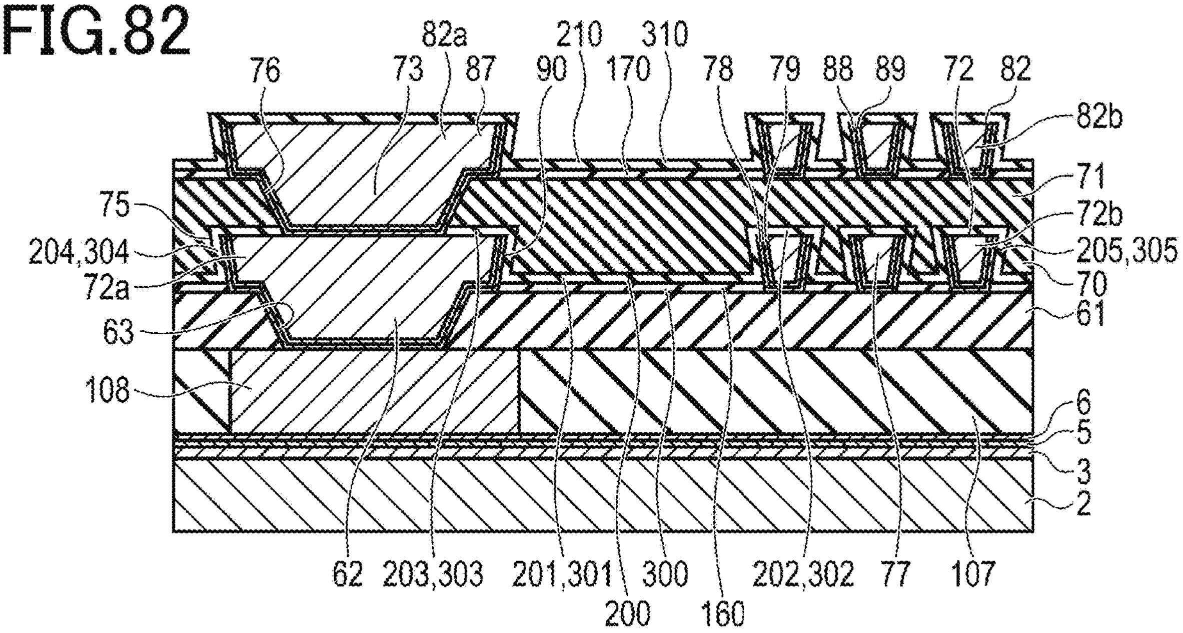
FIG. 82 is a cross-sectional view schematically illustrating still another step in the method of producing a multilayer wiring board according to the sixth embodiment of the present invention.
Figure 83:
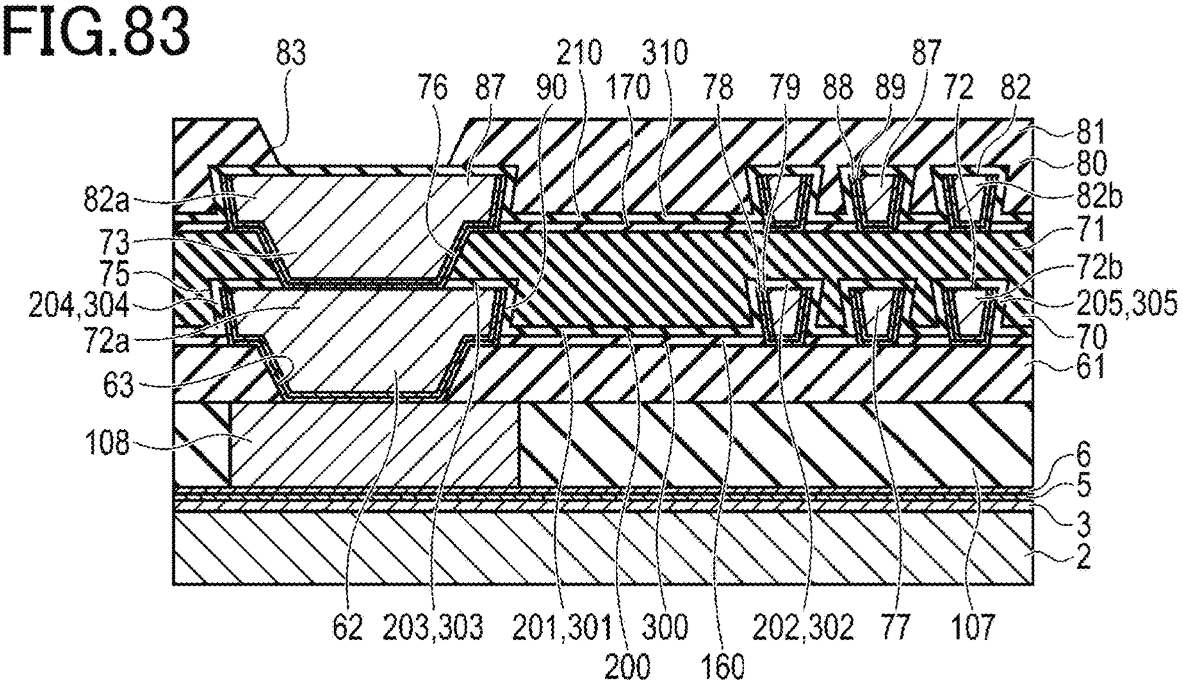
FIG. 83 is a cross-sectional view schematically illustrating still another step in the method of producing a multilayer wiring board according to the sixth embodiment of the present invention.
Figure 84:
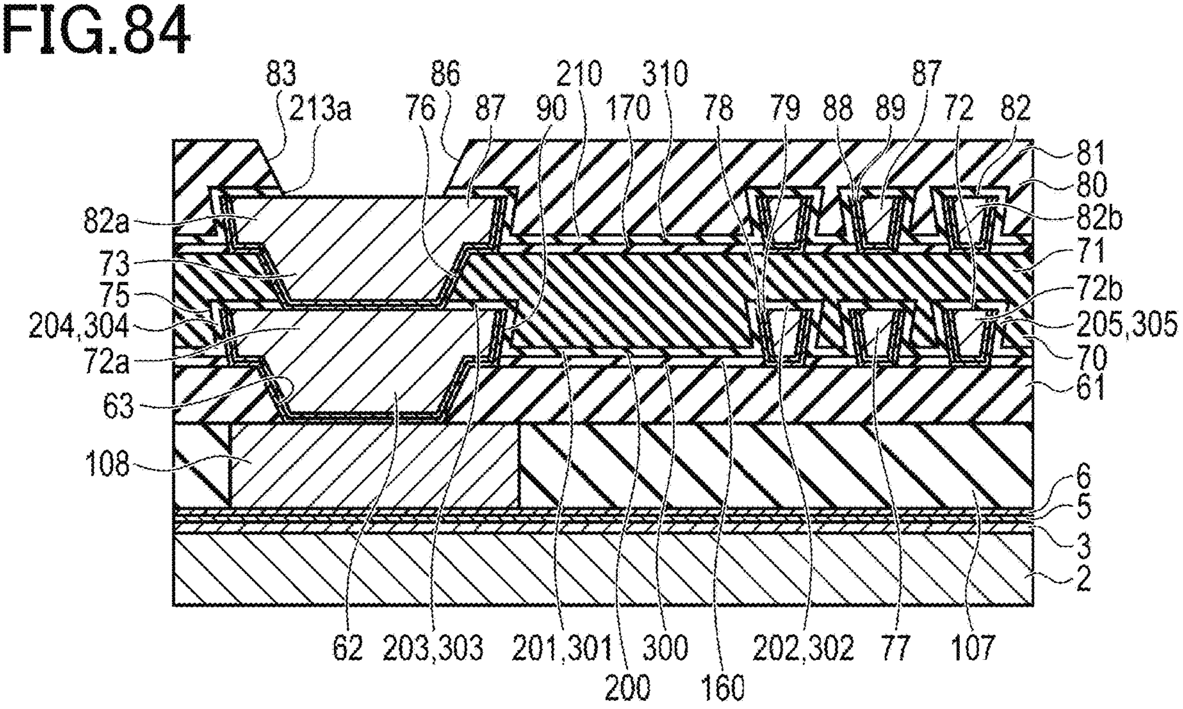
FIG. 84 is a cross-sectional view schematically illustrating still another step in the method of producing a multilayer wiring board according to the sixth embodiment of the present invention.

Next, a structure shown in FIGS. 82 to 84 is obtained by sequentially performing the steps described with reference to FIGS. 76 and 77, and then performing the steps described with reference to FIG. 80.

Figure 85:
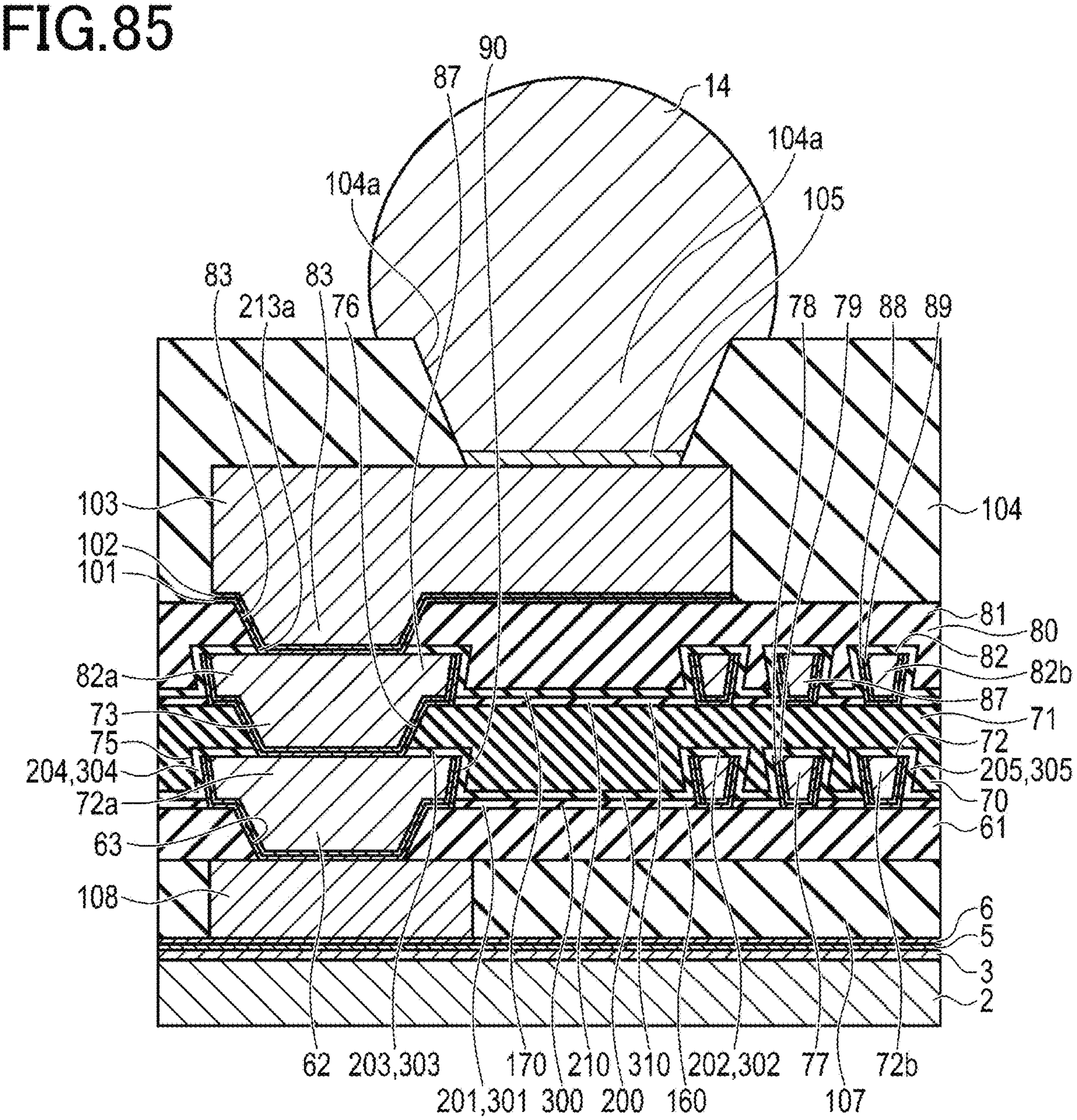
FIG. 85 is a cross-sectional view schematically illustrating one step in the method of producing a packaged device according to the sixth embodiment of the present invention.

Next, the steps described above with reference to FIGS. 19 to 24 in the first embodiment are performed. Thus, as shown in FIG. 85, a multilayer wiring board 12 supported by the support 2, that is, a multilayer wiring board with a support, is completed.

In addition, a composite wiring board and a packaged device according to the sixth embodiment can be produced by the same method as that described above for the first embodiment except that the above multilayer wiring board with a support is used.

In the packaged device configured as described above, the inorganic insulating layer 300 in the first layer 70 includes a first portion 301 covering the first surface 71*a* of the insulating resin layer 71, a second portion 302 covering the bottom 74*b* of the groove section 74, and a third portion 303 covering the bottom 75*b* of the land recess 75.

That is, the inorganic insulating layer 300 is interposed between the upper surface of the land portion 72*a* and the insulating resin layer 71 and between the upper surface of the wiring portion 72*b* and the insulating resin layer 71. The inorganic insulating layer 300 serves as a barrier layer that prevents diffusion of metal from the upper surfaces of the land portion 72*a* and the wiring portion 72*b* into the insulating resin layer 71.

Similarly, the inorganic insulating layer 310 in the second layer 80 includes a first portion 311 covering the first surface 81*a* of the insulating resin layer 81, a second portion 312 covering the bottom 84*b* of the groove section 84, and a third portion 313 covering the bottom 85*b* of the land recess 85. The inorganic insulating layer 310 serves as a barrier layer that prevents diffusion of metal from the upper surfaces of the land portion 82*a* and the wiring portion 82*b* into the insulating resin layer 81.

Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, since the first portion 301 of the inorganic insulating layer 300 covering the first surface 71*a* and the first portion 311 of the inorganic insulating layer 310 covering the first surface 81*a* improve the rigidity of the first layer 70 and the second layer 80, the multilayer wiring board 12 becomes less likely to warp or bend.

In the inorganic insulating layer 300, the first portion 301 is thicker than each of the second portion 302 and the third portion 303. Similarly, in the inorganic insulating layer 310, the first portion 311 is thicker than each of the second portion 312 and the third portion 313. Accordingly, since the rigidity of the first layer 70 and the second layer 80 is further improved, the multilayer wiring board 12 becomes less likely to warp or bend.

Further, the first inorganic insulating layer 160 included in the inorganic insulating layer 300 serves as a protective layer for the insulating resin layer 61 in removal of the resist layer 143. Similarly, the first inorganic insulating layer 170 included in the inorganic insulating layer 310 serves as a protective layer for the insulating resin layer 71 in removal of the resist layer 143.

In the above method, the resist layer 143 is removed after the conductor layer 77 is formed and polished, and the insulating resin layer 71 is provided instead of using the resist layer 143 as a component of the multilayer wiring board 12. Similarly, the resist layer 143 is removed after the conductor layer 87 is formed and polished, and the insulating resin layer 81 is provided instead of using the resist layer 143 as a component of the multilayer wiring board 12.

In the steps of forming and polishing the conductor layers 77, 87, and the like, metal may diffuse into the resist layer 143. Since the above-mentioned multilayer wiring board 12 does not include, as a component, the resist layer 143 into which metal may have diffused, it is advantageous in achieving high insulation reliability.

Further, the inorganic insulating layer 300 of the first layer 70 includes a fourth portion 304 covering the side surface 75*a* which is a side wall of the land recess 75, and a fifth portion 305 covering the side surface 74*a* which is a side wall of the groove section 74.

Therefore, the structure of the present embodiment prevents diffusion of metal from the side surfaces of the land portion 72*a* and the wiring portion 72*b* to the insulating resin layer 81 compared with a structure in which the inorganic insulating layer 300 does not include a portion covering the side walls of the land recess 75 and the groove section 74.

Similarly, the inorganic insulating layer 310 of the second layer 80 includes a fourth portion 314 covering the side surface 85*a* which is a side wall of the land recess 85, and a fifth portion 315 covering the side surface 84*a* which is a side wall of the groove section 84.

Therefore, the structure of the present embodiment prevents diffusion of metal from the side surfaces of the land portion 82*a* and the wiring portion 82*b* to the insulating resin layer 81 compared with a structure in which the inorganic insulating layer 310 does not include a portion covering the side walls of the land recess 85 and the groove section 84.

As a result, the multilayer wiring board 12 described above achieves high insulation reliability. Accordingly, the composite wiring board and the packaged device including the multilayer wiring board 12 also achieve high insulation reliability.

In addition, the inorganic insulating layer 300 can be easily formed by laminating the first inorganic insulating layer 160 and the second inorganic insulating layer 200 which are formed in separate steps. The same applies to the inorganic insulating layer 310.

The seed adhesion layer 78 also serves as a barrier layer that prevents diffusion of metal from the conductor layer 77 to the insulating resin layer 71 and the insulating resin layer 81. Further, when the seed layer 79 is made of a metal material having a lower ionization tendency than the material of the conductor layer 77, the seed layer 79 also serves as a barrier layer that prevents diffusion of metal from the conductor layer 77 to the insulating resin layer 71 and the insulating resin layer 81. The same applies to the seed adhesion layer 88 and the seed layer 89.

Moreover, since the seed adhesion layer 78 covers the lower surfaces in addition to the side surfaces of the land portion 72*a*, the via portion 73 and the groove section 74, in addition to the side surfaces thereof, the seed adhesion layer 78 can further prevent diffusion of metal from the conductor layer 77 to the insulating resin layer 71. The same applies to the seed adhesion layer 88.

Portions of the seed adhesion layer 78 and the seed layer 79 covering the side surfaces of the land portion 72*a* and the wiring portion 72*b* tend to become thinner as the distance from the upper surface of the conductor layer 77 increases. Similarly, portions of the seed adhesion layer 88 and the seed layer 89 covering the side surfaces of the land portion 82*a* and the wiring portion 82*b* also tend to become thinner as the distance from the upper surface of the conductor layer 87 increases. As the thickness of the barrier layer decreases, the ability to prevent diffusion of metal decreases.

On the other hand, in the present embodiment, the second inorganic insulating layer 200 includes, as described above, a portion covering the side surface 75*a* which is a side wall of the land recess 75, and a portion covering the side surface 74*a* which is a side wall of the groove section 74. The second inorganic insulating layer 210 includes a portion covering the surface 75*a* which is a side wall of the land recess 85, and a portion covering the side surface 84*a* which is a side wall of the groove section 84.

Therefore, even when portions of the seed adhesion layer 78 and the seed layer 79 covering the side surfaces of the land portion 72*a* and the wiring portion 72*b* and portions of the seed adhesion layer 88 and the seed layer 89 covering the side surfaces of the land portion 82*a* and the wiring portion 72*b* are thin, the second inorganic insulating layers 200 and 210 prevent diffusion of metal from the side surfaces of the land portion 72*a* and the wiring portion 72*b* to the insulating resin layer 71.

Next, a configuration of the multilayer wiring board 12 of the present embodiment described above and effects of the method of producing the multilayer wiring board 12 will be described.

In the example of the present embodiment, as shown in FIGS. 73 and 74, a gap between the land portion 72*a* and the wiring portion 72*b* is filled with the insulating resin layer 71. The inorganic insulating layer 300 includes the first portion 301 covering the first surface 71*a* of the insulating resin layer 71. Further, a gap between the land portion 82*a* and the wiring portion 82*b* is filled with the insulating resin layer 81. The inorganic insulating layer 310 includes the first portion 311 covering the first surface 81*a* of the insulating resin layer 81.

Therefore, diffusion of metal from one of the adjacent insulating resin layers to the other is less likely to occur. As a result, the multilayer wiring board 12 described above achieves high insulation reliability. Accordingly, the composite wiring board and the packaged device including the multilayer wiring board 12 also achieve high insulation reliability.

Further, the side surfaces of the land portions 72*a* and 82*a* of the interlayer connection conductor layer 90 are in contact with the insulating resin layers 71 and 81 via the seed adhesion layers 78 and 88, respectively. By using titanium, which has good adhesion to the insulating resin layers 71 and 81, for the seed adhesion layers 78 and 88, it is possible to prevent delamination of the interlayer connection conductor layer 90 from the insulating resin layers 71 and 81 due to a difference in coefficient of linear thermal expansion between copper and resin during a temperature cycle test.

<Verification of Effects>

In order to verify the effects of the present embodiment, the following evaluation was performed for the multilayer wiring board 12 of the present embodiment and the multilayer wiring board 150 of the comparative example.

<Evaluation Method> Evaluation of Insulation Reliability

Bias: Evaluation was performed under the environment of 3.3V, 130° C./85% RH. The wiring rule was L/S=2/2 μm. In the evaluation, the thickness of each insulating resin layer was set to 1 μm, 1.5 μm, 2 μm and 2.5 μm in both the multilayer wiring board 12 and the multilayer wiring board 150.

In the multilayer wiring board 12, the thickness of each of the first inorganic insulating layer 160 and the first inorganic insulating layer 170 was set to 50 nm. After 192 hours under the above bias and environment, a resistance value of $10^6\Omega$ or more was judged as a pass. The number of evaluations for each resin thickness was given by N=10.

<Evaluation Results> Evaluation of Insulation Reliability

In the multilayer wiring board 150 of the comparative example, insulation failure was found after 96 hours in all the cases regardless of the thickness of the insulating resin layer. On the other hand, in the multilayer wiring board 12 of the present embodiment, a resistance value was $10^6\Omega$ or more after 192 hours regardless of the thickness of the insulating resin layer, exhibiting good insulation reliability.

The above embodiment is merely an example, and specific details of the structure can be modified as appropriate.

In the above example, the configuration of the first layer 70 has been described as an example in which the first layer 70 includes the seed adhesion layer 78 covering the side surface of the conductor layer 77. The seed adhesion layer 78 constitutes the inorganic insulating layer. In the present embodiment, in which the seed adhesion layer 78 is provided, the inorganic insulating layer 300 may have a configuration that does not include a portion covering the side wall of the groove section 74 and a portion covering the side wall of the land recess 75. Even with this configuration, the seed adhesion layer 78 can prevent diffusion of metal from the conductor layer 77 to the insulating resin layer 71. The same applies to the second layer 80.

In the above example, the multilayer wiring board 12 includes the first layer 70 and the second layer 80, but the multilayer wiring board 12 may further include one or more layers which are similar to the first layer 70 and the second layer 80.

In the above example, the inorganic insulating layer 300 has been described as including the first inorganic insulating layer 160 and the second inorganic insulating layer 200. However, the configuration is merely an example, and is not limited thereto. In another example, the inorganic insulating layer 300 may be configured to have a single-layer structure. That is, the inorganic insulating layer 300 may be integrally formed in the thickness direction. That is, the insulating layer may not have any internal interfaces intersecting the thickness direction. The same applies to the inorganic insulating layer 310.

The present invention can be applied to semiconductor devices having a wiring substrate including an interposer or the like interposed between a main substrate and an IC chip.

REFERENCE SIGNS LIST

1 . . . Packaged device, 2 . . . Support, 3 . . . Release layer, 5 . . . Seed adhesion layer, 6 . . . Seed layer, 10 . . . Composite wiring board, 11 . . . FC-BGA substrate, 12 . . . Multilayer wiring board, 12' . . . Multilayer wiring board, 13 . . . Second underfill layer, 14 . . . Second bonding electrode, 20 . . . Functional device, 23 . . . Laser beam, 30 . . . First underfill layer; 40 . . . First bonding electrode, 50 . . . Layer, 61 . . . Insulating resin layer, 61*a* . . . First surface, 61*b* . . . Second surface, 62 . . . Via portion, 63 . . . Via hole, 64 . . . Side surface, 66 . . . Aperture, 70 . . . First layer, 71 . . . First insulating resin layer, 71*a* . . . First surface, 71*b* . . . Second surface, 72 . . . First wiring layer, 72*a* . . . Land portion, 72*b* . . . Wiring portion, 73 . . . Via portion, 74 . . . Groove section, 74*a* . . . Side surface, 74*b* . . . Bottom, 74*c* . . . Aperture, 75 . . . Land recess, 75*a* . . . Side surface, 75*b* . . . Bottom, 75*c* . . . Aperture, 76 . . . Via recess, 76*a* . . . Side surface, 76*c* . . . Aperture, 77 . . . Conductor layer, 78 . . . Seed adhesion layer, 79 . . . Seed layer, 80 . . . Second layer, 81 . . . Second insulating resin layer, 81*a* . . . First surface, 81*b* . . . Second surface, 82 . . . Second wiring layer, 82*a* . . . Land portion, 82*b* . . . Wiring portion, 83 . . . Via portion, 84 . . . Groove section, 84*a* . . . Side surface, 84*b* . . . Bottom, 84*c* . . . Aperture, 85 . . . Land recess, 85*a* . . . Side surface, 85*b* . . . Bottom, 85*c* . . . Aperture, 86 . . . Via recess, 87 . . . Conductor layer, 88 . . . Seed adhesion layer, 89 . . . Seed layer, 90 . . . Interlayer connection conductor layer, 101 . . . Seed adhesion layer, 102 . . . Seed layer, 103 . . . Conductor layer, 104 . . . Solder resist layer, 104*a* . . . Through hole, 105 . . . Surface treatment layer, 107 . . . Insulating resin layer, 108 . . . Conductor layer, 111 . . . Core layer, 112 . . . Insulating layer, 113 . . . Conductor layer, 114 . . . Insulating layer, 115 . . . Bonding conductor, 120 . . . Layer, 120' . . . Layer, 121 . . . Insulating resin layer, 122*a* . . . Adhesive layer, 122*b* . . . Seed layer, 123 . . . Conductor layer, 124 . . . Insulating resin layer, 125*a* . . . Adhesive layer, 125*b* . . . Seed layer, 126 . . . Conductor layer, 127 . . . Surface treatment layer, 128 . . . Insulating resin layer, 140 . . . Resist layer, 141 . . . Through hole, 143 . . . Resist layer, 144 . . . Groove, 145 . . . Through hole, 146 . . . Resist layer, 147 . . . Through hole, 150 . . . Multilayer wiring board, 160 . . . Inorganic insulating layer, 161 . . . Aperture or through hole, 162 . . . Aperture, through hole or slit, 163 . . . First portion, 164 . . . Second portion, 165 . . . Third portion, 170 . . . Inorganic insulating layer, 171 . . . Aperture or through hole, 172 . . . Aperture, through hole or slit, 173 . . . First portion, 174 . . . Second portion, 175 . . . Third portion, 180 . . . Resist layer, 181 . . . Groove, 182 . . . Through hole, 190 . . . Resist layer, 191 . . . Through hole, 200 . . . Inorganic insulating layer, 201 . . . Interposed portion, 202 . . . First bottom covering portion, 203 . . . Second bottom covering portion, 204 . . . First side wall covering portion, 205 . . . Second side wall covering portion, 210 . . . Inorganic insulating layer, 211 . . . Fourth portion or interposed portion, 212 . . . Fifth portion or first bottom covering portion, 213 . . . Sixth portion or second bottom covering portion, 213*a* . . . Through hole, 214 . . . Seventh portion or first side wall covering portion, 215 . . . Eighth portion or second side wall covering portion, 300 . . . Inorganic insulating layer, 301 . . . First portion, 302 . . . Second portion, 303 . . . Third portion, 304 . . . Fourth portion, 305 . . . Fifth portion, 310 . . . Inorganic insulating layer, 311 . . . First portion, 312 . . . Second portion, 313 . . . Third portion, 314 . . . Fourth portion, 315 . . . Fifth portion, 1201 . . . Insulating resin layer, 1202 . . . Inorganic insulating layer, 1203 . . . Conductor layer, 1203L . . . Land portion, 1203V . . . Via portion, 1203W . . . Wiring portion, 1204*a* . . . First metal-containing layer, 1204*b* . . . Second metal-containing layer, 2201 . . . Dummy layer, G . . . Groove section, G' . . . Groove, R1 . . . First recess, R1' . . . Through hole, R2 . . . Second recess, S1 . . . First surface, S2 . . . Second surface.

What is claimed is:

1. A multilayer wiring board, comprising: a substrate consisting of glass; a release layer comprising an organic resin on a surface of the substrate; a seed adhesion layer on the release layer, a seed layer on the seed adhesion layer, a first laminated layer on the seed layer; and a second laminated layer, wherein each of the first laminated layer and the second laminated layer comprises: an insulating resin layer having a first surface and a second surface which is a rear surface thereof, the insulating resin layer including a first recess that is open to the first surface, a groove section that is open to the first surface, and a second recess that is open to the second surface and communicates with one or more of the first recesses, the insulating resin layer being integrally formed in a thickness direction thereof; and a conductor layer including a land portion and a wiring portion filling the first recess and the groove section of the insulating resin layer, respectively, and a via portion protruding from the first surface at a position of the land portion, the via portion filling a recess of another insulating resin layer adjacent to the first surface, wherein the insulating resin layer of the first laminated layer is in direct contact with the insulating resin layer of the second laminated layer, wherein the insulating resin layer of the first laminated layer and the insulating resin layer of the second laminated layer are each made of a non-photosensitive resin, and wherein each of the seed adhesion layer and the seed layer comprises a material selected from the group consisting of Cu, Ni, Al, Ti, Cr, Mo, W, Ta, Au, Ir, Ru, Pd, Pt, AlSi, AlSiCu, AlCu, NiFe, indium tin oxide, indium zinc oxide, aluminum-doped zinc oxide, ZnO, lead zirconate titanate, TiN, $Cu_3N_4$, Cu alloy, and a combination thereof, and wherein the conductor layer is provided only on a side surface and a bottom surface of each of the groove portion and the first recess without filling a central part of the respective groove portion or the recess and that the only conductor at an interface between the first insulating layer and the second insulating layer is a conductor from a bottom surface of the recess or a side surface of the groove portion.

2. The multilayer wiring board of claim 1, wherein each of the first laminated layer and the second laminated layer further includes an inorganic insulating layer including a portion covering the first surface.

3. The multilayer wiring board of claim 2, wherein the inorganic insulating layer further includes a portion closing an aperture of the groove section, and a portion covering a peripheral portion of a surface on the first surface side of the land portion.

4. The multilayer wiring board of claim 2, wherein the inorganic insulating layer is composed of the portion covering the first surface.

5. The multilayer wiring board of claim 1, wherein each of the first laminated layer and the second laminated layer further includes an inorganic insulating layer including a portion covering a bottom of the groove section and a portion covering a bottom of the first recess.

6. The multilayer wiring board of claim 5, wherein the inorganic insulating layer further includes a portion covering a side wall of the first recess and a portion covering a side wall of the groove section.

7. The multilayer wiring board of claim 6, wherein the inorganic insulating layer further includes a portion covering the first surface.

8. The multilayer wiring board of claim 1, wherein each of the first laminated layer and the second laminated layer includes:

a first inorganic insulating layer including a first portion covering the first surface, a second portion closing an aperture of the groove section, and a third portion covering a peripheral portion of a surface on the first surface side of the land portion; and a second inorganic insulating layer including a portion covering a bottom of the groove section, and a portion covering a bottom of the first recess.

9. The multilayer wiring board of claim 8, wherein the second inorganic insulating layer includes a portion covering a side wall of the first recess, a portion covering a side wall of the groove section, and a portion interposed between the first surface and the first portion covering the first surface.

10. The multilayer wiring board of claim 1, wherein each of the first laminated layer and the second laminated layer further includes an inorganic insulating layer including a first portion covering the first surface, a second portion covering a bottom of the groove section, and a third portion covering a bottom of the first recess.

11. The multilayer wiring board of claim 10, wherein the first portion is thicker than each of the second portion and the third portion.

12. The multilayer wiring board of claim 10, wherein the inorganic insulating layer further includes a fourth portion covering a side wall of the first recess, and a fifth portion covering a side wall of the groove section, and the first portion is thicker than each of the fourth portion and the fifth portion.

13. The multilayer wiring board of claim 10, wherein the first portion has a two-layer structure, and a portion of the inorganic insulating layer other than the first portion has a single-layer structure.

14. The multilayer wiring board of claim 10, wherein the inorganic insulating layer includes a first inorganic insulating layer and a second inorganic insulating layer, the first inorganic insulating layer covering the first surface with the second inorganic insulating layer interposed therebetween, the first inorganic insulating layer having a through hole and a slit at a position of the first recess and a position of the groove section, respectively, and the second inorganic insulating layer extending across the entire inorganic insulating layer.

15. The multilayer wiring board of claim 1, wherein the first recess and the groove section have a cross-section in an inverted tapered shape, and the second recess has a cross-section in a forward tapered shape.

16. The multilayer wiring board of claim 1, wherein each of the first laminated layer and the second laminated layer further includes a first metal-containing layer covering side surfaces of the land portion, the via portion and the wiring portion, a surface on an aperture side of the groove section of the wiring portion, and a peripheral portion of a surface on the first surface side of the land portion.

17. The multilayer wiring board of claim 16, wherein each of the first laminated layer and the second laminated layer further includes a second metal-containing layer interposed between the first metal-containing layer and the conductor layer, the second metal-containing layer being made of the same material as the conductor layer or a metal material having a lower ionization tendency than the material of the conductor layer.

18. A composite wiring board, comprising:

a first wiring board; and a second wiring board bonded to the first wiring board, wherein the first wiring board and the second wiring board are electrically connected to each other via bonding electrodes interposed therebetween, and the second wiring board is the multilayer wiring board of claim 1.

19. A packaged device comprising:

the composite wiring board of claim 18; and a functional device mounted on a surface of the second wiring board opposite to that facing the first wiring board.

20. A method of producing a multilayer wiring board of claim 1, the method comprising the steps of: forming two or more layers laminated together, the step of forming two or more layers including: forming a dummy layer on a foundation layer having a recess, the dummy layer having a groove and a through hole, the recess communicating with one or more of the through holes; forming a conductor layer on the dummy layer, the conductor layer filling the recess, the groove and the through hole; polishing the conductor layer to remove portions of the conductor layer located outside the recess, the groove and the through hole and obtain portions of the conductor layer filling the recess, the through hole and the groove as a via portion, a land portion and a wiring portion, respectively; removing the dummy layer following the step of polishing; and forming an insulating resin layer on the foundation layer and the conductor layer, the insulating resin layer covering the via portion, the land portion and the wiring portion while filling gaps therebetween, and the insulating resin layer having a recess at one or more positions of the land portion.

21. The multilayer wiring board of claim 1, wherein the insulating resin layer of the first laminated layer and the insulating resin layer of the second laminated layer are each made of a non-photosensitive polyimide insulating resin.

* * * * *